US012599018B2

(12) United States Patent
Kuo et al.

(10) Patent No.: US 12,599,018 B2
(45) Date of Patent: Apr. 7, 2026

(54) PACKAGE STRUCTURE WITH ENHANCEMENT STRUCTURE AND MANUFACTURING METHOD THEREOF

(71) Applicant: Taiwan Semiconductor Manufacturing Company, Ltd., Hsinchu (TW)

(72) Inventors: Cheng-Yu Kuo, Kaohsiung City (TW); Yu-Ching Lo, Hsinchu City (TW); Wei-Jie Huang, New Taipei City (TW); Ching-Pin Yuan, Hsinchu City (TW); Yi-Che Chiang, Hsinchu (TW); Kris Lipu Chuang, Hsinchu City (TW); Hsin-Yu Pan, Taipei (TW); Yi-Yang Lei, Taichung City (TW); Ching-Hua Hsieh, Hsinchu (TW); Kuei-Wei Huang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 386 days.

(21) Appl. No.: 17/705,385

(22) Filed: Mar. 28, 2022

(65) Prior Publication Data

US 2023/0307404 A1     Sep. 28, 2023

(51) Int. Cl.
H01L 21/48          (2006.01)
H01L 23/00          (2006.01)
(Continued)

(52) U.S. Cl.
CPC .......... *H01L 24/20* (2013.01); *H01L 21/4857* (2013.01); *H01L 23/49822* (2013.01);
(Continued)

(58) Field of Classification Search
CPC ........... H01L 21/4857; H01L 23/49822; H01L 24/11; H01L 24/13; H01L 24/14;
(Continued)

(56) References Cited

U.S. PATENT DOCUMENTS 8,993,380 B2     3/2015  Hou et al.
9,000,584 B2     4/2015  Lin et al.
(Continued)

*Primary Examiner* — Khiem D Nguyen
(74) *Attorney, Agent, or Firm* — JCIPRNET

(57)          ABSTRACT

A package structure includes a die, a first redistribution circuit structure, a first redistribution circuit structure, a second redistribution circuit structure, an enhancement layer, first conductive terminals, and second conductive terminals. The first redistribution circuit structure is disposed on a rear side of the die and electrically coupled to thereto. The second redistribution circuit structure is disposed on an active side of the die and electrically coupled thereto. The enhancement layer is disposed on the first redistribution circuit structure. The first redistribution circuit structure is disposed between the enhancement layer and the die. The first conductive terminals are connected to the first redistribution circuit structure. The first redistribution circuit structure is between the first conductive terminals and the die. The second conductive terminals are connected to the second redistribution circuit structure. The enhancement layer is between the second conductive terminals and the second redistribution circuit structure.

20 Claims, 33 Drawing Sheets

(51) Int. Cl.
*H01L 23/498* (2006.01)
*H01L 25/065* (2023.01)
*H01L 25/10* (2006.01)

(52) U.S. Cl.
CPC .............. *H01L 24/11* (2013.01); *H01L 24/13* (2013.01); *H01L 24/14* (2013.01); *H01L 24/19* (2013.01); *H01L 24/32* (2013.01); *H01L 24/83* (2013.01); *H01L 24/33* (2013.01); *H01L 24/48* (2013.01); *H01L 25/0657* (2013.01); *H01L 25/105* (2013.01); *H01L 2224/13021* (2013.01); *H01L 2224/14181* (2013.01); *H01L 2224/2101* (2013.01); *H01L 2224/211* (2013.01); *H01L 2224/32225* (2013.01); *H01L 2224/33181* (2013.01); *H01L 2224/48227* (2013.01); *H01L 2924/3511* (2013.01)

(58) Field of Classification Search
CPC ......... H01L 24/19; H01L 24/32; H01L 24/33; H01L 24/48; H01L 24/83; H01L 23/3128; H01L 23/49816; H01L 24/20; H01L 2221/68345; H01L 2221/68359
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2* | 8/2017 | Su | H01L 25/50 |
| 9,768,145 B2* | 9/2017 | Yu | H01L 24/03 |
| 2015/0380332 A1* | 12/2015 | Lin | H01L 24/14 |
| | | | 174/262 |
| 2018/0331041 A1* | 11/2018 | Liao | H01Q 1/2283 |
| 2019/0148262 A1* | 5/2019 | Pei | H01L 25/105 |
| | | | 257/713 |
| 2020/0058626 A1* | 2/2020 | Tai | H01L 21/568 |
| 2020/0203303 A1* | 6/2020 | Lin | H01L 24/13 |
| 2021/0098421 A1* | 4/2021 | Wu | H01L 23/49811 |
| 2021/0233829 A1* | 7/2021 | Pei | H01L 25/065 |
| 2023/0037331 A1* | 2/2023 | Chen | H01L 25/50 |

* cited by examiner

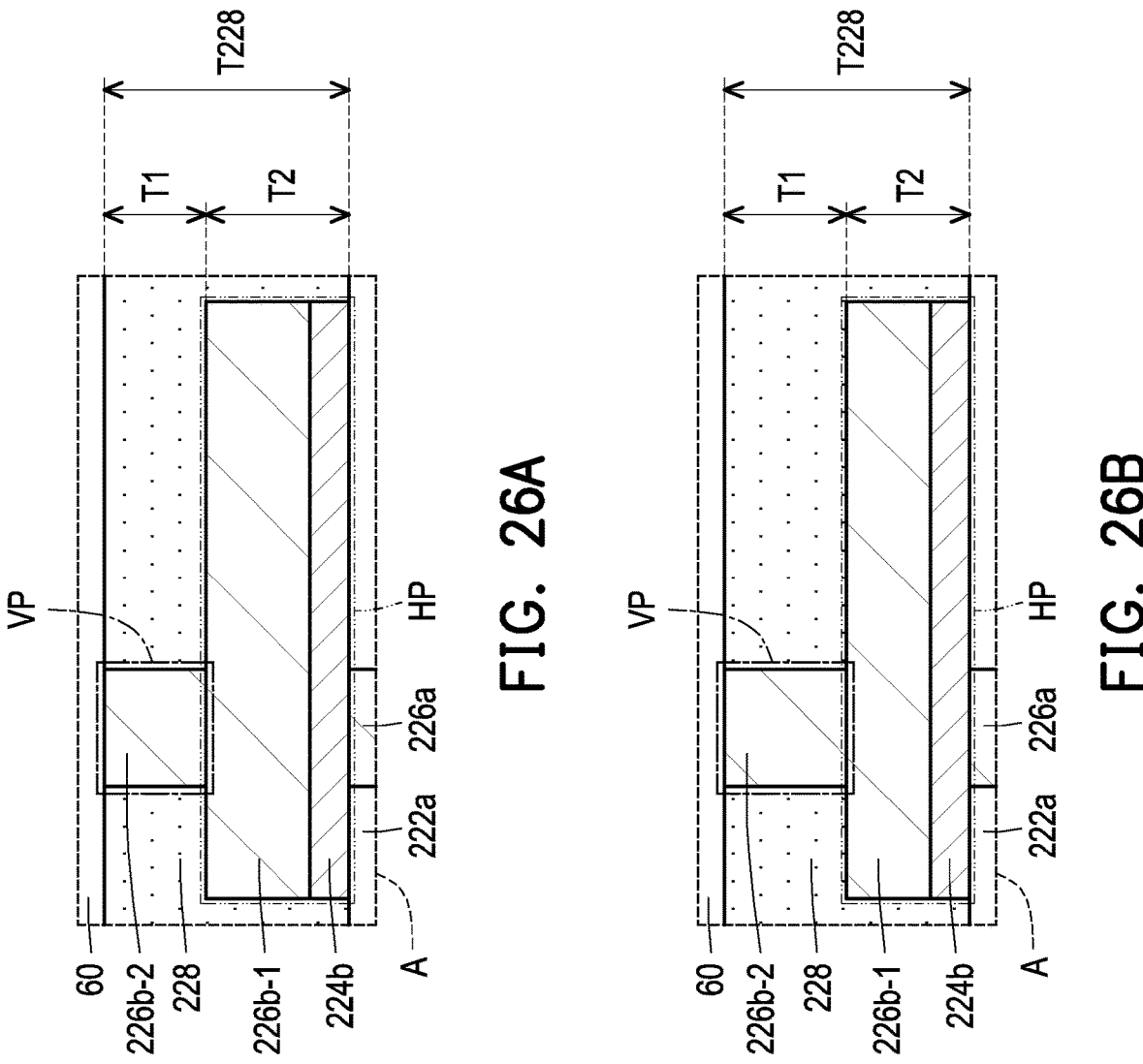

PACKAGE STRUCTURE WITH ENHANCEMENT STRUCTURE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 26A is an enlarged and schematic cross-sectional view showing a portion of the package structure in a dashed area A outlined in FIG. 22 in accordance with some embodiments of the disclosure.

FIG. 26B and FIG. 26C are respectively an enlarged and schematic cross-sectional view showing a portion of the package structure in a dashed area A outlined in FIG. 22 in accordance with some alternative embodiments of the disclosure.

DETAILED DESCRIPTION

Figure 1:
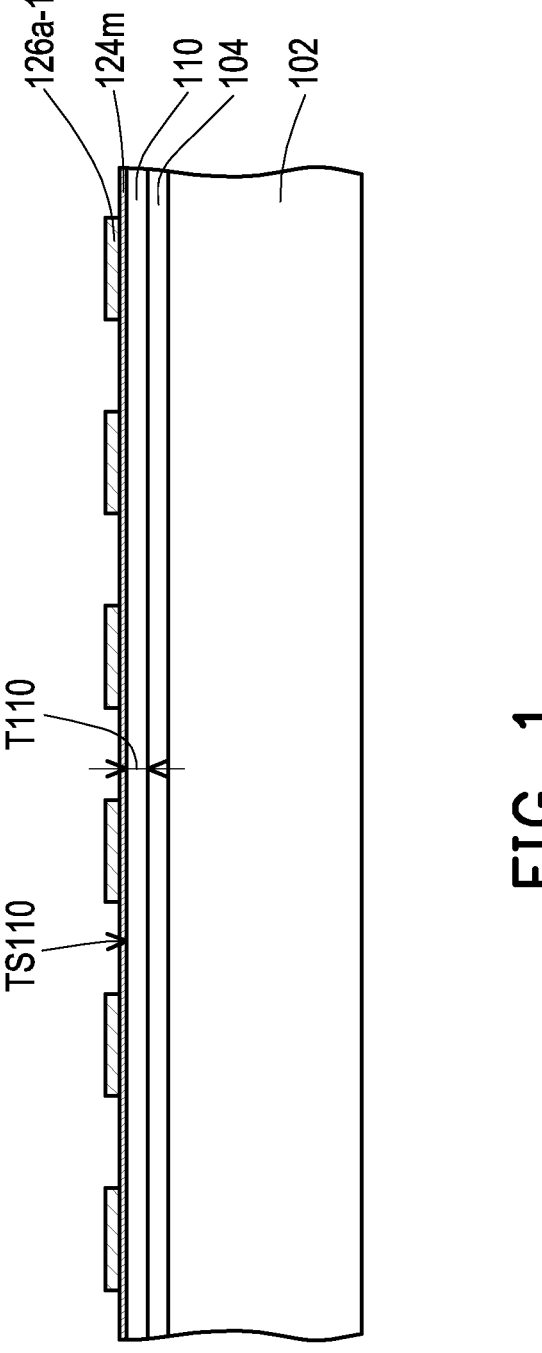
FIG. 1 through FIG. 15 are schematic cross-sectional views of various stages in a manufacturing method of a package structure in accordance with some embodiments of the disclosure.
Figure 1:
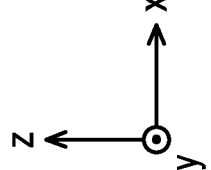

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments include a (semiconductor) package structure including a semiconductor die with a back-side redistribution circuit structure. In one scenario, due to a mismatch in the coefficient of thermal expansion (CTE) of the various materials in the package structure, a warpage can cause bowing in the package structure. Bowing can include both positive biased bowing (a "smile" shape) and negative biased bowing (a "cry" or "frown" shape). Due to the warpage, when the package structure is attached to a device, such as a printed circuit board (PCB) or another package, some areas of the package structure are closer to the device than other areas, such as edges or center thereof. As a result, solder bridging between connectors, which connect the package structure and the another device, could occur where the smaller space between the package structure and the device squeezes the solder too near to an adjacent connector. Embodiments address this issue by utilizing an enhancing element, such as a back-side enhancing layer or film, prior to the formation of the back-side redistribution circuit structure, where the enhancing element is capable of providing sufficient mechanical strength to balance out or suppress the warpage.

In other scenarios, due to the presence of the back-side redistribution circuit structure in the package structure, a thermal dissipating distance for heat generated by the semiconductor die to the external is further increased, which decreases the heat dissipation of the package structure. As a result, reliability and performance of the package structure may be reduced. Embodiments address this issue by utilizing a thermal layer or film with a thermal structure embedded in the back-side redistribution circuit structure which is capable of facilitating the heat dissipation, thereby improving the reliability and performance of the package structure. Besides, an uneven outer surface (e.g. uneven topography) of the back-side redistribution circuit structure would cause air or void being trapped between the semiconductor die and the back-side redistribution circuit structure after the semiconductor die being placing onto the back-side redistribution circuit structure. Due to the air or void trapped between the semiconductor die and the back-side redistribution circuit structure, an undesired movement of the semiconductor die and/or an insulating encapsulation surrounding the semiconductor die may occur during a thermal process, which reduces the reliability and performance of the package structure. Embodiments address this issue by utilizing an addition planarizing process on the back-side redistribution circuit structure prior to the placement of the semiconductor die, which is capable of providing a smooth outer surface of the back-side redistribution circuit structure, thereby facilitating the placement of the semiconductor and enhancing the reliability and performance of the package structure.

FIG. 1 through FIG. 15 are schematic cross-sectional views of various stages in a manufacturing method of a package structure 100 in accordance with some embodiments of the disclosure. In embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the disclosure. The formation of the package structure 100 may be used in any of the embodiments relating to an enhancing element discussed below. FIG. 1 through FIG. 15 illustrate schematic cross-sectional views of intermediate steps of a process for forming the package structure 100 until the package structure 100 is ready to receive an additional device, such as another package (e.g., 800 shown in FIG. 16). In the disclosure, it should be appreciated that the illustration of components throughout all figures is schematic and is not in scale.

Referring to FIG. 1, in some embodiments, a carrier substrate 102 is provided for the package structure 100, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material (such as benzocyclobutene (BCB), polybenzoxazole (PBO)), which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 is an ultra-violet (UV) glue, which loses its adhesive property when exposed to UV lights. The release layer 104 may be dispensed as a liquid and cured, may be a lamination film laminated onto the carrier substrate 102, or may be the like. The top surface of the release layer 104, which is opposite to a bottom surface contacting the carrier substrate 102, may be leveled. For example, the top surface of the release layer 104 has high coplanarity to facilitate forming processes of the overlying structures. For example, the release layer 104 is a LTHC layer with good chemical resistance, and such layer enables room temperature debonding from the carrier substrate 102 by applying laser irradiation, however the disclosure is not limited thereto.

Continued on FIG. 1, in some embodiments, an enhancing layer 110 is formed over the release layer 104. For example, the enhancing layer 110 is disposed on (e.g., in direct contact with) the top surface of the release layer 104, where the release layer 104 is located between the enhancing layer 110 and the carrier substrate 102, as shown in FIG. 1. In some embodiments, along a direction Z (e.g. a stacking direction of the carrier substrate 102, the release layer 104, and the enhancing layer 110), a thickness T110 of the enhancing layer 110 is from about 5 μm to about 60 μm. For example, the thickness T110 of the enhancing layer 110 is substantially constant. In some embodiments, as shown in FIG. 1, a surface TS110 (e.g. a top surface) of the enhancing layer 110 provides a high degree of coplanarity and flatness. Due to the high degree of coplanarity and flatness, the formation of the later-formed layer(s) and/or element(s) is beneficial.

In some embodiments, a material of the enhancing layer 110 is a first dielectric material, where the first dielectric material includes an epoxy-based resin. The first dielectric material may further include a filler. The filler, for example, includes silica ($SiO_2$), aluminum oxide ($Al_2O_3$), aluminum nitride (AlN), diamond, Boron nitride (BN), a suitable inorganic filler, or a combination thereof, where a particle diameter of the filler is from about 100 nm to about 15 μm. In the enhancing layer 110, a weight percentage ratio of the epoxy-based resin to the filler is approximately from 10% to 90%, in some embodiments. The enhancing layer 110, for example, has a coefficient of thermal expansion (CTE) ranging from about 5 ppm/K to about 100 ppm/K, a Young's modulus (E) ranging from about 0.1 MPa to about 25 GPa, and a glass transition temperature (Tg) ranging from about 100 degrees Celsius to about 210 degrees Celsius. Due to the enhancing layer 110 (e.g. its low Young's modulus value and specific thickness range), better warpage control (e.g., warpage being less than or substantially equal to about 100 μm at room temperature and being greater than or substantially equal to about −100 μm) to the package structure 100 in subsequent processes is achieved. The enhancing layer 110 may be referred to as an enhancing element, an enhancement layer or film, or a backside enhancement layer or film.

The formation of the enhancing layer 110 may include, but not limited to, forming a blanket layer of the first dielectric material over the top surface of the release layer 104, and then curing the first dielectric material blanket layer to form the enhancing layer 110. In some embodiments, the first dielectric material blanket layer is formed on the release layer 104 by lamination. In alternative embodiments, the first dielectric material blanket layer is formed on the release layer 104 by coating. In some embodiments, the curing includes a thermal process. The operating temperature and operating time of the thermal process may be controlled depending upon the material of the enhancing layer 110; the disclosure is not limited thereto. In some embodiments, the material of the enhancing layer 110 is different from the material of the release layer 104. For example, the enhancing layer 110 is a lamination tape. The disclosure is not limited thereto; the material of the enhancing layer 110 may be selected and designated based on the demand and the design requirements.

In some embodiments, a redistribution circuit structure 120 is formed on the enhancing layer 110. In some embodiments, as shown in FIG. 1 to FIG. 4, the redistribution circuit structure 120 includes at least one dielectric layer 122 (e.g. 122a and 122b), at least one seed layer 124 (e.g. 124a and 124b), and at least one metallization layer 126 (e.g. 126a (including 126a-1 and 126a-2) and 126b). However, in the disclosure, the numbers of layers of the dielectric layer 122, the seed layer 124, and the metallization layer 126 are not limited to what is depicted in FIG. 1 to FIG. 4, where the numbers of the layers of the dielectric layer 122, the seed layer 124, and the metallization layer 126 may be one or more than one depending upon the demand and design requirements. In some embodiments, one metallization layer 126 includes a line portion extending along a horizontal direction (e.g. a direction X or Y), a via portion extending along a vertical direction (e.g. the direction Z), or a combination thereof. The directions X, Y and Z may be different from each other. For example, as shown in FIG. 1, the directions X, Y and Z are perpendicular to each other.

As illustrated in FIG. 1, in some embodiments, a seed material layer 124m is formed on the enhancing layer 110 and over the carrier 102 and the release layer 104. In some embodiments, the seed material layer 124m is disposed on (e.g., in physical contact with) the enhancing layer 110 and extends over the surface TS110 of the enhancing layer 110. For example, the seed material layer 124m is formed on the enhancing layer 110 in a manner of a blanket layer made of metal or metal alloy materials; the disclosure is not limited thereto. In some embodiments, the seed material layer 124m is referred to as a metal layer, which can be a single layer or a composite layer including a plurality of sub-layers formed of different materials. In some embodiments, the seed material layer 124m includes titanium, copper, molybdenum, tungsten, titanium nitride, titanium tungsten, combinations thereof, or the like. For example, the seed material layer 124m includes a titanium layer and a copper layer over the titanium layer. The seed material layer 124m may be formed through sputtering, physical vapor deposition (PVD), or the like. In some embodiments, the seed material layer 124m is conformally formed on the enhancing layer 110 by sputtering, and is in (physically) contact with the enhancing layer 110 (e.g., the surface TS110). Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After the formation of the seed material layer 124m, a conductive layer 126a-1 may be formed on the seed material layer 124m and over the enhancing layer 110, as shown in FIG. 1. In some embodiments, the conductive layer 126a-1 is disposed on (e.g., in physical contact with) a surface of the seed material layer 124m. For example, the formation of the conductive layer 126a-1 includes, but not limited to, forming a first photo resist (not shown) over the seed material layer 124m; patterning the first photo resist to form a plurality of first openings (not shown) penetrating the first photo resist and exposing portions of the seed material layer 124m underneath thereto; and then forming a first conductive material (not shown) in the first openings to be in (physical) contact with the exposed portions of the seed material layer 124m to form the conductive layer 126a-1. After the formation of the conductive layer 126a-1 in the first openings formed in the first photo resist, the first photo resist is removed. As shown in FIG. 1, the conductive layer 126a-1 may include a plurality of conductive segments (not labeled, which are separated from one another) disposed on the seed material layer 124m, where portions of the seed material layer 124m are not covered by the conductive layer 126a-1.

The first photo resist may be formed by spin coating or the like, and may be exposed to light for patterning. In some embodiments, a material of the first photo resist includes a positive resist material or a negative resist material, that is suitable for a patterning process such as a photolithography process with a mask or a mask-less photolithography process (such as an electron-beam (e-beam) writing or an ion-beam writing). In the disclosure, the first photo resist may be referred to as a photoresist layer or a resist layer. In some embodiments, the pattern of the first photo resist is corresponding to the positioning locations of the conductive segments of the conductive layer 126a-1. In some embodiments, the first photo resist may be removed by acceptable ashing process and/or photoresist stripping process, such as using an oxygen plasma or the like, and the disclosure is not limited thereto.

The first conductive material may be formed in the first openings formed in the first photo resist by plating (such as electroplating or electroless plating) or the like. The first conductive material may comprise a metal, such as copper, aluminum, gold, nickel, silver, palladium, tin, or the like. The conductive layer 126a-1 may be high lead or lead-free. The disclosure is not specifically limited thereto.

In alternative embodiments, the conductive layer 126a-1 may be formed by, but not limited to, forming a blanket layer of the first conductive material over the seed material layer 124m; and patterning the first conductive material blanket layer to form the conductive layer 126a-1 having a plurality of conductive segments separated from one another. The blanket layer of the first conductive material may be formed by electroplating, deposition, or lamination. The conductive segments may be formed by using a photolithography and etching process. The etching process may include a dry etching, a wet etching, or a combination thereof. The disclosure is not limited thereto.

Figure 2:
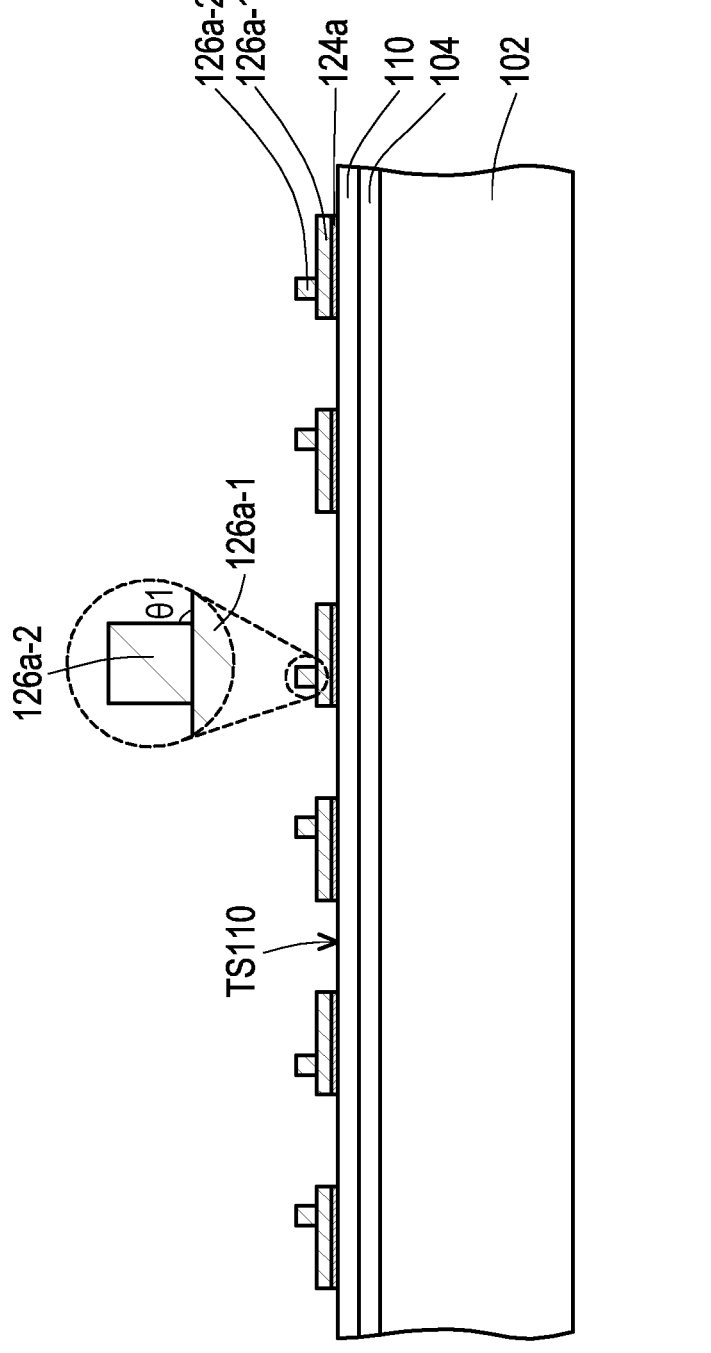

Referring to FIG. 1 and FIG. 2 together, in some embodiments, a plurality of conductive vias 126a-2 are formed on the conductive layer 126a-1 and over the seed material layer 124m. In some embodiments, the conductive vias 126a-2 are disposed on (e.g., in physical contact with) a surface of the conductive layer 126a-1 (e.g., away from the seed material layer 124m). For example, the formation of the conductive vias 126a-2 includes, but not limited to, forming a second photo resist (not shown) over the conductive layer 126a-1 and the exposed portions of the seed material layer 124m; patterning the second photo resist to form a plurality of second openings (not shown) penetrating the second photo resist and exposing the conductive layer 126a-1 underneath thereto, where the exposed portions of the seed material layer 124m are completely covered by the second photo resist; and forming a second conductive material (not shown) in the second openings to be in (physical) contact with the exposed surface of the conductive layer 126a-1 to form the conductive vias 126a-2. After the formation of the conductive vias 126a-2 in the second openings formed in the second photo resist, the second photo resist is removed. In one embodiment, the second photo resist is removed by acceptable ashing process and/or photoresist stripping process, such as using an oxygen plasma or the like, and the disclosure is not limited thereto.

The formations and/or materials of the second photo resist, the second openings, the second conductive material may be similar to or substantially identical to the formations and/or materials of the first photo resist, the first openings, the first conductive material as previously described; thus, are not repeated therein for brevity. In some embodiments, a material of the conductive vias 126a-2 is the same as the material of the conductive layer 126-1. Alternatively, a material of the conductive vias 126a-2 is different from the material of the conductive layer 126-1. As shown in FIG. 2, the conductive vias 126a-2 is physically connected to and electrically connected to the conductive layer 126a-1, for example. The conductive layer 126a-1 and the conductive vias 126a-2 may together be referred to as a metallization layer 126a included in the redistribution circuit structure 120, where each of the conductive segments of the conductive layer 126a-1 may be referred to as a line portion for lateral routing function, and each of the conductive vias 126a-2 may be referred to as a via portion for vertical routing function (e.g., electrical connections between an overlying conductor (e.g., 124b) and an underlying conductor (e.g., 126a-1)). In some embodiments, an angle θ1 between a sidewall (not labeled) of one conductive via 126a-2 and an illustrated top surface (not labeled) of a respective one conductive layer 126a-1 is greater than or substantially equal to about 90 degrees. In the case, the angle θ1 may be greater than or substantially equal to about 90 degrees and less than or substantially equal to 130 degrees. For example, as shown in FIG. 2, the angle θ1 between the sidewall of one conductive via 126a-2 and an illustrated top surface of a respective one conductive layer 126a-1 is substantially equal to about 90 degrees. Alternatively, the angle θ1 may be an obtuse angle.

In alternative embodiments, the conductive vias 126a-2 may be formed by, but not limited to, forming a blanket layer of the second conductive material over the conductive layer 126a-1; and patterning the second conductive material blanket layer to form the conductive vias 126a-2 standing on the conductive layer 126a-1 and separated from one another. The blanket layer of the second conductive material may be formed by electroplating, deposition, or lamination. The patterning may include a photolithography and etching process. The etching process may include a dry etching, a wet etching, or a combination thereof. The disclosure is not limited thereto.

After the formation of the conductive vias 126a-2, the seed material layer 124m is patterned to form a seed layer 124a exposing portions of the surface TS110 of the enhancing layer 110, as shown in FIG. 1 and FIG. 2, in some embodiments. The seed layer 124a is disposed between (e.g., in physical contact with) the enhancing layer 110 and the conductive layer 126a-1, for example. In some embodiments, the seed layer material 124m is patterned by using the conductive layer 126a-1 as an etching mask to form the seed layer 124a. The etching process may be a dry etching process, a wet etching process, or a combination thereof; the disclosure is not limited thereto. In other words, for example, in a vertical projection on the enhancing layer 110 along the direction Z, the conductive layer 126a-1 is completely overlapped with the seed layer 124a. That is to say, a sidewall of the conductive layer 126a-1 may be substantially aligned with a sidewall of the seed layer 124a. For example, the conductive layer 126a-1 and the seed layer 124a share the same geometrical shape on a top view, e.g. on a X-Y plane. In some embodiments, as shown in FIG. 2, the conductive layer 126a-1 is physically connected to and electrically connected to the seed layer 124a respectively underlying thereto, and the conductive vias 126a-2 are electrically coupled to the seed layer 124a through the conductive layer 126a-1, for example. The seed layer 124a may include a plurality of conductive segments separated from one another. In some embodiments, the seed layer 124a and the metallization layer 126a (including the conductive layer 126a-1 and the conductive vias 126a-2) disposed thereon together are referred to as a redistribution layer or a redistribution line.

Figure 3:
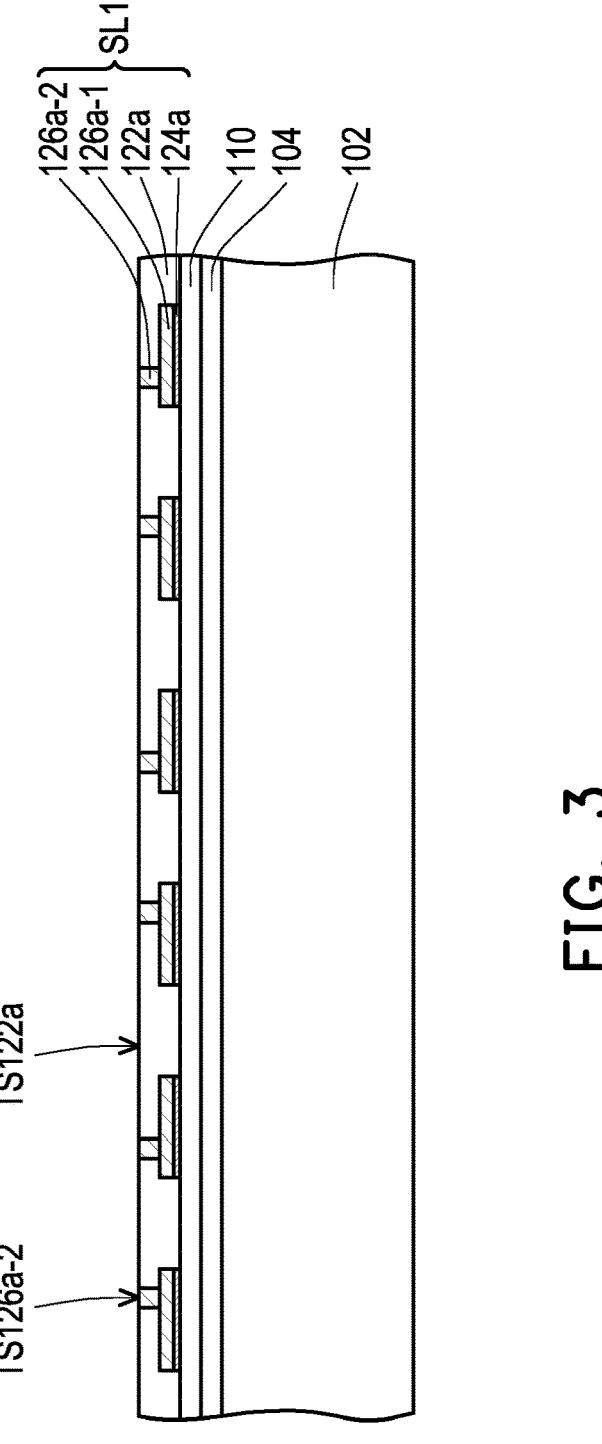
Figure 3:
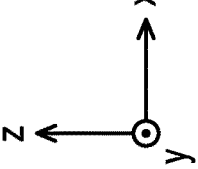

Referring to FIG. 3, in some embodiments, a dielectric layer 122a is formed on the conductive vias 126a-2 to cover the conductive layer 126a-1, the seed layer 124a, and the exposed portions of the enhancing layer 110. The conductive vias 126a-2, the conductive layer 126a-1 and the seed layer 124a may be embedded in the dielectric layer 122a. In some embodiments, as shown in FIG. 3, sidewalls of the conductive vias 126a-2, the conductive layer 126a-1 and the seed layer 124a are covered by the dielectric layer 122a, where surfaces TS126a-2 of the conductive vias 126a-2 are substantially leveled with and accessibly revealed by a surface TS122a of the dielectric layer 122a, and a surface of the seed layer 124a are substantially leveled with and accessibly revealed by a surface of the dielectric layer 122a opposing to the surface T122a. After the formation of the dielectric layer 122a, a build-up layer SL1 of the redistribution circuit structure 120 may be formed. For example, the build-up layer SL1 of the redistribution circuit structure 120 includes the dielectric layer 122a, the seed layer 124a, and the metallization layer 126a (including the conductive layer 126a-1 and the conductive vias 126a-2).

The formation of the dielectric layer 122a may include, but not limited to, forming a second dielectric material over the structure depicted in FIG. 2 to completely cover the conductive vias 126a-2, the conductive layer 126a-1, the seed layer 124a and the exposed portions of the enhancing layer 110; and then patterning the second dielectric material to form the dielectric layer 122a exposing the conductive vias 126a-2. In some embodiments, the second dielectric material may be polyimide (PI), PBO, BCB, a nitride such as silicon nitride, an oxide such as silicon oxide, phosphosilicate glass (PSG), borosilicate glass (BSG), boron-doped phosphosilicate glass (BPSG), a combination thereof or the like. In the disclosure, for example, the second dielectric material is different from the first dielectric material. In other words, the material of the dielectric layer 122a is different from the material of the enhancing layer 110. In some embodiments, the dielectric layer 122a may be formed by suitable fabrication techniques such as spin-on coating, chemical vapor deposition (CVD) (such as Plasma Enhanced Chemical Vapor Deposition (PECVD)), or the like.

The patterning may include a planarizing process. The planarizing process is performed on the second dielectric material to form a dielectric layer 122a, for example. The dielectric layer 122a may be planarized by mechanical grinding, chemical mechanical polishing (CMP), etching, or combinations thereof. The etching may include a dry etching, a wet etching, or a combination thereof. After the planarizing process, the surfaces TS126a-2 of the conductive vias 126a-2 are substantially coplanar to the surface TS122a of the dielectric layer 122a.

During planarizing the dielectric layer 122a, the conductive vias 126a-2 may also be partially planarized. As shown in FIG. 3, for example, the sidewalls of the conductive vias 126a-2 are wrapped around by the dielectric layer 122a while the surface TS126a-2 of the conductive vias 126a-2 are exposed by the dielectric layer 122a. After the planarizing process, a cleaning process may be optionally performed, for example to clean and remove the residue generated from the planarizing process. However, the disclosure is not limited thereto, and the planarizing process may be performed through any other suitable method.

Figure 4:
Figure 4:
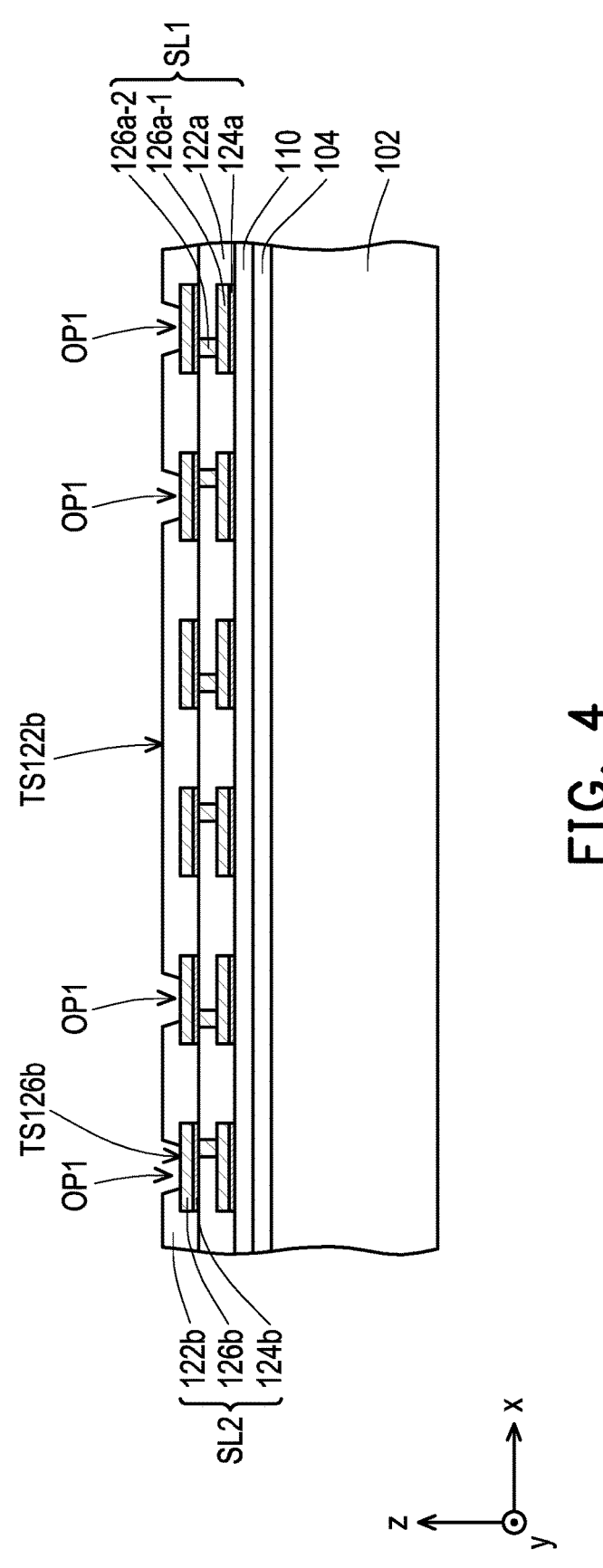

Referring to FIG. 4, in some embodiments, a seed layer 124b, a conductive layer 126b, and a dielectric layer 122b are sequentially formed on the build-up layer SL1 of the redistribution circuit structure 120. In some embodiments, the conductive layer 126b is referred to as a metallization layer 126b included in the redistribution circuit structure 120, where each of conductive segments of the conductive layer 126b may be referred to as a line portion for lateral routing function. The conductive layer 126b may include a plurality of conductive segments separated from one another. The seed layer 124b may include a plurality of conductive segments separated from one another. The seed layer 124b and the metallization layer 126 (including the conductive layer 126b) disposed thereon together may be referred to as a redistribution layer or a redistribution line. As shown in FIG. 4, the dielectric layer 122b includes a plurality of openings OP1 exposing a surface TS126b of the conductive layer 126b for electrical connection to a later-formed component, for example. In some embodiments, the conductive layer 126b is physically connected to and electrically connected to the seed layer 124b, and the conductive layer 126b is electrically coupled to the conductive vias 126a-2 through the seed layer 124b. For example, the conductive layer 126a-1 and the conductive layer 126b are electrically coupled to each other.

The formation and material of the seed layer 124b is similar to or substantially identical to the formation and material of the seed layer 124a, and the formation and material of the conductive layer 126b is similar to or substantially identical to the formation and material of the conductive layer 126a-1, and thus are not repeated herein for brevity. The formation of the dielectric layer 122b may include, but not limited to, forming a third dielectric material over the seed layer 124b and the conductive layer 126b to completely cover the seed layer 124b, the conductive layer 126b and portions of the dielectric layer 122a exposed by the seed layer 124b and the conductive layer 126b; planarizing the third dielectric material; and then etching the planarized third dielectric material to form the dielectric layer 122b with the plurality of openings OP1 exposing the conductive layer 126b. The etching process may include a dry etching, a wet etching, or a combination thereof. The material of the third dielectric material is similar to or substantially identical to the material of the second dielectric material as described in FIG. 3, and thus is not repeated herein for brevity. In one embodiment, the third dielectric material is the same as the second dielectric material. Alternatively, the third dielectric material may be different from the second dielectric material. In the disclosure, for example, the third dielectric material is different from the first dielectric material. In other words, the material of the dielectric layer 122b is different from the material of the enhancing layer 110. In some embodiments, a surface TS122b of the dielectric layer 122b has high coplanarity to facilitate forming processes of the overlying structures.

After the formation of the dielectric layer 122b, a build-up layer SL2 of the redistribution circuit structure 120 may be formed. For example, the build-up layer SL2 of the redistribution circuit structure 120 includes the dielectric layer 122b, the seed layer 124b, and the metallization layer 126b (including the conductive layer 126b). Up to here, the redistribution circuit structure 120 is formed.

For example, the build-up layer SL1 and the build-up layer SL2 are electrically connected to one another. Although only one build-up layer SL1 and one build-up layer SL2 are included in the redistribution circuit structure 120 as shown in FIG. 4 for illustrative purposes, the number of each of the build-up layers SL1, SL2 may not be limited to what is depicted in FIG. 4. For example, the number of the build-up layer SL1 may be zero, one or more than one, and the number of the build-up layer SL2 may be zero or one. The disclosure is not limited thereto.

As illustrated in FIG. 1 through FIG. 4, the redistribution circuit structure 120 (in FIG. 4) is formed over the enhancing layer 110, for example. In other words, in the disclosure, the enhancing layer 110 is formed before the formation of the redistribution circuit structure 120. Owing to such configuration, the enhancing layer 110 not only serves a structure supporter but also serves as a bottommost dielectric layer of the redistribution circuit structure 120, and is capable of providing additional mechanical/supporting strength to a structure of the package structure 100 formed later for suppressing warpage. Besides, with such configuration, there is an omission of one dielectric layer in the redistribution circuit structure 120 as compared to a conventional redistribution circuit structure; as a result, an overall thickness of the redistribution circuit structure 120 of the package structure 100 is less than an overall thickness of the conventional redistribution circuit structure, such that a heat dissipation path of the heat generated from an operation of the package structure 100 is also reduce. Therefore, a thermal dissipation is improved and a manufacturing cost is reduced.

Figure 5:
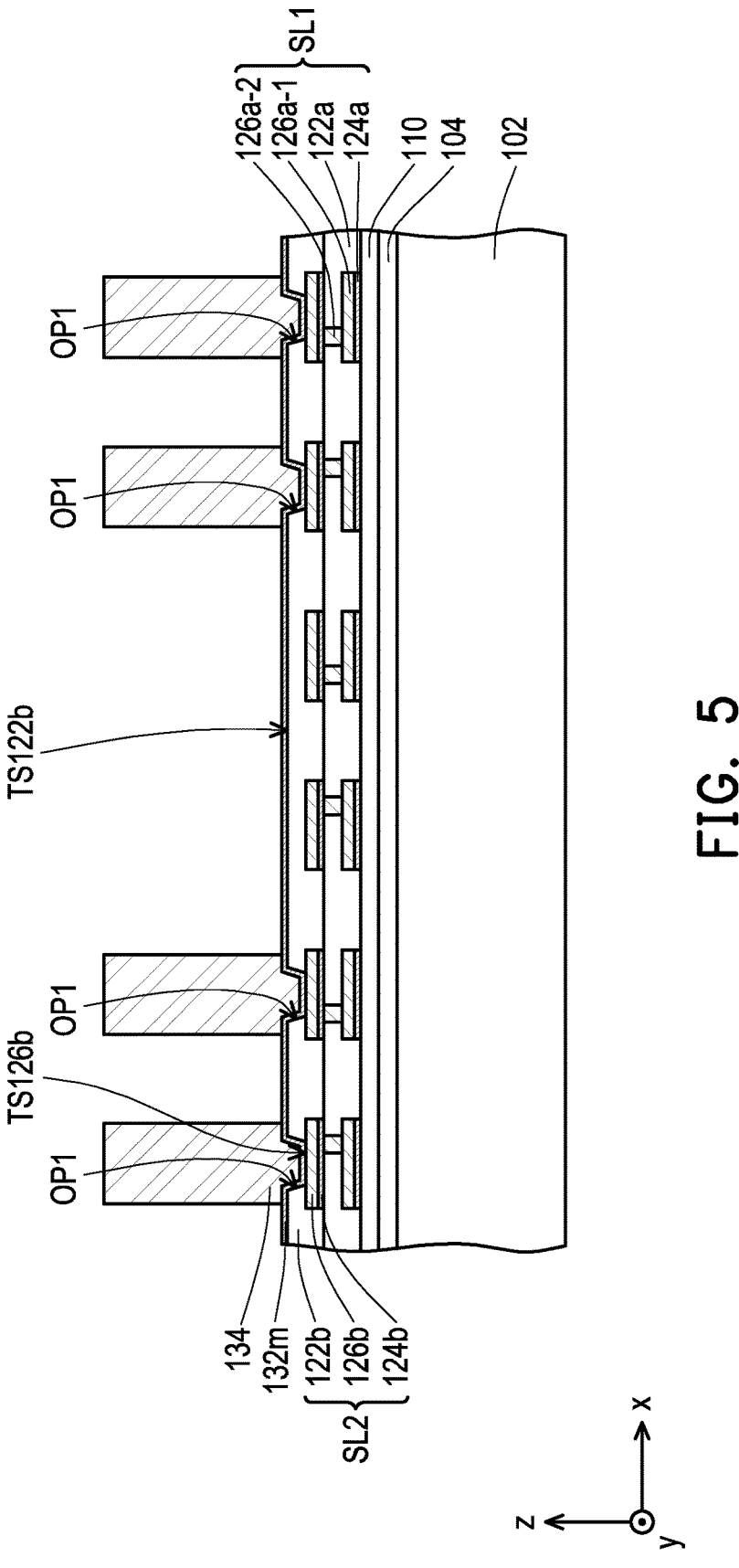

Referring to FIG. 5, in some embodiments, a seed material layer 132m and a plurality of conductive vias 134 are formed on the redistribution circuit structure 120. For example, the seed material layer 132m is disposed on (e.g., in physical contact with) the surface TS122b of the dielectric layer 122b and further extends into the openings OP1 to be in (physically) contact with the conductive layer 126b. The formation and material of the seed material layer 132m are similar to or substantially identical to the formation and material of the seed material layer 124m as described in FIG. 1, and thus are not repeated herein for brevity. As shown in FIG. 5, the seed material layer 132m are physically connected to and electrically connected to the conductive layer 126b of the redistribution circuit structure 120, for example.

The conductive vias 134 are disposed on (e.g., in physical contact with) the seed material layer 132m and are respectively extend into a respective one opening OP1, as shown in FIG. 5, for example. The formation of the conductive vias 134 may include, but not limited to, forming a third photo resist (not shown) over the seed material layer 132m; patterning the third photo resist to form a plurality of third openings (not shown) penetrating the third photo resist and exposing at least portions of the seed material layer 132m corresponding to (e.g., overlapped with) the openings OP1; forming a third conductive material (not shown) in the third openings to be in (physical) contact with the exposed portions of the seed material layer 132m to form the conductive vias 134 (e.g., by plating (such as electroplating or electroless plating) or the like); and removing the patterned photo resist (e.g., by acceptable ashing process and/or photoresist stripping process (such as using an oxygen plasma or the like)). The formation, patterning, and material of the third photo resist is similar to or substantially identical to the formation, patterning, and material of the first photo resist as described in FIG. 1, and thus are not repeated herein for brevity.

In some embodiments, the conductive vias 134 are arranged along but not on a cutting line (not shown) between two package structures 100. A material of the conductive vias 134 may include a metal material such as copper or copper alloys, or the like. For simplification, only four conductive vias 134 are presented in FIG. 5 for illustrative purposes, however, it should be noted that more than four conductive vias 134 may be formed; the disclosure is not limited thereto. The number of the conductive vias 134 can be selected based on the demand and design requirements, and may be adjusted by changing the number of the openings OP1 formed in the dielectric layer 122b of the redistribution circuit structure 120.

Figure 6:
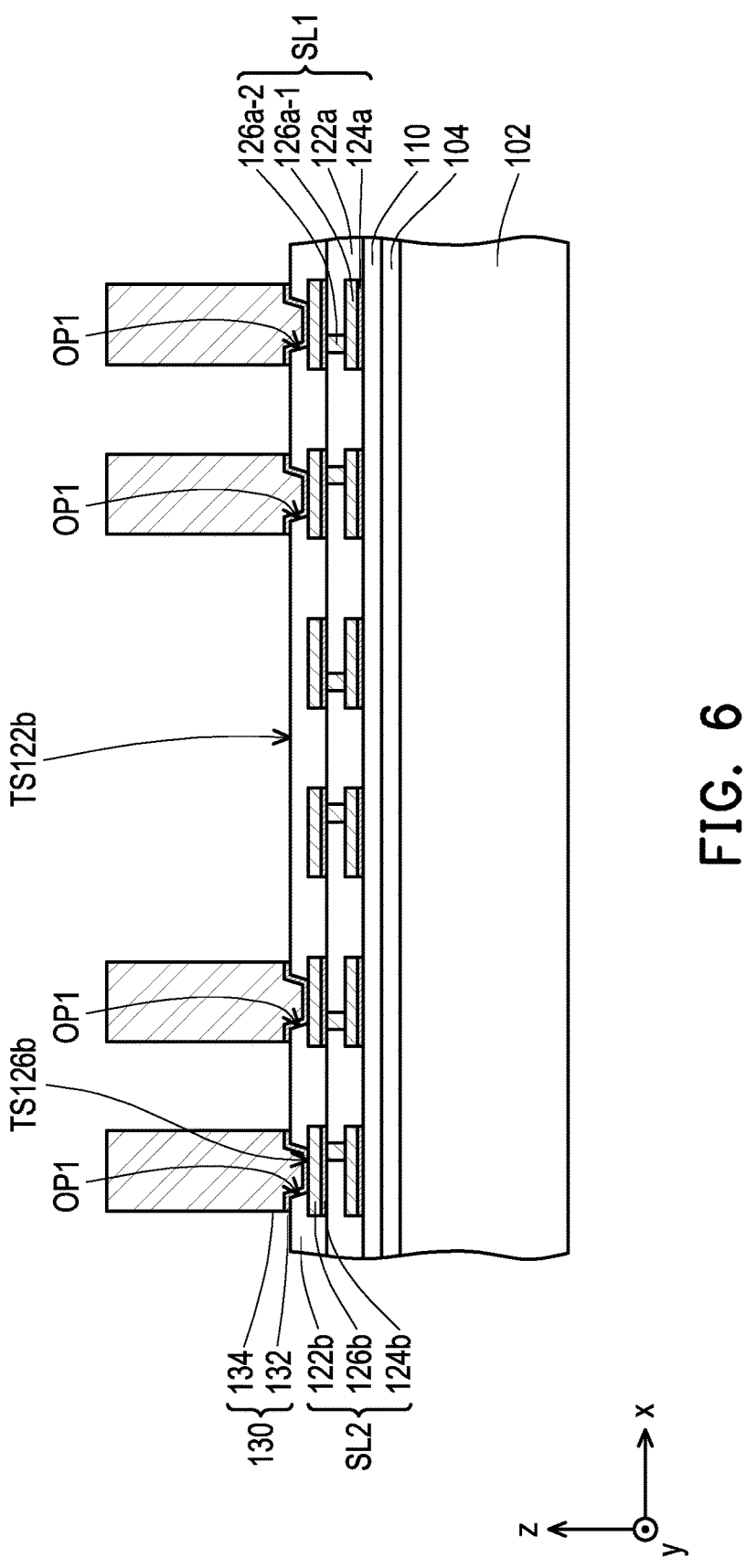

Referring to FIG. 5 and FIG. 6, in some embodiments, the seed material layer 132m is patterned to form a seed layer 132 exposing portions of the surface TS122b of the dielectric layer 122b. The seed layer 132 is disposed between (e.g., in physical contact with) the conductive vias 134 and the conductive layer 126b, for example. In some embodiments, the seed layer material 132m is patterned by using the conductive vias 134 as an etching mask to form the seed layer 132. The etching process may be a dry etching process, a wet etching process, or a combination thereof; the disclosure is not limited thereto. In other words, for example, in a vertical projection on the enhancing layer 110 along the direction Z, the conductive vias 134 is completely overlapped with the seed layer 132. That is to say, a sidewall of the conductive vias 134 may be substantially aligned with a sidewall of the seed layer 132. For example, the conductive vias 134 and the seed layer 132 share the same geometrical shape on the top view, e.g. on the X-Y plane. The seed layer 132 may include a plurality of conductive segments separated from one another. In some embodiments, as shown in FIG. 6, the conductive vias 134 is physically connected to and electrically connected to the seed layer 132 respectively underlying thereto, and the conductive vias 134 are electrically coupled to the conductive layer 126b through the seed layer 132, for example. The seed layer 132 and the conductive vias 134 disposed thereon together may be referred to as conductive pillars 130, as shown in FIG. 6. In some embodiments, the conductive pillars 130 are physically connected to and electrically connected to the redistribution circuit structure 120. The seed layer 132 and the conductive vias 134 disposed thereon together may also be referred to as through integrated fan-out (InFO) vias, vertical connectors, or vertical connections.

Figure 7:
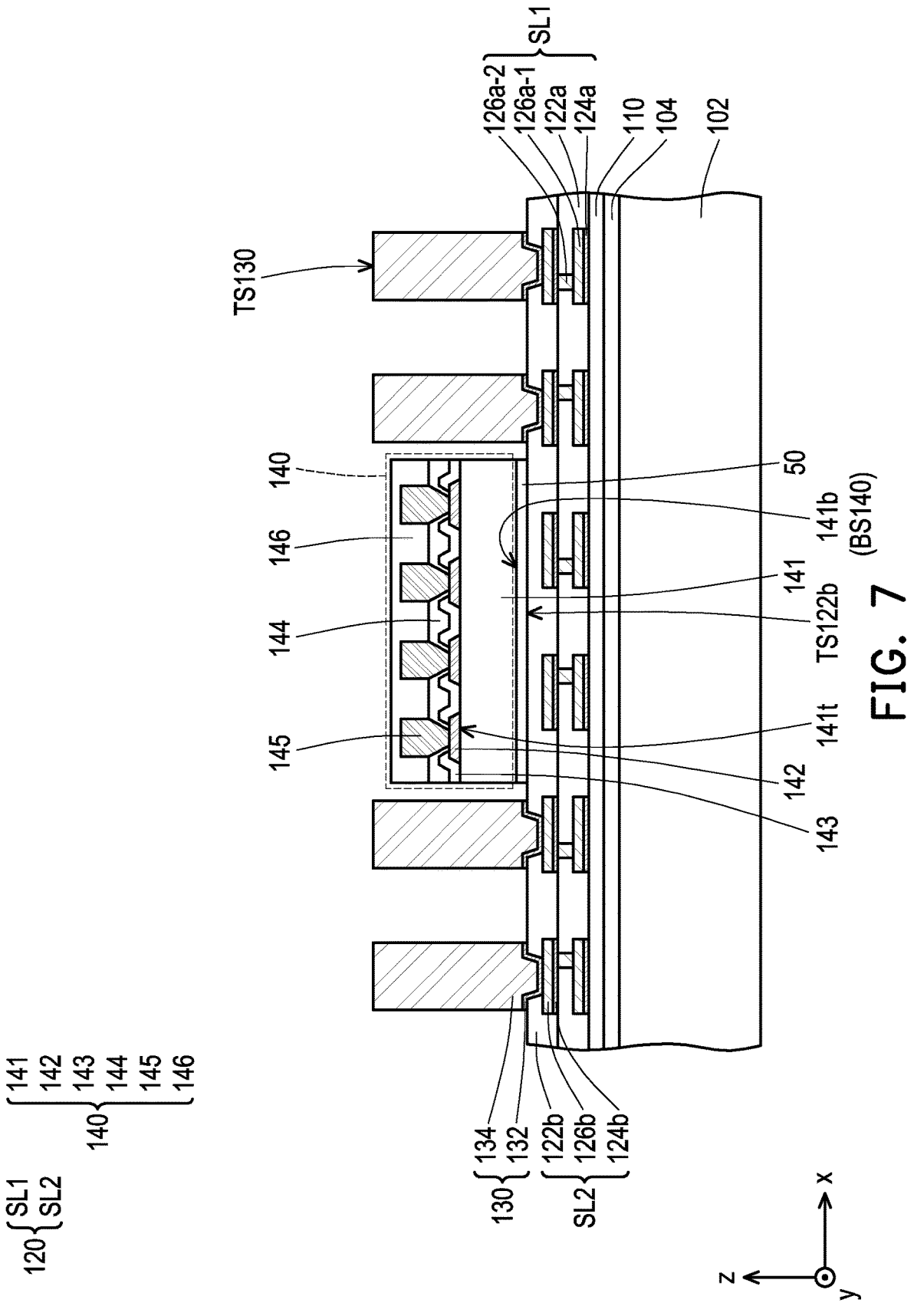

Referring to FIG. 7, in some embodiments, a semiconductor die 140 is disposed on the redistribution circuit structure 120 and next to the conductive pillars 130. In some embodiments, the semiconductor die 140 is picked and placed over the redistribution circuit structure 120 and disposed on the surface TS122b of the dielectric layer 122b, where the semiconductor die 140 is laterally distant from the conductive pillars 130. In some embodiments, the semiconductor die 140 includes a semiconductor substrate 141 having an active surface 141t and a backside surface 141b opposite to the active surface 141t, a plurality of pads 142 distributed on the active surface 141t, a passivation layer 143 covering the active surface 141t and a portion of the pads 142, a post passivation layer 144 covering the passivation layer 143 and a portion of the pads 142, a plurality of conductive vias 145 connecting to the pads 142 exposing by the passivation layer 143 and the post passivation layer 144, and a protection layer 146 disposed on and covering the post passivation layer 144 and the conductive vias 145. The pads 142, the passivation layer 143, the post passivation layer 144, the conductive vias 145, and the protection layer 146 may be formed on the semiconductor substrate 141. In some embodiments, the pads 142 are partially exposed by the passivation layer 143 and the post passivation layer 144, the conductive vias 145 are respectively disposed on and electrically connected to the pads 142, and the protection layer 146 covers the post passivation layer 144 exposed by the conductive vias 145 and illustrated top surfaces (not labeled) of the conductive vias 145 for providing protection, which avoids the conductive vias 145 of the semiconductor die 140 are damaged during the transportation process or the pick-and-place process.

However, the disclosure may not be limited thereto. Alternatively, the illustrated top surfaces of the conductive vias 145 may be accessibly exposed by the protection layer 146. Or alternatively, the post passivation layer 144 and/or the protection layer 146 may be omitted. As shown in FIG. 7, only one semiconductor die 140 is presented for illustrative purposes, however, it should be noted that the number of the semiconductor die 140 may be one or more than one, the disclosure is not limited thereto.

The conductive vias 145 and the protection layer 146 may be omitted. For example, the semiconductor die 140 includes the semiconductor substrate 141 having the active surface 141t and the backside surface 141b opposite to the active surface 141t, the plurality of pads 142 distributed on the active surface 141t, the passivation layer 143 covering the active surface 141t and a portion of the pads 142, and the post passivation layer 144 covering the passivation layer 143 and a portion of the pads 142. Alternatively, the post passivation layer 144 may be omitted.

The material of the semiconductor substrate 141 may include a silicon substrate including active components (e.g., transistors, memories (such as N-type metal-oxide semiconductor (NMOS), P-type metal-oxide semiconductor (PMOS) devices, a combination thereof, or the like), a combination thereof, or the like) and/or passive components (e.g., resistors, capacitors, inductors, combinations thereof, or the like) formed therein or thereon. In some embodiments, such active components and passive components are formed in a front-end-of-line (FEOL) process. The semiconductor substrate 141 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant, or a combination thereof. The disclosure is not limited thereto.

Furthermore, the semiconductor substrate 141 may further include an interconnection structure or interconnect (not shown) disposed on the active surface 141t. The interconnection structure may include one or more inter-dielectric layers and one or more patterned conductive layers stacked alternately for providing routing function to the active components and the passive components embedded in or formed on the semiconductor substrate 141, where the pads 142 may be referred to as an outermost layer of the patterned conductive layers of the interconnection structure. In some embodiment, the interconnection structure is formed in a back-end-of-line (BEOL) process. The inter-dielectric layers may be silicon oxide layers, silicon nitride layers, silicon oxy-nitride layers, or dielectric layers formed by other suitable dielectric materials, and the inter-dielectric layers may be formed by deposition or the like. The patterned conductive layers may be patterned copper layers or other suitable patterned metal layers, and the patterned conductive layers may be formed by electroplating or deposition. However, the disclosure is not limited thereto.

The pads 142 are aluminum pads or other suitable metal pads, for example. The conductive vias 145 are copper pillars, copper alloy pillar or other suitable metal pillars containing copper metal, for example. In some embodiments, the passivation layer 143, the post passivation layer 144, and the protection layer 146 may be a PBO layer, a PI layer or other suitable polymers. In some alternative embodiments, the passivation layer 143, the post passivation layer 144, and the protection layer 146 may be made of inorganic materials, such as silicon oxide, silicon nitride, silicon oxynitride, or any suitable dielectric material. The material of the passivation layer 143, the material of the passivation layer 143, and the material of the protection layer 146 may be the same. Alternatively, the material of the passivation layer 143, the material of the passivation layer 143, and the material of the protection layer 146 may be different, in part or all. For example, the passivation layer 143 and the protection layer 146 independently are a silicon oxide layer, a silicon nitride layer, a silicon oxy-nitride layer, or a dielectric layer formed by other suitable dielectric materials, and the post-passivation layer 144 is a PI layer, a PBO layer, or a dielectric layer formed by other suitable polymers.

It is noted that, the semiconductor die 140 described herein is referred as a semiconductor chip or an integrated circuit (IC), for example. In an alternative embodiment, the semiconductor die 140 described herein may be a semiconductor device. In some embodiments, the semiconductor die 140 includes a digital chip, an analog chip, or a mixed signal chip. In some embodiments, the semiconductor die 140 is a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor die 140 is a memory die with a controller or without a controller, where the memory die includes a single-form die such as a dynamic random access memory (DRAM) die, a static random access memory (SRAM) die, a resistive random-access memory (RRAM) die, a magnetoresistive random-access memory (MRAM) die, a NAND flash memory, a wide I/O memory (WIO); a pre-stacked memory cube such as a hybrid memory cube (HMC) module, a high bandwidth memory (HBM) module; a combination thereof; or the like. In further alternative embodiments, the semiconductor die 140 is an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a system-on-integrated-circuit (SoIC) system, etc.; a combination thereof; or the like. In some other embodiments, the semiconductor die 140 is an electrical and/or optical input/output (I/O) interface die, an integrated passives die (IPD), a voltage regulator (VR) die, a local silicon interconnect (LSI) die with or without deep trench capacitor (DTC) features, a LSI die with multi-tier functions such as electrical and/or optical network circuit interfaces, IPD, VR, DTC, or the like. Alternatively, the semiconductor die 140 may be referred to as a chip or an IC of combination-type, such as a WiFi chip simultaneously including both of a RF chip and a digital chip. The type of the semiconductor die 140 may be selected and designated based on the demand and design requirement, and thus is not specifically limited in the disclosure.

In certain embodiments, additional semiconductor die(s) of the same type or different types may be included. The additional semiconductor die(s) may include digital chips, analog chips or mixed signal chips, such as ASIC chips, sensor chips, wireless and RF chips, memory chips, logic chips, voltage regulator chips, or the like. The disclosure is not limited thereto. It should be appreciated that the illustration of the semiconductor die 140 and other components throughout all figures is schematic and is not in scale.

Continued on FIG. 7, in some embodiments, the semiconductor die 140 is bonded to the redistribution circuit structure 120 by adhering onto the redistribution circuit structure 120 with a connecting film 50. The semiconductor die 140 (e.g., the backside surface 141b thereof) may be adhered to the surface TS122b of the redistribution circuit structure 120 by the connecting film 50. For example, as shown in FIG. 7, the connecting film 50 is sandwiched between the semiconductor die 140 and the redistribution circuit structure 120. Owing to the connecting film 50, the semiconductor die 140 is stably adhered to the redistribution circuit structure 120. In some embodiments, the connecting film 50 may be, but not limited to, a die attach film or a layer made of adhesives, epoxy-based resin, acrylic polymer, other suitable insulating material, or the like, and which may be with or without fillers filled therein (such as silica, alumina, or the like).

In some embodiments, the semiconductor die 140 and the conductive pillars 130 are arranged next to each other along the X-Y plane. In other word, the semiconductor die 140 are not overlapped with the conductive pillars 130 in the direction Z, but are overlapped with each other in the direction X and/or the direction Y. In one embodiment, a height of the conductive pillars 130 is greater than a height of the semiconductor die 140, as shown in FIG. 7. Alternatively, the height of the conductive pillars 130 may be less than or substantially equal to the height of the semiconductor die 140.

Figure 8:
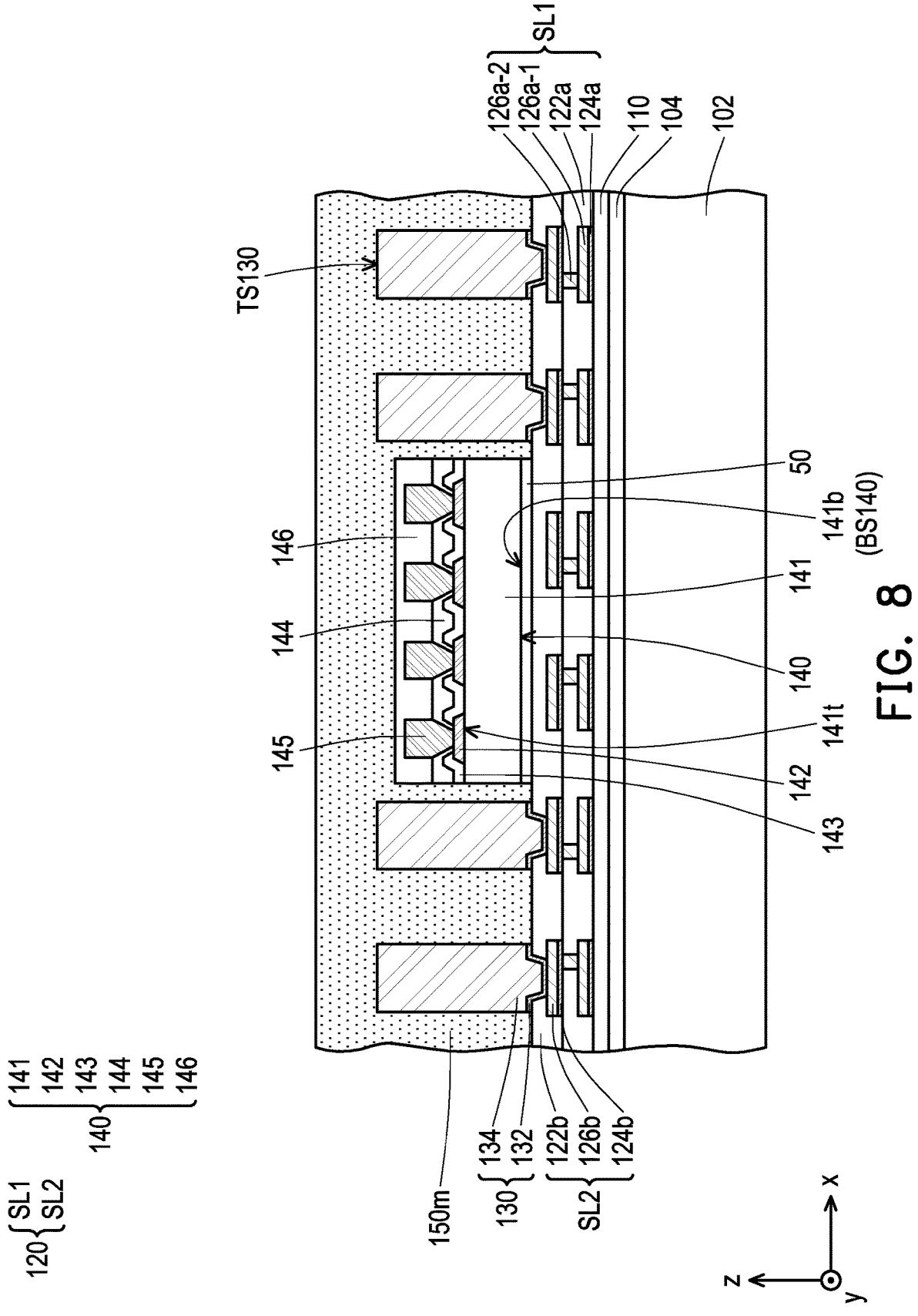

Referring to FIG. 8, in some embodiments, an encapsulation material 150m is formed on the redistribution circuit structure 120 to encapsulate the conductive pillars 130 and the semiconductor die 140. The conductive pillars 130 and the semiconductor die 140 are embedded in the encapsulation material 150m, and the redistribution circuit structure 120 exposed by the conductive pillars 130 and the semiconductor die 140 is covered by the encapsulation material 150m, for example. In other words, the conductive pillars 130 and the protection layer 146 of the semiconductor die 140 may be not accessibly revealed and are well-protected by the encapsulation material 150m. In some embodiments, the encapsulation material 150*m* is a molding compound, a molding underfill, a resin (such as epoxy), or the like. The encapsulation material 150*m* may be formed by a molding process, such as a compression molding process or a transfer molding process. In some embodiments, the encapsulation material 150*m* may further include inorganic filler or inorganic compound (e.g. silica, clay, and so on) which can be added therein to optimize coefficient of thermal expansion (CTE) of the encapsulation material 150*m*. The disclosure is not limited thereto.

Figure 9:
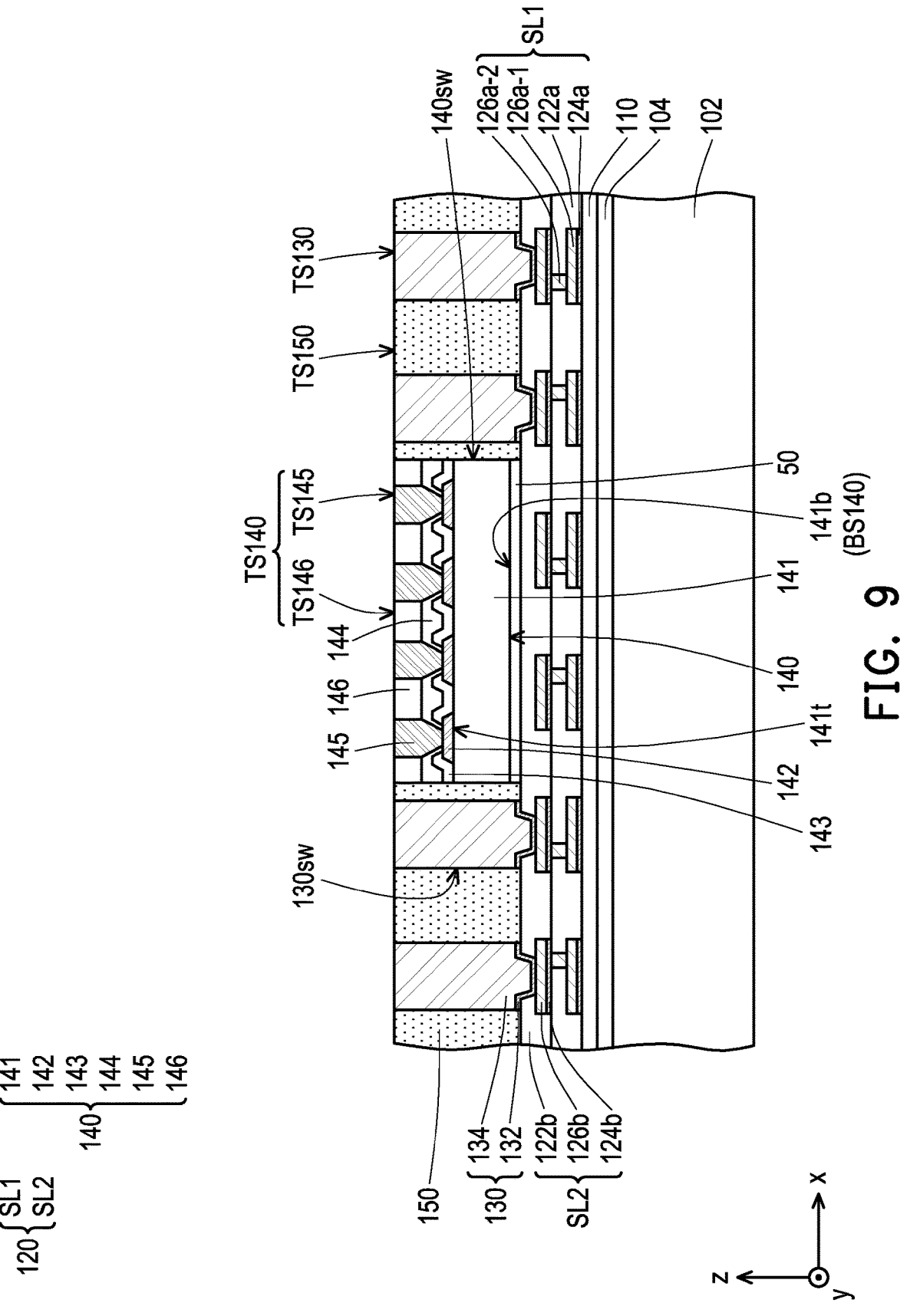

Referring to FIG. 8 and FIG. 9, in some embodiments, the encapsulation material 150*m* are planarized to form an insulating encapsulation 150 exposing the conductive pillars 130 and the semiconductor die 140. The insulating encapsulation 150 is disposed over the redistribution circuit structure 120 to laterally encapsulate the semiconductor die 140 and the conductive pillars 130, for example, as shown in FIG. 9. In some embodiments, the encapsulation material 150*m* is planarized by a mechanical grinding process and/or a chemical mechanical polishing (CMP) process. In some embodiments, during the planarizing process of the encapsulation material 150*m*, the protection layer 146 is planarized to accessibly reveal the conductive vias 145. In some embodiments, portions of the conductive vias 145 and portions of the conductive pillars 130 are slightly planarized as well. As shown in FIG. 9, a surface TS150 of the insulating encapsulation 150 is substantially leveled with surfaces TS145 of the conductive vias 145 and a surface TS146 of the protection layer 146 of the semiconductor die 140 and surfaces TS130 of the conductive pillars 130, for example. In some embodiments, the surface TS150 of the insulating encapsulation 150, the surfaces TS130 of the conductive pillars 130, and the surfaces TS145 of the conductive vias 145 and the surface TS146 of the protection layer 146 of the semiconductor die 140 are substantially coplanar to each other. The surfaces TS145 of the conductive vias 145 and the surface TS146 of the protection layer 146 together may be referred to as a front side (or an active side) TS140 of the semiconductor die 140, and the backside surface 141*b* may be referred to as a rear side (or a non-active side) BS140 of the semiconductor die 140. For example, in direction Z, the front side TS140 of the semiconductor die 140 is opposite to the rear side BS140 of the semiconductor die 140.

In some embodiments, the exposed portion of the conductive vias 145 is located on the front side TS140 of the semiconductor die 140, and the connecting film is located on the rear side BS140 of the semiconductor die 140. The insulating encapsulation 150 encapsulates sidewalls of the semiconductor die 140 and sidewalls of the conductive pillars 130, and the insulating encapsulation 150 is penetrated by the conductive pillars 130. In some embodiments, after the planarizing process, a cleaning step may be optionally performed to clean and remove the residue generated from the planarizing process.

Figure 10:
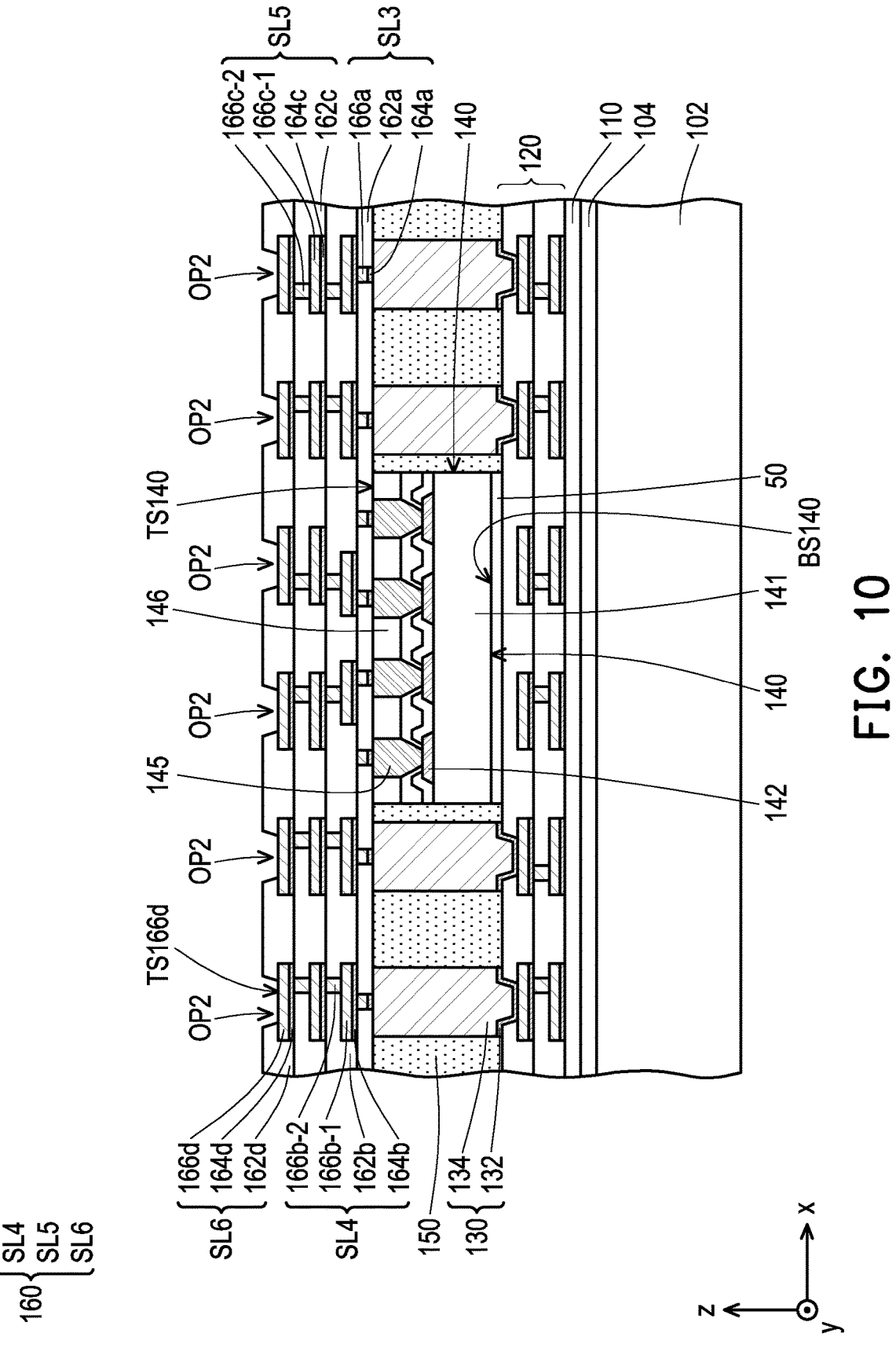

Referring to FIG. 10, in some embodiments, a redistribution circuit structure 160 is formed on the insulating encapsulation 150, the semiconductor die 140, and the conductive pillars 130. In some embodiments, the redistribution circuit structure 160 includes at least one dielectric layer 162 (e.g. 162*a*, 162*b*, 162*c*, and 162*d*), at least one seed layer 164 (e.g. 164*a*, 164*b*, 164*c*, and 164*d*), and at least one metallization layer 166 (e.g. 166*a*, 166*b* (including 166*b*-1 and 166*b*-2), 166*c* (including 166*c*-1 and 166*c*-2), and 166*d*). However, in the disclosure, the numbers of layers of the dielectric layer 162, the seed layer 164, and the metallization layer 166 are not limited to what is depicted in FIG.

10, where the numbers of the layers of the dielectric layer 162, the seed layer 164, and the metallization layer 166 may be one or more than one depending upon the demand and design requirements. In some embodiments, one metallization layer 166 includes a line portion extending along a horizontal direction (e.g. the direction X or the direction Y), a via portion extending along a vertical direction (e.g. the direction Z), or a combination thereof.

In some embodiments, a seed layer 164*a*, a metallization layer 166*a*, and a dielectric layer 162*a* are sequentially formed over the insulating encapsulation 150. For example, the metallization layer 166*a* includes a plurality of conductive vias 166*a* (serving as via portions of the metallization layer 166*a*), where the seed layer 164*a* is physically connected to and electrically connected to the conductive vias 145 of the semiconductor die 140 and the conductive pillars 130, and the conductive vias 166*a* are electrically coupled to the conductive vias 145 of the semiconductor die 140 and the conductive pillars 130 through the seed layer 164*a*. The seed layer 164*a* may include a plurality of conductive segments separated from one another. The seed layer 164*a* and the metallization layer 166*a* (including the conductive vias 166*a*) disposed thereon together may be referred to as a redistribution layer or a redistribution line. The seed layer 164*a*, the metallization layer 166*a* (including the conductive vias 166*a*), and the dielectric layer 162*a* are referred to as a build-up layer SL3 of the redistribution circuit structure 160. The formations and materials of the dielectric layer 162*a*, the seed layer 164*a*, and the conductive vias 166*a* are similar to or substantially identical to the formations and materials of the dielectric layer 122*a*, the seed layer 124*a*, and the conductive vias 126*a*-2 as described in FIG. 1 through FIG. 3, respectively; thus, are not repeated herein for brevity.

In some embodiments, a seed layer 164*b*, a metallization layer 166*b*, and a dielectric layer 162*b* are sequentially formed over the build-up layer SL3. For example, the metallization layer 166*b* includes a conductive layer 166*b*-1 (serving as a line portion of the metallization layer 166*b*) and a plurality of conductive vias 166*b*-2 (serving as via portions of the metallization layer 166*b*), where the seed layer 164*b* is physically connected to and electrically connected to the conductive vias 166*a* of the build-up layer SL3, the conductive layer 166*b*-1 is physically connected to and electrically connected to the seed layer 164*b*, and the conductive vias 166*b*-2 are physically connected to and electrically connected to the conductive layer 166*b*-1. In other words, the conductive layer 166*b*-1 is electrically coupled to the conductive vias 166*a* of the build-up layer SL3 through the seed layer 164*b*, and the conductive vias 166*b*-2 are electrically coupled to the conductive vias 166*a* of the build-up layer SL3 through the conductive layer 166*b*-1 and the seed layer 164*b*. The conductive layer 166*b*-1 may include a plurality of conductive segments separated from one another. The seed layer 164*b* may include a plurality of conductive segments separated from one another. The seed layer 164*b* and the metallization layer 166*b* (including the conductive layer 166*b*-1 and the conductive vias 166*b*-2) disposed thereon together may be referred to as a redistribution layer or a redistribution line. The seed layer 164*b*, the metallization layer 166*b* (including the conductive layer 166*b*-1 and the conductive vias 166*b*-2), and the dielectric layer 162*b* are referred to as a build-up layer SL4 of the redistribution circuit structure 160. The formations and materials of the dielectric layer 162*b*, the seed layer 164*b*, the conductive layer 166*b*-1 and the conductive vias 166*b*-2 are similar to or substantially identical to the formations and materials of the dielectric layer 122*a*, the seed layer 124*a*, the conductive layer 126a-1, and the conductive vias 126a-2 as described in FIG. 1 through FIG. 3, respectively; thus, are not repeated herein for brevity.

In some embodiments, a seed layer 164c, a metallization layer 166c, and a dielectric layer 162c are sequentially formed over the build-up layer SL4. For example, the metallization layer 166c includes a conductive layer 166c-1 (serving as a line portion of the metallization layer 166c) and a plurality of conductive vias 166c-2 (serving as via portions of the metallization layer 166c), where the seed layer 164c is physically connected to and electrically connected to the conductive vias 166b of the build-up layer SL4, the conductive layer 166c-1 is physically connected to and electrically connected to the seed layer 164c, and the conductive vias 166c-2 are physically connected to and electrically connected to the conductive layer 166c-1. In other words, the conductive layer 166c-1 is electrically coupled to the conductive vias 166b of the build-up layer SL4 through the seed layer 164c, and the conductive vias 166c-2 are electrically coupled to the conductive vias 166b of the build-up layer SL4 through the conductive layer 166c-1 and the seed layer 164c. The conductive layer 166c-1 may include a plurality of conductive segments separated from one another. The seed layer 164c may include a plurality of conductive segments separated from one another. The seed layer 164c and the metallization layer 166c (including the conductive layer 166c-1 and the conductive vias 166c-2) disposed thereon together may be referred to as a redistribution layer or a redistribution line. The seed layer 164c, the metallization layer 166c (including the conductive layer 166c-1 and the conductive vias 166c-2), and the dielectric layer 162c are referred to as a build-up layer SL5 of the redistribution circuit structure 160. The formations and materials of the dielectric layer 162c, the seed layer 164c, the conductive layer 166c-1, and the conductive vias 166c-2 are similar to or substantially identical to the formations and materials of the dielectric layer 122a, the seed layer 124a, the conductive layer 126a-1, and the conductive vias 126a-2 as described in FIG. 1 through FIG. 3, respectively; thus, are not repeated herein for brevity.

In some embodiments, a seed layer 164d, a metallization layer 166d, and a dielectric layer 162d are sequentially formed over the build-up layer SL5. For example, the metallization layer 166d includes a conductive layer 166d (serving as a line portion of the metallization layer 166d), where the seed layer 164d is physically connected to and electrically connected to the conductive vias 166c-2 of the build-up layer SL5, and the conductive layer 166d is physically connected to and electrically connected to the seed layer 164d. In other words, the conductive layer 166d is electrically coupled to the conductive vias 166c-2 of the build-up layer SL5 through the seed layer 164d. The conductive layer 166d may include a plurality of conductive segments separated from one another. The seed layer 164d may include a plurality of conductive segments separated from one another. The seed layer 164d and the metallization layer 166d (including the conductive layer 166d) disposed thereon together may be referred to as a redistribution layer or a redistribution line. The seed layer 164d, the metallization layer 166d (including the conductive layer 166d), and the dielectric layer 162d are referred to as a build-up layer SL6 of the redistribution circuit structure 160. The formations and materials of the dielectric layer 162d, the seed layer 164d, and the conductive layer 166d are similar to or substantially identical to the formations and materials of the dielectric layer 122b, the seed layer 124b, and the conductive layer 126b as described in FIG. 4, respectively; thus, are not repeated herein for brevity. In some embodiments, as shown in FIG. 10, the dielectric layer 162d includes a plurality of openings OP2 exposing a surface TS166d of the conductive layer 166d for electrical connection to a later-formed component.

For example, the build-up layers SL3, SL4, SL5 and SL6 are electrically connected to one another. Up to here, the redistribution circuit structure 160 is formed. The redistribution circuit structure 160 may be disposed on and electrically connected to the conductive pillars 130 and the semiconductor die 140, as shown in FIG. 10. Although only one build-up layer SL3, one build-up layer SL4, one build-up layer SL5, and one build-up layer SL6 are included in the redistribution circuit structure 160 as shown in FIG. 10 for illustrative purposes, the number of each of the build-up layers SL3 through SL6 may not be limited to what is depicted in FIG. 10. For example, the number of each of the build-up layers SL3 through SL5 may be zero, one or more than one, and the number of the build-up layer SL6 may be zero or one. The disclosure is not limited thereto. As shown in FIG. 10, the redistribution circuit structure 160 may be referred to as a front-side redistribution circuit structure or layer of the semiconductor die 140, while the redistribution circuit structure 120 may be referred to as a back-side redistribution circuit structure or layer of the semiconductor die 140. In some embodiments, the redistribution circuit structure 120 is electrically coupled to the semiconductor die 140 through the conductive pillars 130 and the redistribution circuit structure 160.

Figure 11:
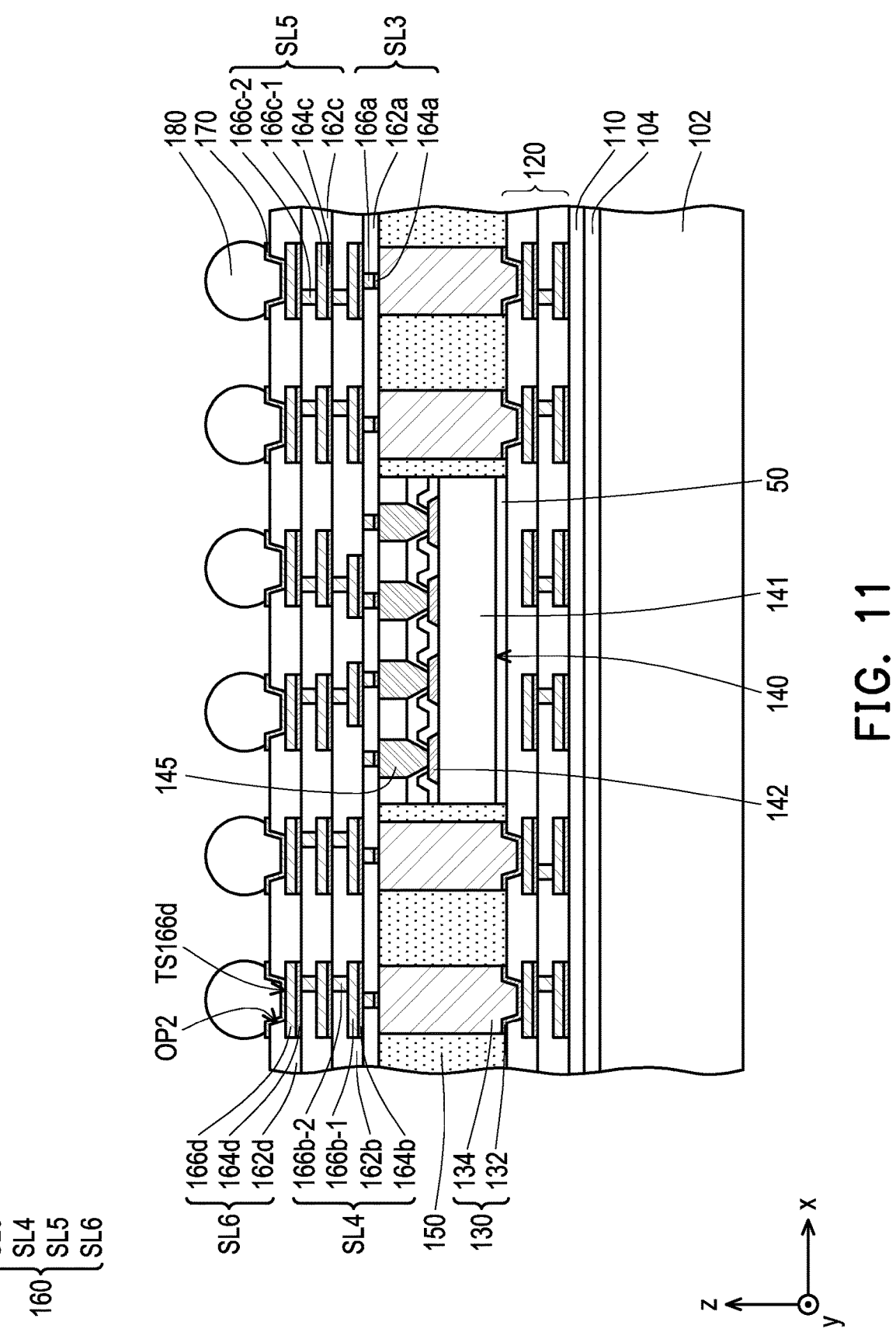

Referring to FIG. 11, in some embodiments, a plurality of under-ball metallurgy (UBM) patterns 170 and a plurality of conductive terminals 180 are sequentially formed over the redistribution circuit structure 160. In some embodiments, the UBM patterns 170 each are located between a respective one of the conductive terminals 180 and the dielectric layer 162d of the redistribution circuit structure 160. Due to the UBM patterns 170, the adhesion strength between the conductive terminals 180 and the dielectric layer 162d of the redistribution circuit structure 160 is enhanced. In some embodiments, the conductive terminals 180 are electrically coupled to the redistribution circuit structure 160 through the UBM patterns 170. In some embodiments, some of the conductive terminals 180 are electrically coupled to the semiconductor die 140 through some of the UBM patterns 170 and the redistribution circuit structure 160. In some embodiments, some of the conductive terminals 180 are electrically coupled to the conductive pillars 130 through some of the UBM patterns 170 and the redistribution circuit structure 160. In some embodiments, some of the conductive terminals 180 are electrically coupled to the redistribution circuit structure 120 through some of the UBM patterns 170, the redistribution circuit structure 160, and the conductive pillars 130.

In some embodiments, the UBM patterns 170 are disposed on (e.g., in physical contact with) the conductive layer 166d exposed by the openings OP2 formed in the dielectric layer 162d. As shown in FIG. 11, in some embodiments, the UBM patterns 170 are physically connected to and electrically connected to the redistribution circuit structure 160. In some embodiments, the UBM patterns 170 are made of a metal layer including a single layer or a metallization layer including a composite layer with a plurality of sub-layers formed of different materials. In some embodiments, the UBM patterns 170 include copper, nickel, molybdenum, titanium, tungsten, titanium nitride, titanium tungsten, combinations thereof, or the like. The UBM patterns 170 may include a titanium layer and a copper layer over the titanium layer. The UBM patterns 170 may be formed using, for example, electroplating, sputtering, PVD, or the like. For example, the UBM patterns 170 are conformally formed on the dielectric layer 162d by sputtering to extend on an outermost surface of the dielectric layer 162d and further extend into the openings OP2 formed in the dielectric layer 162d, and thus are in physical contact with the surface TS166d of the conductive layer 166d exposed by the openings OP2 formed in the dielectric layer 162d. The UBM patterns 170 are electrically isolated from one another. The number of the UBM patterns 170 may not be limited in this disclosure, and may correspond to the number of the portions of the conductive layer 166d exposed by the openings OP2 formed in the dielectric layers 162d.

As shown in FIG. 11, in some embodiments, the conductive terminals 180 are physically connected to and electrically connected to the UBM patterns 170, and are electrically coupled to the redistribution circuit structure 160 through the UBM patterns 170. In some embodiments, the conductive terminals 180 are disposed on the UBM patterns 170 by ball placement process or reflow process. The conductive terminals 180 are, for example, solder balls or ball grid array (BGA) balls or bumps. Alternatively, the conductive terminals 180 may include micro-bumps, metal pillars, electroless nickel-electroless palladium-immersion gold (ENEPIG) formed bumps, controlled collapse chip connection (C4) bumps, or the like; and may be formed by plating. The conductive terminals 180 may be solder free. The number of the conductive terminals 180 may not be limited to the disclosure, and may be designated and selected based on the number of the UBM patterns 170.

However, the disclosure is not limited thereto. In some alternative embodiments, the UBM patterns 170 may be omitted. In such alternative embodiments, the conductive terminals 180 may be directly connected to (e.g., in physical contact with) the redistribution circuit structure 160 (e.g. the portions of the conductive layer 166d exposed by the openings OP2). The conductive terminals 180 may be referred to as conductors or conductive connectors, in the disclosure.

Figure 12:
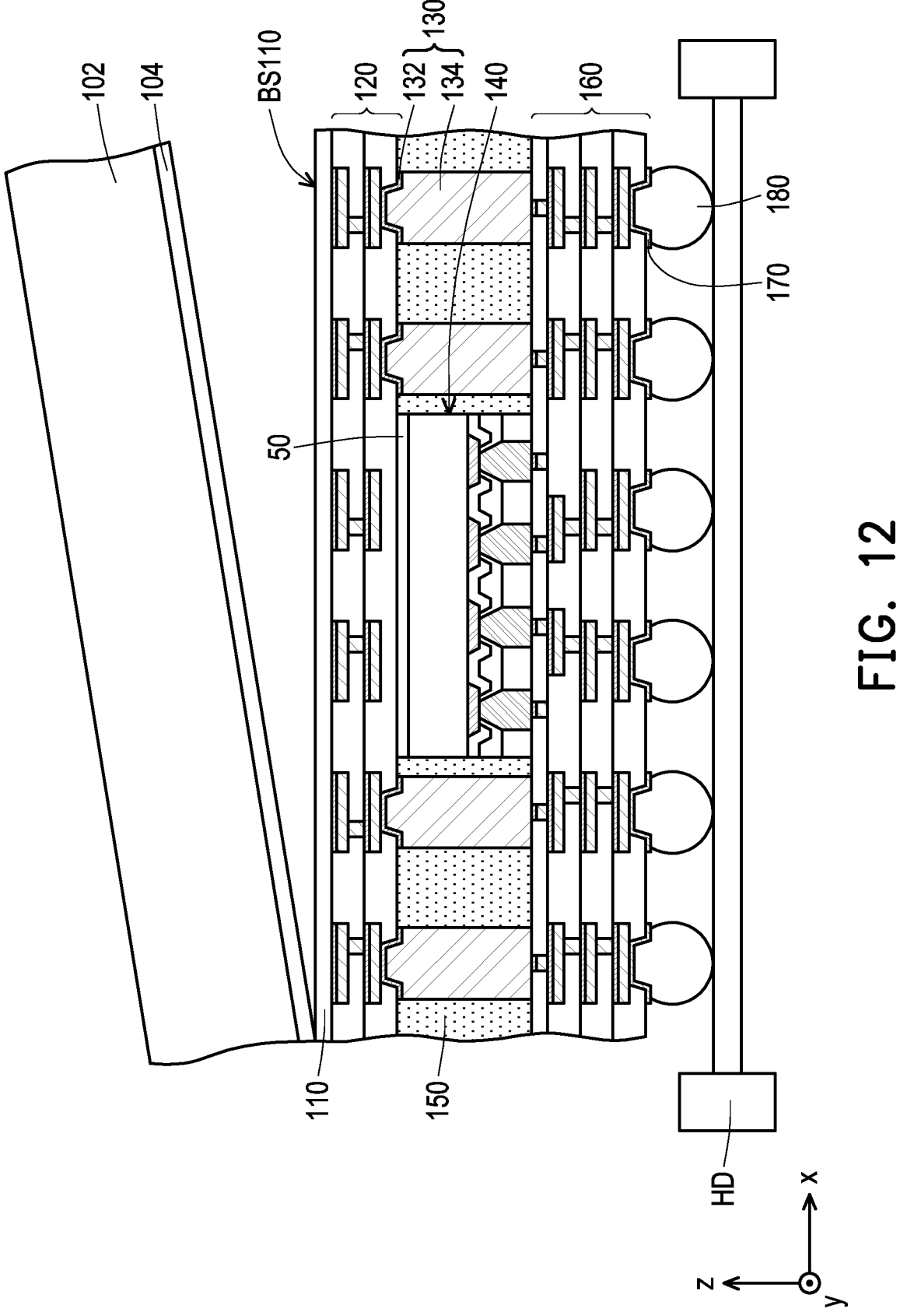

Referring to FIG. 12, in some embodiments, the whole structure depicted in FIG. 11 along with the carrier substrate 102 is flipped (turned upside down), where the conductive terminals 180 are placed to a holding device HD, and the carrier substrate 102 is then debonded from the enhancing layer 110. In some embodiments, the holding device HD may be an adhesive tape, a carrier film or a suction pad being supported by a frame. The disclosure is not limited thereto. In some embodiments, the enhancing layer 110 is easily separated from the carrier substrate 102 due to the release layer 104. In some embodiments, the carrier substrate 102 is detached from the enhancing layer 110 through a debonding process, where the carrier substrate 102 and the release layer 104 are debonded and then removed. In some embodiments, a surface BS110 of the enhancing layer 110 is exposed, as show in FIG. 12. In one embodiment, the debonding process is a laser debonding process. During the debonding step, the holding device HD is used to secure the structure depicted in FIG. 11 before debonding the carrier substrate 102 and the release layer 104.

Figure 13:
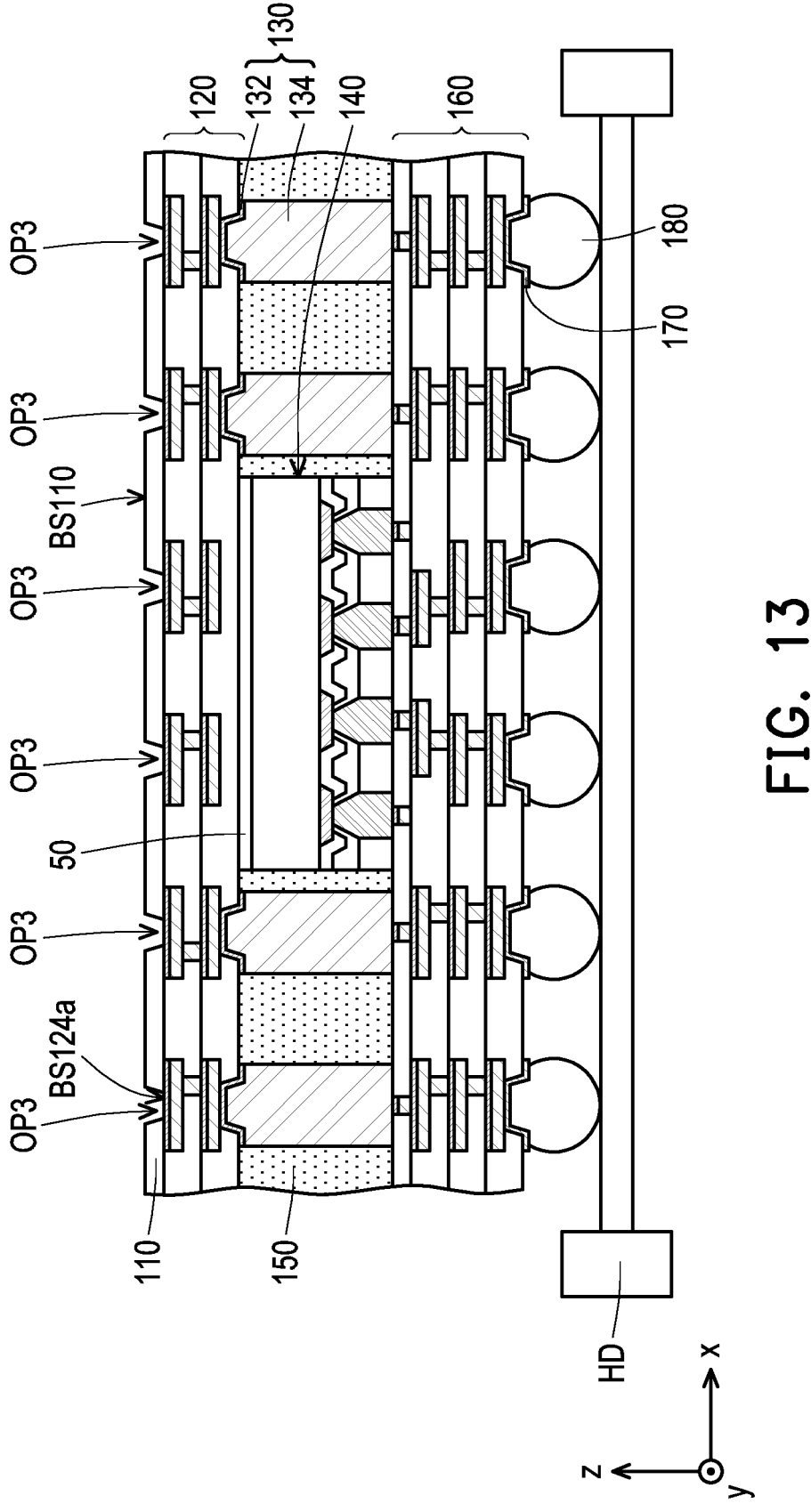

Referring to FIG. 13, in some embodiments, the enhancing layer 110 is patterned to formed a plurality of openings OP3 penetrating therethrough and exposing a surface BS124a of the seed layer 124a. In some embodiments, the patterning includes a laser drilling process, a mechanical drilling process, or other suitable processes. In alternative embodiments, the patterning includes an etching process such as a dry etching, a wet etching, or a combination thereof. The disclosure is not limited thereto.

Figure 14:
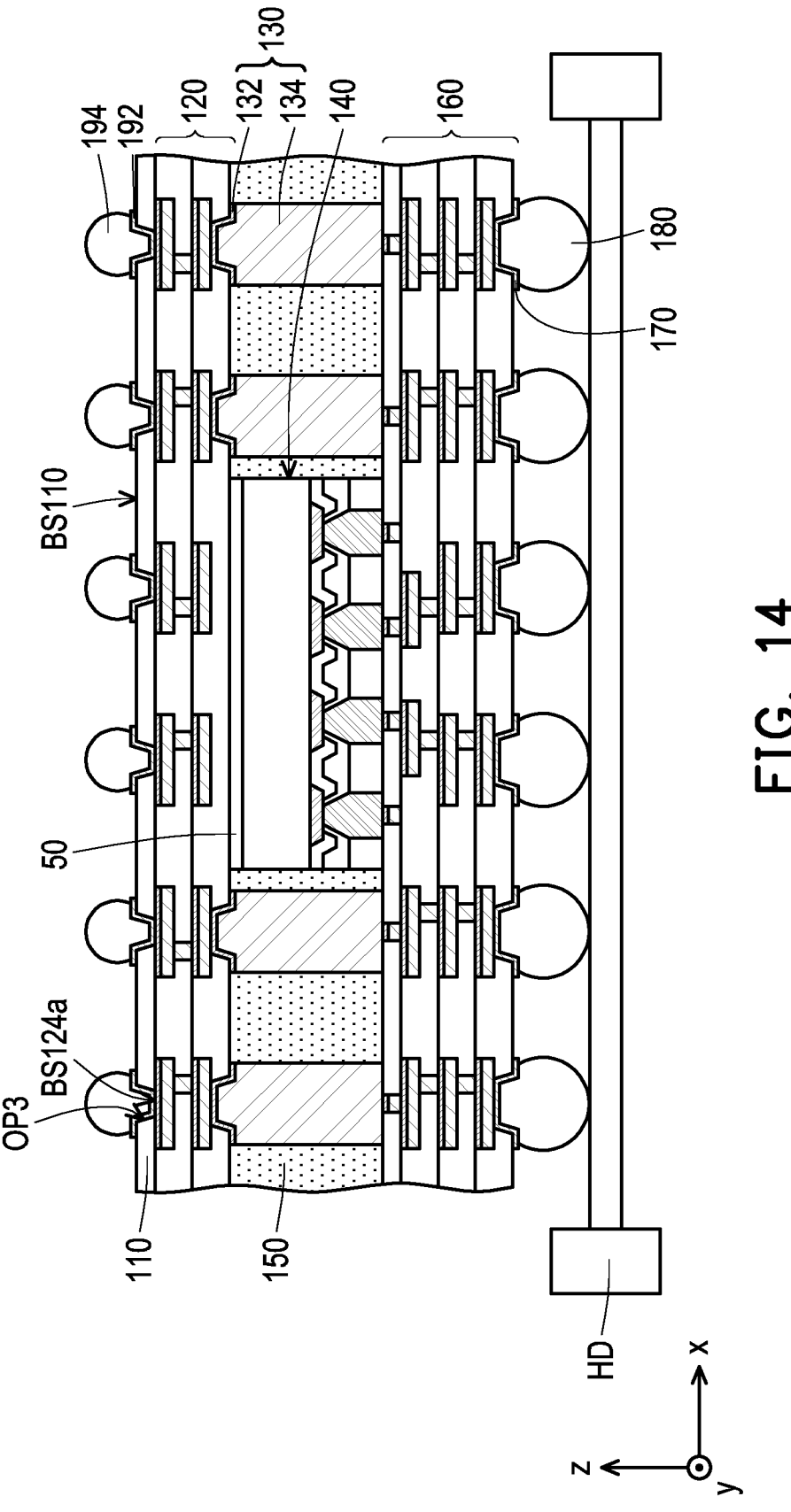

Referring to FIG. 14, in some embodiments, a plurality of under-ball metallurgy (UBM) patterns 192 and a plurality of conductive terminals 194 are sequentially formed on the enhancing layer 110 and over the redistribution circuit structure 120. In some embodiments, the UBM patterns 192 each are located between a respective one of the conductive terminals 194 and the enhancing layer 110. Due to the UBM patterns 192, the adhesion strength between the conductive terminals 194 and the enhancing layer 110 is enhanced. The formations and materials of the UBM patterns 192 and the conductive terminals 194 are similar to or substantially identical to the formations and materials of the UBM patterns 170 and the conductive terminals 180 as described in FIG. 11, respectively; thus, are not repeated herein for brevity. In some embodiments, the UBM patterns 192 are disposed on (e.g., in physical contact with) the seed layer 124a exposed by the openings OP3 formed in the enhancing layer 110. As shown in FIG. 14, for example, the UBM patterns 192 are physically connected to and electrically connected to the seed layer 124a of the redistribution circuit structure 120.

In some embodiments, the conductive terminals 194 are electrically coupled to the redistribution circuit structure 120 through the UBM patterns 192. In some embodiments, some of the conductive terminals 194 are electrically coupled to the conductive pillars 130 through some of the UBM patterns 192 and the redistribution circuit structure 120. In some embodiments, some of the conductive terminals 194 are electrically coupled to the redistribution circuit structure 160 through some of the UBM patterns 192, the redistribution circuit structure 120, and some of the conductive pillars 130. In some embodiments, some of the conductive terminals 194 are electrically coupled to the semiconductor die 140 through some of the UBM patterns 192, the redistribution circuit structure 120, some of the conductive pillars 130, and the redistribution circuit structure 160. In some embodiments, some of the conductive terminals 194 are electrically coupled to the conductive terminals 180 through some of the UBM patterns 192, the redistribution circuit structure 120, some of the conductive pillars 130, the redistribution circuit structure 160, and some of the UBM patterns 170.

However, the disclosure is not limited thereto. In some alternative embodiments, the UBM patterns 192 may be omitted. In such alternative embodiments, the conductive terminals 194 may be directly connected to (e.g., in physical contact with) the redistribution circuit structure 120 (e.g. the portions of the seed layer 124a exposed by the openings OP3). The conductive terminals 194 may be referred to as conductors or conductive connectors, in the disclosure.

Figure 15:
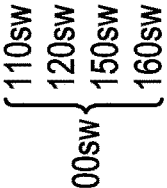
Figure 15:
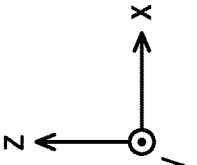

Referring to FIG. 14 and FIG. 15, in some embodiments, the conductive terminals 180 are released from the holding device HD to form the package structure 100. In some embodiments, prior to releasing the conductive terminals 180 from the holding device HD, a dicing (singulation) process is performed along dicing lines CL to cut a plurality of the package structure 100 interconnected therebetween into individual and separated package structures 100. In one embodiment, the dicing (singulation) process is a wafer dicing process including mechanical blade sawing, or laser cutting. The disclosure is not limited thereto. Up to here, the manufacture of the package structure 100 is completed. The package structure 100 is referred to as an integrated fan-out (InFO) package, which has dual-side terminals.

In some embodiments, after dicing, a sidewall 110SW of the enhancing layer 110, a sidewall 120SW of the redistribution circuit structure 120, a sidewall 150SW of the insulating encapsulation 150, and a sidewall 160SW of the redistribution circuit structure 160 are substantially aligned to each other, in the package structure 100 depicted in FIG. 15. That is, the sidewall 110SW of the enhancing layer 110, the sidewall 120SW of the redistribution circuit structure 120, the sidewall 150SW of the insulating encapsulation 150, and the sidewall 160SW of the redistribution circuit structure 160 together constitute a sidewall 100SW of the package structure 100. In FIG. 15, for example, a thickness T150 of the insulating encapsulation 150 is substantially equal to a thickness T130 of the conductive pillars 130, and the thickness T150 of the insulating encapsulation 150 and the thickness T130 of the conductive pillars 130 independently are substantially equal to a sum of a thickness T50 of the connecting film 50 and a thickness T140 of the semiconductor die 140.

Figure 16:
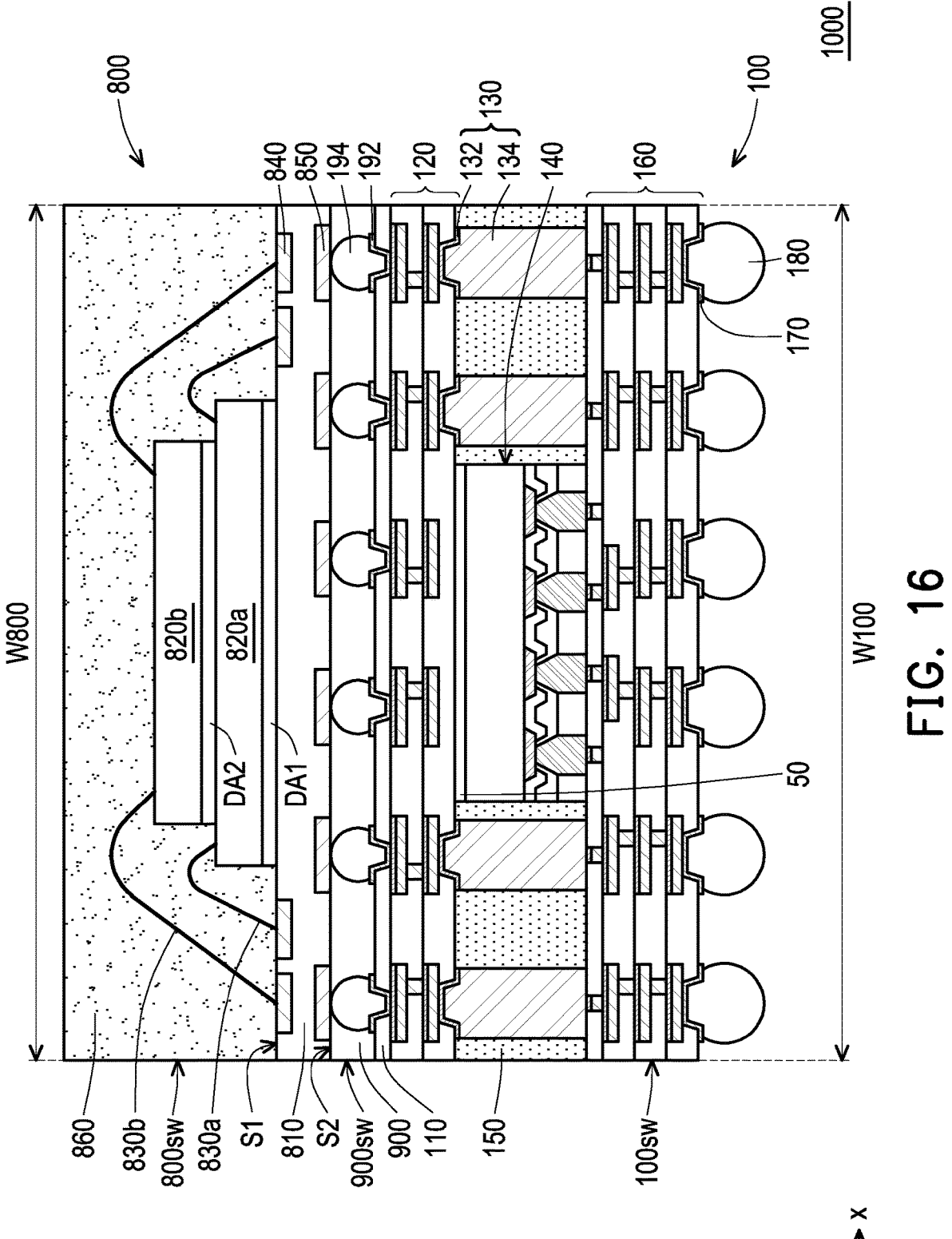
FIG. 16 is a schematic cross-sectional view of a package structure in accordance with some embodiments of the disclosure.

In addition, one or more than one package (such as a memory package or the like) may be mounted to the package structure 100 having a structure of InFO package to form a semiconductor package having a package-on-package (POP) structure. FIG. 16 is a schematic cross-sectional view of a package structure 1000 in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein. The package structure 1000 may be referred to as an InFO-POP package.

Referring to FIG. 16, in some embodiments, a package 800 is provided and bonded to the package structure 100 depicted in FIG. 15 to form the package structure 1000 having the POP structure. The details of the package structure 100 have been previously described in FIG. 1 through FIG. 15, and thus are not repeated herein for brevity. In some embodiments, the package 800 includes a substrate 810, semiconductor dies 820*a* and 820*b*, bonding wires 830*a* and 830*b*, conductive pads 840, conductive pads 850, an insulating encapsulation 860. Alternatively, the package 800 may further include the joining solder balls or pre-solders (not shown).

As shown in FIG. 16, for example, the semiconductor die 820*a* with a connecting film DA1 disposed thereon and the semiconductor die 820*b* with a connecting film DA2 disposed thereon are provided and are disposed on the substrate 810. In some embodiments, the connecting film DA1 is located between the semiconductor die 820*a* and the substrate 810, and the connecting film DA2 is located between the semiconductor die 820*a* and the semiconductor die 820*b*. In some embodiments, due to the connecting films DA1 and DA2 respectively provided between the semiconductor die 820*a* and the substrate 810 and between the semiconductor dies 820*a* and 820*b*, the semiconductor dies 820*a*, 820*b* are stably adhered to the substrate 810. In some embodiments, the connecting films DA1, DA2 may be, for example, a die attach film, a layer made of adhesives or epoxy resin, or the like.

For example, the semiconductor dies 820*a* and 820*b* are mounted on one surface (e.g. a surface S1) of the substrate 810. The semiconductor dies 820*a* and 820*b* independently may be a logic chip (e.g., CPU, GPU, NPU, DPU, TPU, SoC, AP, a microcontroller, etc.), a memory chip (e.g., a DRAM chip, a RRAM chip, a MRAM chip, a SRAM chip, a NAND flash memory, WIO, a HBM module, a HMC module, etc.), a power management chip (e.g., a PMIC chip), a RF chip, a BB chip, a sensor chip, a MEMS chip, a signal processing chip (e.g., a DSP chip), a front-end chip (e.g., AFE chips), the like, or a combination thereof. In one embodiment, the semiconductor dies 820*a* and 820*b* may be the same. For example, as shown in FIG. 16, the semiconductor dies 820*a* and 820*b* are DRAM chips, where the package 800 is referred to as a memory package. However, the disclosure is not limited thereto; alternatively, the semiconductor dies 820*a* and 820*b* may be different from each other.

In some embodiments, the bonding wires 830*a* and 830*b* are respectively used to provide electrical connections between the semiconductor dies 820*a*, 820*b* and some of the conductive pads 840 (such as bonding pads) located on the surface S1 of the substrate 810. Owing to the bonding wires 830*a* and 830*b*, the semiconductor dies 820*a* and 820*b* are electrically connected to the substrate 810.

In some embodiments, the insulating encapsulation 860 is formed on the surface S1 of the substrate 810 to encapsulate the semiconductor dies 820*a*, 820*b*, the bonding wires 830*a*, 830*b* and the conductive pads 840 to protect these components. A formation and material of the insulating encapsulation 860 is similar to or substantially identical to the formation and material of the insulating encapsulation 150 as described in FIG. 9 (in conjunction with FIG. 8), and thus are not repeated herein for brevity. In one embodiment, the insulating encapsulation 860 is the same as the insulating encapsulation 150. In an alternative embodiment, the insulating encapsulation 860 is different from the insulating encapsulation 150, the disclosure is not limited thereto.

In some embodiments, interconnects (not shown) and/or through-insulator-vias (not shown) embedded in the substrate 810 may be used to provide electrical connection between the conductive pads 840 and the conductive pads 850 (such as bonding pads) that are located on another surface (e.g. a surface S2 opposite to the surface S1 the in direction Z) of the substrate 810. In some embodiments, some of the conductive pads 850 are electrically coupled to the semiconductor dies 820*a* and 820*b* through these through-insulator-vias and/or interconnects in addition to some of the conductive pads 840 and the bonding wires 830*a*, 830*b*. Furthermore, some of the conductive pads 840 may be electrically coupled to each other through the interconnects, and some of the conductive pads 840 may be electrically coupled to each other through the interconnects.

In some embodiments, the conductive pads 850 of the package 800 are connected to and electrically coupled to the conductive terminals 194 of the package structure 100, and thus the package 800 is electrically coupled to the package structure 100. In some embodiments, the redistribution circuit structure 120 is electrically coupled to the substrate 810 of the package 800 through the conductive terminals 194 and the conductive pads 850. In some embodiments, the semiconductor dies 820*a*, 820*b* are electrically communicated to the semiconductor die 140.

In addition, as shown in FIG. 16, an insulating material 900 disposed in a gap between the package structure 100 and the package 800 and wraps around the conductive terminals 194, for example. Owing to the insulating material 900, the bonding strength between the package structure 100 and the package 800 is enhanced, thereby improving the reliability of the package structure 1000. The insulating material 900 may be an underfill made of any acceptable material, such as polymer, epoxy, molding underfill, or the like. The insulating material 900 may be formed by underfill dispensing or any other suitable method.

The formation of the package structure 1000 may include, but not limited to, bonding the package 800 to the package structure 100 after forming the conductive terminals 194 as described in FIG. 14 and prior to the dicing process as described in FIG. 15; applying the insulating material 900 in the gap between the package structure 100 and the package 800; and then performing the dicing process as described in FIG. 15 to cut through a plurality of the package 800 interconnected therebetween, the insulating material 900, and a plurality of the package structure 100 interconnected therebetween into individual and separated package structures 1000. In some embodiments, after dicing, a sidewall 800SW of the package 800, a sidewall 900SW of the insulating material 900, and the sidewall 100SW of the package structure 100 are substantially aligned to each other, in the package structure 1000 depicted in FIG. 16. That is, the sidewall 800SW of the package 800, the sidewall 900SW of the insulating material 900, and the sidewall 100SW of the package structure 100 together constitute a sidewall 1000SW of the package structure 1000. In other words, in the package structure 1000 of FIG. 16, a lateral size W800 of the package 800 is substantially equal to a lateral size W100 of the package structure 100.

However, the disclosure is not limited thereto; alternatively, the formation of the package structure 1000 may include bonding the package 800 to the package structure 100 after forming the conductive terminals 194 as described in FIG. 14 and prior to the dicing process as described in FIG. 15; applying the insulating material 900 in the gap between the package structure 100 and the package 800; and then performing the dicing process as described in FIG. 15 to cut through only the insulating material 900 and a plurality of the package structure 100 interconnected therebetween into individual and separated package structures 1000. In the case, the lateral size of the package 800 is less than the lateral size of the package structure 100, where the sidewall of the package 800 is not aligned with the sidewall of the insulating material 900 and the sidewall of the package structure 100. The sidewall of the package 800 may be free of the insulating material 900. The sidewall of the package 800 may be at least partially covered by the insulating material 900.

Or alternatively, the formation of the package structure 1000 may include bonding the package 800 to the package structure 100 after the dicing process as described in FIG. 15; and then applying the insulating material 900 in the gap between the package structure 100 and the package 800 to form the package structure 1000. In the case, the lateral size of the package 800 is may be less than, greater than, or substantially equal to the lateral size of the package structure 100, where the sidewall of the package 800 is not aligned with the sidewall of the insulating material 900 and the sidewall of the package structure 100. The sidewall of the package 800 may be free of the insulating material 900. The sidewall of the package 800 may be at least partially covered by the insulating material 900.

Figure 17:
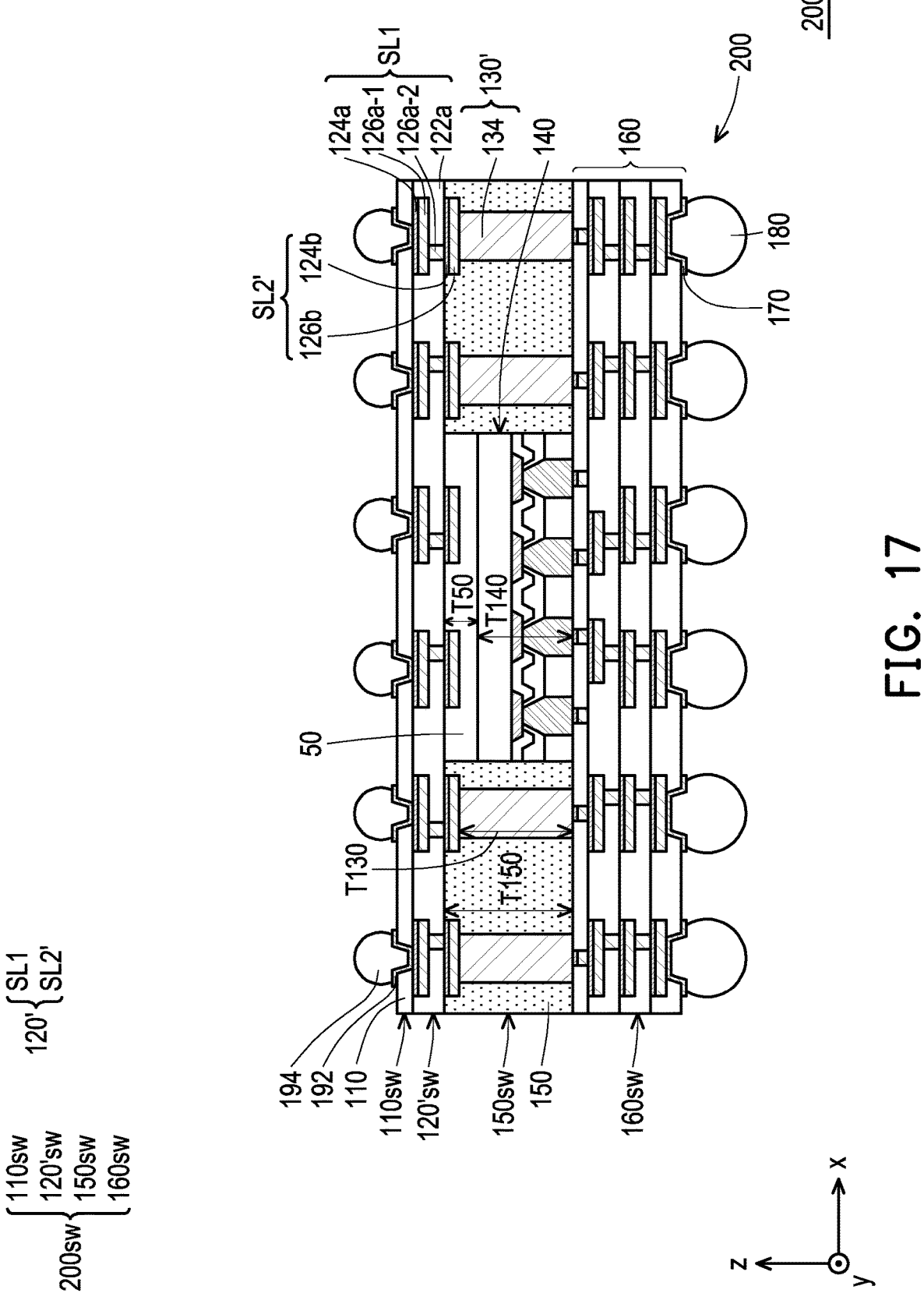
FIG. 17 is a schematic cross-sectional view of a package structure in accordance with some embodiments of the disclosure.
Figure 18:
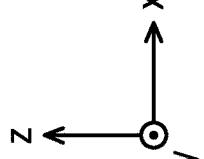
FIG. 18 is a schematic cross-sectional view of a package structure in accordance with some embodiments of the disclosure.

FIG. 17 is a schematic cross-sectional view of a package structure 200 in accordance with some embodiments of the disclosure. FIG. 18 is a schematic cross-sectional view of a package structure 2000 in accordance with some embodiments of the disclosure. Like elements are designated with the same reference numbers for ease of understanding and the details thereof are not repeated herein. The package structure 200 depicted in FIG. 17 is similar to the package structure 100 depicted in FIG. 15, the difference is that, the package structure 200 includes a redistribution circuit structure 120' and a plurality of conductive pillars 130', instead of the redistribution circuit structure 120 and the plurality of conductive pillars 130.

In some embodiments, the redistribution circuit structure 120' of FIG. 17 is similar to the redistribution circuit structure 120 of FIG. 15, except that the dielectric layer 122b is omitted. For example, as shown in FIG. 17, the redistribution circuit structure 120' includes a build-up layer SL1 (including a seed layer 124a, a conductive layer 126a-1, a plurality of conductive vias 126a-2, and a dielectric layer 122a) and a build-up layer SL2' (including a seed layer 124b and a conductive layer 126b). The details, formations and materials of the seed layer 124a, the conductive layer 126a-1, the conductive vias 126a-2, the dielectric layer 122a, the conductive vias 126a-2, and the dielectric layer 122a have been previously described in FIG. 1 through FIG. 4, and thus are not repeated herein for brevity. In some embodiments, in the package structure 200, up to the formation of the seed layer 124b, the redistribution circuit structure 120' is formed, where a plurality of conductive pillars 130' are formed on the redistribution circuit structure 120'. In some embodiments, the conductive pillars 130' includes only conductive vias 134 (e.g. without a seed layer 132), where the conductive pillars 130' are formed on the redistribution circuit structure 120' by using the conductive layer 126b as the seed layer. The details, formation and material of the conductive vias 134 have been previously described in FIG. 5, and thus are not repeated herein for brevity. Due to additional omissions of the dielectric layer 122b and the seed layer 132, an overall thickness of the package structure 200 and its manufacturing cost are further reduced, such that a heat dissipation path of the heat generated from an operation of the package structure 200 is further reduce, thereby greatly improving a thermal dissipation of the package structure 200. In addition, owing to the enhancing layer 110, better warpage control to the package structure 200 in subsequent processes is still achieved. Then, the processes as described in FIG. 6 through FIG. 15 are performed to form the package structure 200.

In some embodiments, a sidewall 110SW of the enhancing layer 110, a sidewall 120'SW of the redistribution circuit structure 120', a sidewall 150SW of the insulating encapsulation 150, and a sidewall 160SW of the redistribution circuit structure 160 are substantially aligned to each other, in the package structure 200 depicted in FIG. 17. That is, the sidewall 110SW of the enhancing layer 110, the sidewall 120'SW of the redistribution circuit structure 120', the sidewall 150SW of the insulating encapsulation 150, and the sidewall 160SW of the redistribution circuit structure 160 together constitute a sidewall 200SW of the package structure 200. In FIG. 17, for example, a thickness T150 of the insulating encapsulation 150 is greater than a thickness T130 of the conductive pillars 130', the thickness T150 of the insulating encapsulation 150 is substantially equal to a sum of a thickness T50 of the connecting film 50 and a thickness T140 of the semiconductor die 140, and the thickness T130 of the conductive pillars 130' is less than the sum of the thickness T50 of the connecting film 50 and the thickness T140 of the semiconductor die 140. The package structure 100 is referred to as an integrated fan-out (InFO) package, which has dual-side terminals.

In addition, one or more than one package (such as a memory package or the like) may be mounted to the package structure 200 having a structure of InFO package to form a semiconductor package having a PoP structure. As shown in FIG. 18, a package 800 is bonded to the package structure 200 to form the package structure 2000, for example. The details of the package 800 and its bonding method have been previously described in FIG. 16, and thus are not repeated herein for brevity. The package structure 2000 may be referred to as an InFO-POP package. As shown in FIG. 18, the sidewall 800SW of the package 800, the sidewall 900SW of the insulating material 900, and the sidewall 200SW of the package structure 200 together may constitute a sidewall 2000SW of the package structure 2000. In other words, in the package structure 2000 of FIG. 18, a lateral size W800 of the package 800 is substantially equal to a lateral size W200 of the package structure 200. In the case, the sidewall 800SW of the package 800, the sidewall 900SW of the insulating material 900, and the sidewall 200SW of the package structure 200 are substantially aligned with each other.

However, the disclosure is not limited thereto. Alternatively, the lateral size of the package 800 may be less than or greater than the lateral size of the package structure 200, where the sidewall of the package 800 is not aligned with the sidewall of the insulating material 900 and the sidewall of the package structure 200. The sidewall of the package 800 may be free of the insulating material 900. The sidewall of the package 800 may be at least partially covered by the insulating material 900.

Figure 25:
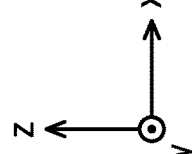
FIG. 25 is a schematic cross-sectional view of a package structure in accordance with some embodiments of the disclosure.
Figure 26C:
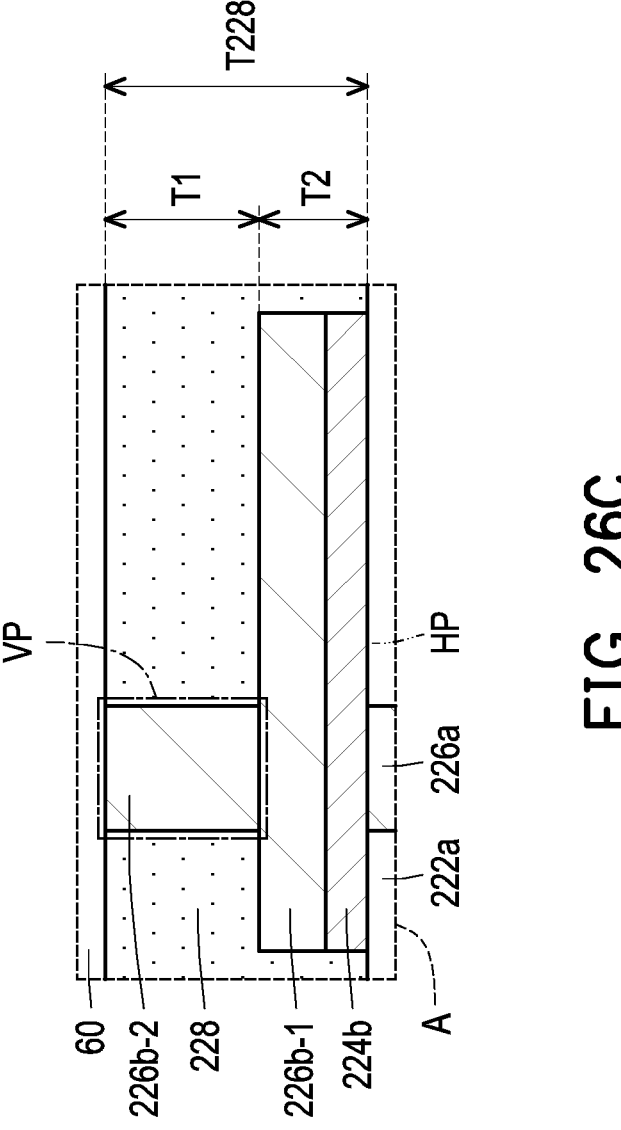

FIG. 19 through FIG. 24 are schematic cross-sectional views of various stages in a manufacturing method of a package structure 300 in accordance with some alternative embodiments of the disclosure. FIG. 25 is a schematic cross-sectional view of a package structure 3000 in accordance with some embodiments of the disclosure. FIG. 26A is an enlarged and schematic cross-sectional view showing a portion of the package structure 300 in a dashed area A outlined in FIG. 22 in accordance with some embodiments of the disclosure. FIG. 26B and FIG. 26C are respectively an enlarged and schematic cross-sectional view showing a portion of the package structure 300 in a dashed area A outlined in FIG. 22 in accordance with some alternative embodiments of the disclosure. The elements similar to or substantially the same as the elements described above will use the similar reference numbers (e.g., an element having a reference number 'AXX' is similar to or substantially the same as an element having a reference number 'BXX', where A and B are different numerals), and certain details or descriptions of the same elements (e.g. the formations and materials) and the relationship thereof (e.g. the relative positioning configuration and electrical connection) will not be repeated herein.

Figure 19:
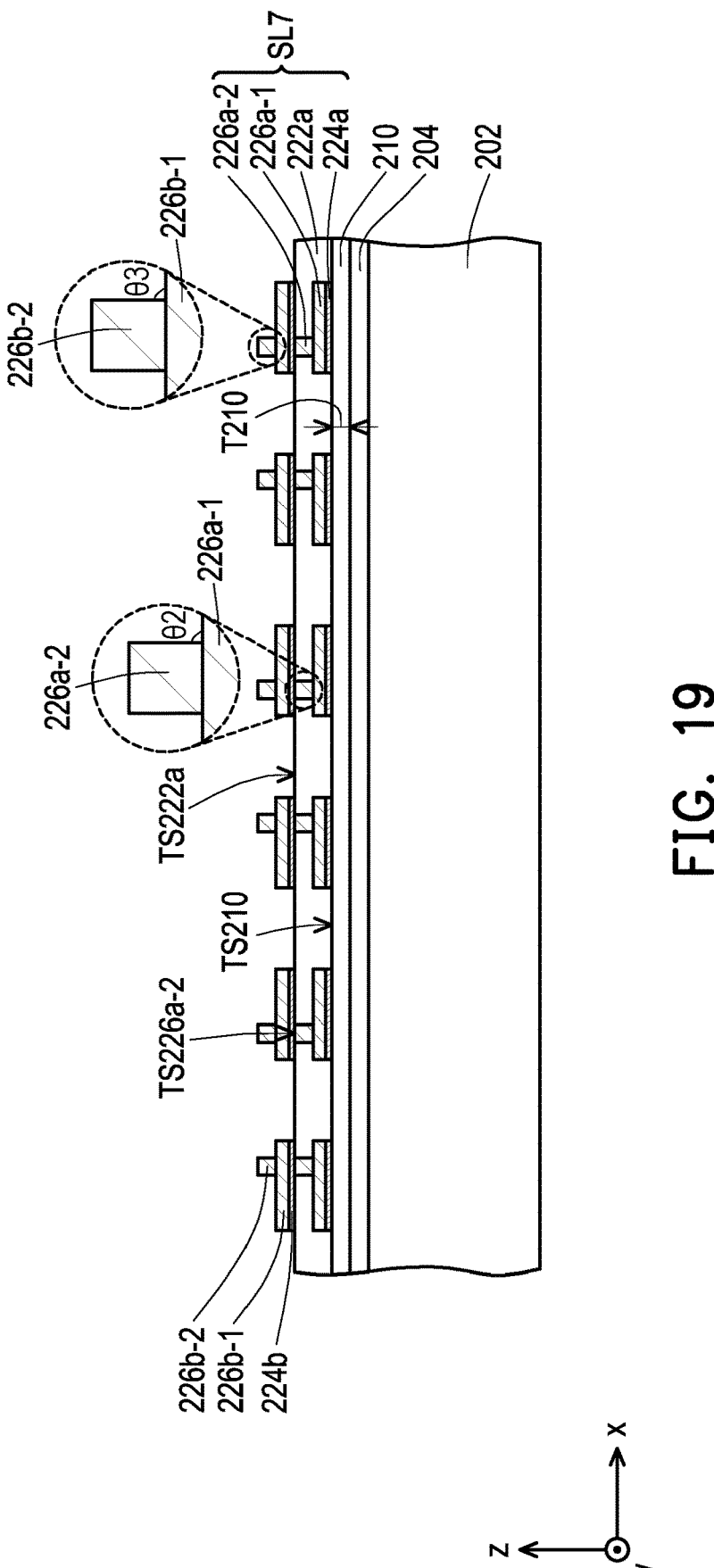
FIG. 19 through FIG. 24 are schematic cross-sectional views of various stages in a manufacturing method of a package structure in accordance with some alternative embodiments of the disclosure.

Referring to FIG. 19, in some embodiments, a carrier substrate 202 is provided for the package structure 300, and a release layer 204 and an enhancing layer 210 are sequentially formed on the carrier substrate 202. The formations and materials of the carrier substrate 202, the release layer 204, and the enhancing layer 210 are similar to or substantially identical to the formations and materials of the carrier substrate 102, the release layer 104, and the enhancing layer 110 as described in FIG. 1, respectively; thus, are not repeated herein for brevity. In some embodiments, as shown in FIG. 19, a surface TS210 (e.g. a top surface) of the enhancing layer 210 provides a high degree of coplanarity and flatness. Due to the high degree of coplanarity and flatness, the formation of the later-formed layer(s) and/or element(s) is beneficial. In some embodiments, along a direction Z (e.g. a stacking direction of the carrier substrate 202, the release layer 204, and the enhancing layer 210), a thickness T210 of the enhancing layer 210 is from about 5 μm to about 60 μm. Due to the enhancing layer 210 (e.g. its low Young's modulus value and specific thickness range), better warpage control (e.g., warpage being less than or substantially equal to about 0 μm at room temperature and being greater than or substantially equal to about −100 μm towards the conductive terminals 280) to the package structure 300 in subsequent processes is achieved. The enhancing layer 210 may be referred to as an enhancing element, an enhancement layer or film, or a backside enhancement layer or film.

Figure 20:
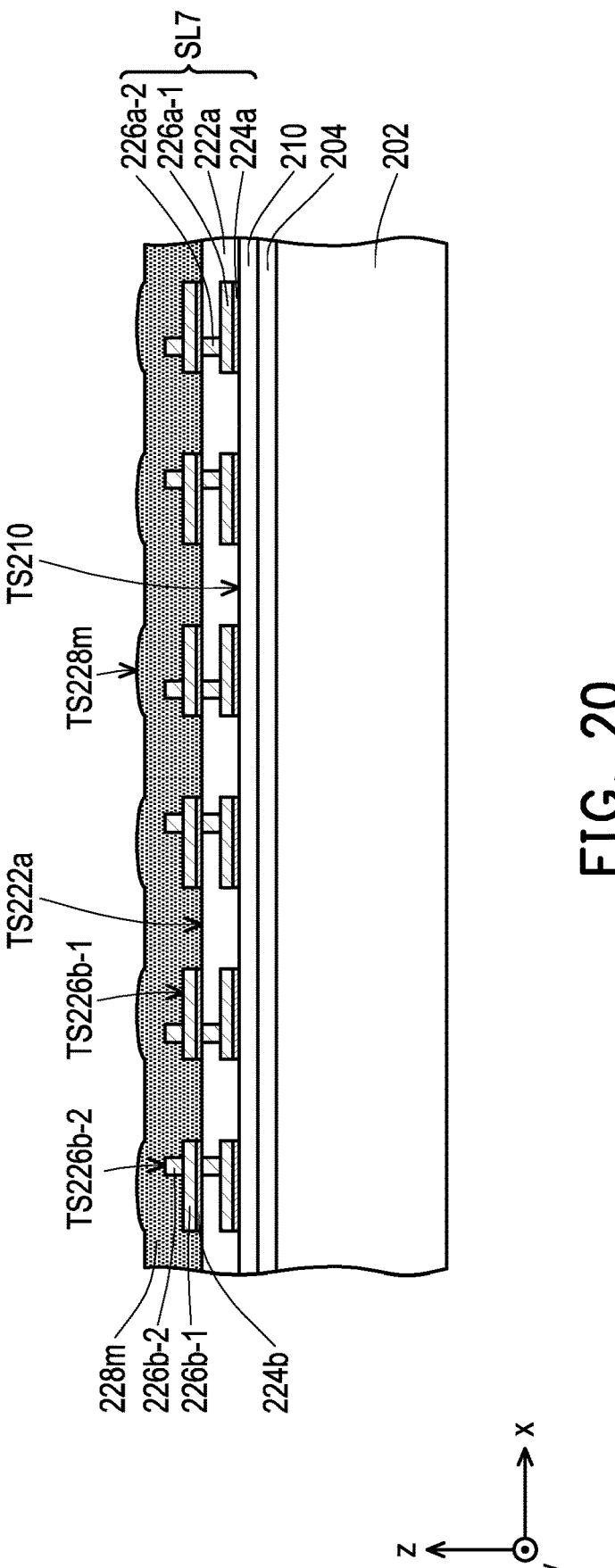
Figure 21:
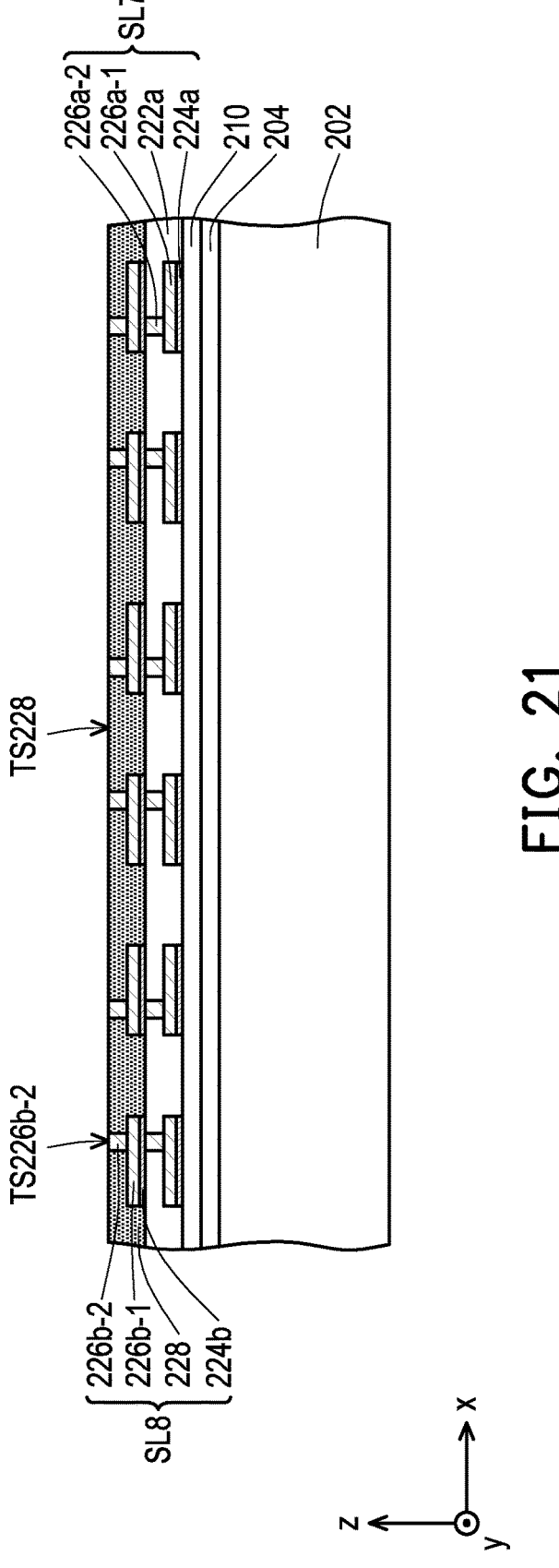

After the formation of the enhancing layer 210, a redistribution circuit structure 220 is formed on the enhancing layer 210 and over the carrier substrate 202, as shown in FIG. 19 through FIG. 21, for example. In some embodiments, the redistribution circuit structure 220 includes at least one dielectric layer 222 (e.g. 222*a*), at least one seed layer 224 (e.g. 224*a* and 224*b*), at least one metallization layer 226 (e.g. 226*a* (including 226*a*-1 and 226*a*-2) and 226*b* (including 226*b*-1 and 226*b*-2)), and a dielectric layer 228. However, the numbers of layers of the dielectric layer 222, the seed layer 224, and the metallization layer 226 are not limited to what is depicted in the drawings of the disclosure, where the numbers of the layers of the dielectric layer 222, the seed layer 224, and the metallization layer 226 may be one or more than one depending upon the demand and design requirements. In some embodiments, one metallization layer 226 includes a line portion extending along a horizontal direction (e.g. the direction X or the direction Y), a via portion extending along a vertical direction (e.g. the direction Z), or a combination thereof.

As illustrated in FIG. 19, in some embodiments, a seed layer 224*a*, a conductive layer 226*a*-1, a plurality of conductive vias 226*a*-2, a dielectric layer 222*a* are sequentially formed on the enhancing layer 210 (e.g. the surface TS210). In some embodiments, the conductive layer 226*a*-1 is disposed on (e.g., in physical contact with) and electrically connected to the seed layer 224*a*, the conductive vias 226*a*-2 are disposed on (e.g., in physical contact with) and electrically connected to the conductive layer 226*a*-1, and the dielectric layer 222*a* encapsulates the seed layer 224*a*, the conductive layer 226*a*-2 and the conductive vias 226*a*-2. The conductive vias 226*a*-2 may be electrically coupled to the seed layer 224*a* through the conductive layer 226*a*-1. For examples, illustrated top surfaces of the conductive vias 226*a*-2 are accessibly revealed by an illustrated top surface of the dielectric layer 222*a* for electrical connection to a later-formed component. The conductive layer 226*a*-1 and the conductive vias 226*a*-2 may together be referred to as a metallization layer 226*a* included in the redistribution circuit structure 220, where each of the conductive segments of the conductive layer 226*a*-1 may be referred to as a line portion for lateral routing function, and each of the conductive vias 226*a*-2 may be referred to as a via portion for vertical routing function (e.g., electrical connections between an overlying conductor (e.g., 224*b*) and an underlying conductor (e.g., 226*a*-1)).

In some embodiments, the seed layer 224*a* and the metallization layer 226*a* (including the conductive layer 226*a*-1 and the conductive vias 226*a*-2) disposed thereon together are referred to as a redistribution layer or a redistribution line. The formations and materials of the dielectric layer 222*a*, the seed layer 224*a*, the conductive layer 226*a*-1 and the conductive vias 266*a*-2 are similar to or substantially identical to the formations and materials of the dielectric layer 122*a*, the seed layer 124*a*, the conductive layer 126*a*-1, and the conductive vias 126*a*-2 as described in FIG. 1 through FIG. 3, respectively; thus, are not repeated herein for brevity. In some embodiments, an angle θ2 between a sidewall (not labeled) of one conductive via 226*a*-2 and an illustrated top surface (not labeled) of a respective one conductive layer 226*a*-1 is greater than or substantially equal to about 90 degrees. In the case, the angle θ2 may be greater than or substantially equal to about 90 degrees and less than or substantially equal to 130 degrees. For example, as shown in FIG. 19, the angle θ2 between the sidewall of one conductive via 226a-2 and an illustrated top surface of a respective one conductive layer 226a-1 is substantially equal to about 90 degrees. Alternatively, the angle θ2 may be an obtuse angle. In some embodiments, the seed layer 224a, the metallization layer 226a (including the conductive vias 226a-1 and the conductive vias 226a-2), and the dielectric layer 222a are referred to as a build-up layer SL7 of the redistribution circuit structure 220.

Continued on FIG. 19, in some embodiments, a seed layer 224b, a conductive layer 226b-1, and a plurality of conductive vias 226b-2 are sequentially formed on the build-up layer SL7 (e.g. a surface TS222a of the dielectric layer 222a and surfaces TS226a-2 of the conductive vias 226a-2). In some embodiments, the seed layer 224b is disposed on (e.g., in physical contact with) and electrically connected to the conductive vias 226a-2, the conductive layer 226b-1 is disposed on (e.g., in physical contact with) and electrically connected to the seed layer 224b, and the conductive vias 226b-2 are disposed on (e.g., in physical contact with) and electrically connected to the conductive layer 226b-1. The conductive layer 226b-1 may be electrically coupled to the conductive vias 226a-2 through the seed layer 224b. The conductive vias 226b-2 may be electrically coupled to the seed layer 224b through the conductive layer 226b-1 and may be electrically coupled to the conductive vias 226a-2 through the conductive layer 226b-1 and the seed layer 224b. The conductive layer 226b-1 and the conductive vias 226b-2 may together be referred to as a metallization layer 226b included in the redistribution circuit structure 220, where each of the conductive segments of the conductive layer 226b-1 may be referred to as a line portion for lateral routing function, and each of the conductive vias 226b-2 may be referred to as a via portion for vertical routing function (e.g., electrical connections between an overlying conductor (e.g., 130 in FIG. 22) and an underlying conductor (e.g., 226b-1)).

In some embodiments, the seed layer 224b and the metallization layer 226b (including the conductive layer 226b-1 and the conductive vias 226b-2) disposed thereon together are referred to as a redistribution layer or a redistribution line. The formations and materials of the seed layer 224b, the conductive layer 226b-1 and the conductive vias 266b-2 are similar to or substantially identical to the formations and materials of the seed layer 124a, the conductive layer 126a-1, and the conductive vias 126a-2 as described in FIG. 1 through FIG. 3, respectively; thus, are not repeated herein for brevity. In some embodiments, an angle θ3 between a sidewall (not labeled) of one conductive via 226b-2 and an illustrated top surface (not labeled) of a respective one conductive layer 226b-1 is greater than or substantially equal to about 90 degrees. In the case, the angle θ3 may be greater than or substantially equal to about 90 degrees and less than or substantially equal to 130 degrees. For example, as shown in FIG. 19, the angle θ3 between the sidewall of one conductive via 226a-2 and an illustrated top surface of a respective one conductive layer 226b-1 is substantially equal to about 90 degrees. Alternatively, the angle θ3 may be an obtuse angle.

Referring to FIG. 20, in some embodiments, a dielectric material layer 228m is formed on the seed layer 224b, the conductive layer 226b-1 (e.g., a surface TS226b-1), the conductive vias 226b-2 (e.g., a surface TS226b-2), and the dielectric layer 222a (e.g., the surface TS222a) exposed therefrom to completely cover the seed layer 224b, the conductive layer 226b-1, the conductive vias 226b-2 and the dielectric layer 222a. The seed layer 224b, the conductive layer 226b-1, the conductive vias 226b-2, and the dielectric layer 222a are not accessibly revealed by the dielectric material layer 228m, for example. As shown in FIG. 20, a surface TS228m of the dielectric material layer 228m is, for example, non-planar in relative with the surface TS210 of the enhancing layer 210, which may adopt an overall topography of the underlying elements (such as the seed layer 224b, the conductive layer 226b-1, the conductive vias 226b-2, and the dielectric layer 222a).

The formation of the dielectric material layer 228m may include, but not limited to, conformally forming a blanket of a dielectric material over the structure depicted in FIG. 19 through lamination. For example, the dielectric material layer 228m is a pre-formed dielectric material blanket layer, which can be formed on the structure depicted in FIG. 19 through lamination. In some embodiments, a material (e.g., the dielectric material) of the dielectric material layer 228m includes a molding compound or a polymer-based resin. The molding compound, for example, includes epoxy resin, hardener resin, a suitable resin, or the like. The molding compound may further include a color agent, a coupling agent, an ion catcher, a cure promotor, or the like; the disclosure is not limited thereto. The polymer-based resin, for example, includes PI, acrylate polymer, epoxy polymer, a suitable polymer, or the like. In some embodiments, the dielectric material layer 228m may further include a filler. The filler, for example, includes $SiO_2$, $Al_2O_3$, AlN, diamond, BN, a suitable inorganic filler, or a combination thereof, where a particle diameter of the filler is from about 100 nm to about 15 μm. In the dielectric material layer 228m, a weight percentage ratio of the polymer-based resin to the filler or of the molding compound to the filler is approximately from 10% to 90%, in some embodiments. The dielectric material layer 228m, for example, has a coefficient of thermal expansion (CTE) ranging from about 5 ppm/K to about 100 ppm/K, a Young's modulus (E) ranging from about 0.1 MPa to about 25 GPa, and a glass transition temperature (Tg) ranging from about 100 degrees Celsius to about 210 degrees Celsius. In some embodiments, the dielectric material layer 228m has a thermal conductivity about 0.58 W/(m·K) to about 3.00 W/(m·K). For one non-limiting example, the dielectric material layer 228m is a pre-formed molding layer without filler. For another non-limiting example, the dielectric material layer 228m is a pre-formed molding layer with a filler distributed therein.

Referring to FIG. 21, in some embodiments, the dielectric material layer 228m is planarized to form the dielectric layer 228 exposing the surfaces TS226b-2 of the conductive vias 226b-2. In some embodiments, the dielectric material layer 228m is planarized by a mechanical grinding process, a CMP process, an etching process, or combinations thereof. The etching process may include a dry etching, a wet etching, or a combination thereof. During the planarizing process of the dielectric material layer 228m, portions of the conductive vias 226b-2 may be slightly planarized as well. As shown in FIG. 21, the surfaces TS226b-2 of the conductive vias 226b-2 are substantially leveled with a surface TS228 of the dielectric layer 228, for example. In some embodiments, the surface TS228 of the dielectric layer 228 is substantially coplanar to the surfaces TS226b-2 of the conductive vias 226b-2. As shown in FIG. 21, the surface TS228 of the dielectric layer 228, for example, provides a high degree of coplanarity and flatness. Due to the high degree of coplanarity and flatness in the surface TS228 of the dielectric layer 228, the formation of the later-formed layer(s) and/or element(s) is beneficial, such as a process window of a pick-and-place process for a semiconductor die is enlarged. After the planarizing process, a cleaning process may be optionally performed, for example to clean and remove the residue generated from the planarizing process. However, the disclosure is not limited thereto, and the planarizing process may be performed through any other suitable method.

In some embodiments, the seed layer 224b, the conductive layer 226b-1, the conductive vias 226b-2, and the dielectric layer 228 are referred to as a build-up layer SL8 of the redistribution circuit structure 220. Up to here, the redistribution circuit structure 220 is formed. For example, the build-up layer SL7 and the build-up layer SL8 are electrically connected to one another. Although only one build-up layer SL7 and one build-up layer SL8 are included in the redistribution circuit structure 220 as shown in FIG. 21 for illustrative purposes, the number of each of the build-up layers SL7, SL8 may not be limited to what is depicted in FIG. 21. For example, the number of the build-up layer SL7 may be zero, one or more than one, and the number of the build-up layer SL8 may be one or more than one. The disclosure is not limited thereto.

Figure 22:
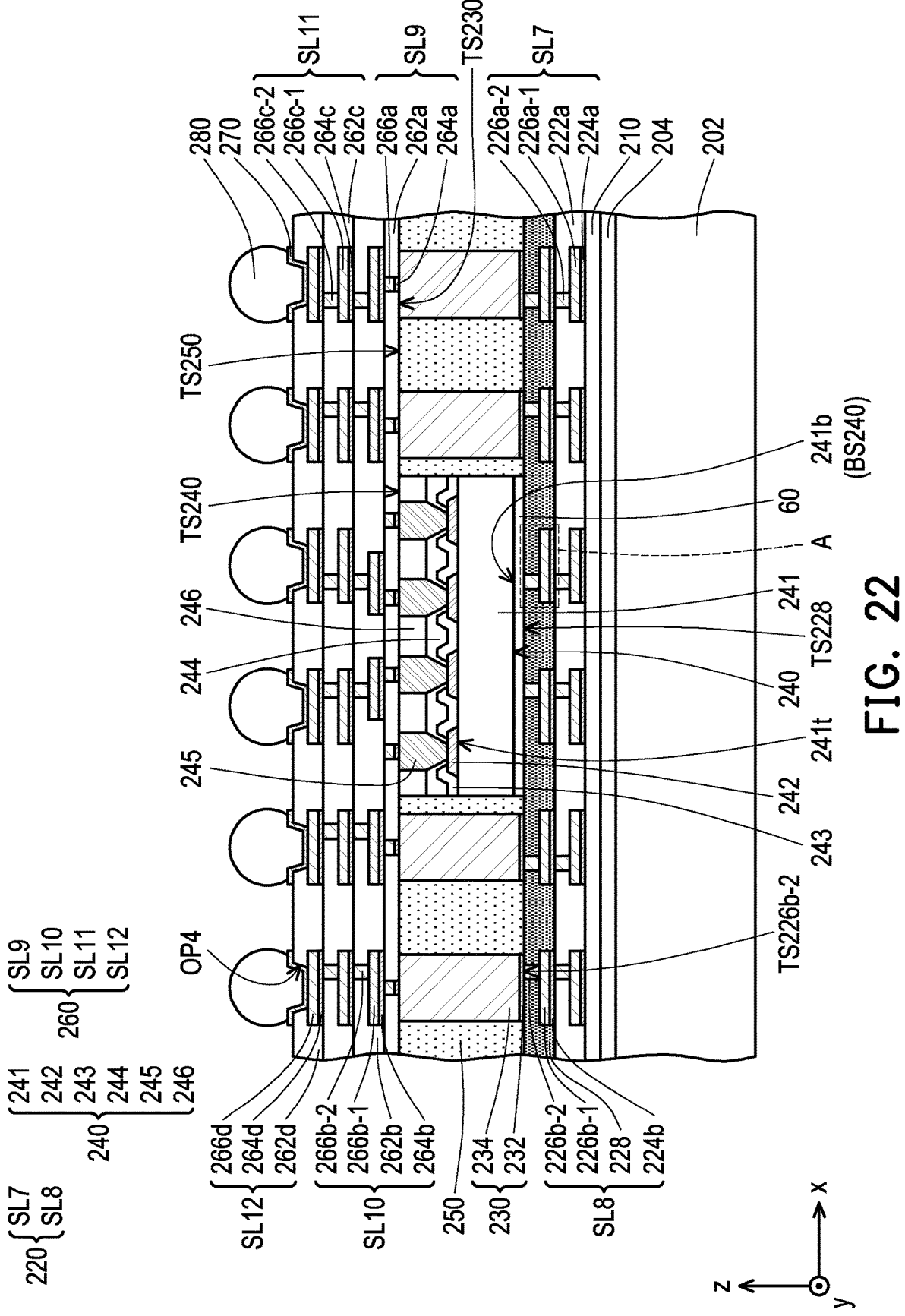

Referring to FIG. 22, in some embodiments, a plurality of conductive pillars 230, a semiconductor die 240, an insulating encapsulation 250, a redistribution circuit structure 260, a plurality of UBM patterns 270, and a plurality of conductive terminals 280 are sequentially formed on the redistribution circuit structure 220 and over the enhancing layer 210. In some embodiments, the semiconductor die 240 is bonded to the redistribution circuit structure 220 by adhering onto the redistribution circuit structure 220 with a connecting film 60. The semiconductor die 240 (e.g., a backside surface 241b thereof) may be adhered to the redistribution circuit structure 220 (e.g. the surface TS228 and the surfaces TS226b-2) by the connecting film 60. For example, as shown in FIG. 22, the connecting film 60 is sandwiched between the semiconductor die 240 and the redistribution circuit structure 220. Owing to the connecting film 60, the semiconductor die 240 is stably adhered to the redistribution circuit structure 220. Due to the dielectric layer 228 (having the surface TS228 with high degree of coplanarity and flatness), there is no or little air or void trapped between the connecting film 60 and the redistribution circuit structure 220, thereby an undesired movement of the semiconductor die 240 and/or the insulating encapsulation 250 surrounding the semiconductor die 240 may be suppressed, which enhancing the reliability and performance of the package structure 300. In addition, since there is no or little air or void trapped between the connecting film 60 and the redistribution circuit structure 220, a coplanarity of the package structure 300 is improved. In some embodiments, the connecting film 60 includes a die attach film or a layer made of adhesives, epoxy-based resin, acrylic polymer, other suitable insulating material, or the like, and which may be with or without fillers filled therein (such as silica, alumina, or the like).

On the other hand, in some embodiments, the connecting film 60 is disposed between the semiconductor die 240 and the metallization layer 226b (exposing by the dielectric layer 228) of the redistribution circuit structure 220. The metallization layer 226b may include a plurality of heat dissipating structures 70 disposed underneath the semiconductor die 240, exposed by the dielectric layer 228 and being offset with the conductive pillars 230, indicated by the dotted box A in FIG. 22. For example, in the vertical projection on the enhancing layer 210 along the direction Z, the heat dissipating structures 70 are overlapped with the semiconductor die 240. That is to say, positioning locations of the heat dissipating structures 70 may be within (e.g., completely fell into) a position location of the semiconductor die 240. Referring to FIG. 22 and FIG. 26A, one heat dissipating structure 70 includes a horizontal portion HP and a vertical portion VP standing on the horizontal portion HP, where the vertical portion VP includes one conductive via 226b-2, and the horizontal portion HP includes one conductive segment of the seed layer 224b and one conductive segment of the conductive layer 226b-1 connected thereto, for example. In some embodiments, in each of the heat dissipating structures 70, the vertical portion VP is physically connected and electrically connected to the horizontal portion HP. That is, the vertical portion VP thermally coupled to the horizontal portion HP. As shown in FIG. 22, the heat dissipating structures 70 are embedded in the redistribution circuit structure 220 (e.g. in the build-up layer SL8), which are thermally coupled to the redistribution circuit structure 220, for example. In some embodiments, the heat dissipating structures 70 are further electrically coupled to the redistribution circuit structure 220. Owing to the heat dissipating structures 70, a heat dissipation path of the heat generated from an operation of the package structure 300 to the redistribution circuit structure is shorten, which improves the heat dissipation of the package structure 300. The heat dissipating structures 70 may be referred to as thermal vias, thermal conductors, or thermal structures.

In one embodiment, a thickness T228 of the dielectric layer 288 is substantially equal to a sum of a thickness T1 of the vertical portion VP and a thickness T2 of the horizontal portion HP, where the thickness T1 of the vertical portion VP is less than the thickness T2 of the horizontal portion HP, as shown in FIG. 26A. However, the disclosure is not limited thereto. In an alternative embodiment, the thickness T228 of the dielectric layer 288 is substantially equal to the sum of the thickness T1 of the vertical portion VP and the thickness T2 of the horizontal portion HP, where the thickness T1 of the vertical portion VP is substantially equal to the thickness T2 of the horizontal portion HP, as shown in FIG. 26B. Or, in a further alternative embodiment, the thickness T228 of the dielectric layer 288 is substantially equal to the sum of the thickness T1 of the vertical portion VP and the thickness T2 of the horizontal portion HP, where the thickness T1 of the vertical portion VP is greater than the thickness T2 of the horizontal portion HP, as shown in FIG. 26C. In some embodiments, the thickness T228 of the dielectric layer 288 is ranging from about 15 μm to about 25 μm. In some embodiments, a ratio of the thickness T2 to the thickness T1 is about 0.5 to about 2. In other words, the heat dissipation of the package structure 300 may be controlled (e.g., improving) by adjusting the thicknesses T1, T2, and T228, for example, in the disclosure.

However, the disclosure is not limited thereto; in alternative embodiments, the connecting film 60 includes a suitable thermally conductive material having a good thermal conductivity, which may be between about 3 W/(m·K) to about 10 W/(m·K) or more. For example, the connecting film 60 is a film type thermal interface material, such as a graphene sheet, carbon nanotube sheet, or the like. A thickness T60 of the connecting film 60 may be less than or substantially equal to 20 μm. In some embodiments, a thickness T60 of the connecting film 60 is ranging from about 10 μm to about 20 μm. In such alternative embodiment, the connecting film 60 thermally couples the semiconductor die 240 and heating dissipating structures 70 embedded in the redistribution circuit structure 220, which further helps to dissipate heat from the semiconductor die 240. In other words, the heat dissipation of the package structure 300 may be further controlled (e.g., improving) by adjusting the thermal conductivity and/or the thickness T60 of the connecting film 60, for example, in the disclosure. In the case, the connecting film 60 is referred to as a thermally conductive film or layer, where the connecting film 60 includes thermally conductive die attach film.

In some embodiments, the conductive pillars 230 are disposed on (e.g., in physically contact with) and electrically connected to the redistribution circuit structure 220 and next to the semiconductor die 240. As illustrated in FIG. 22, the conductive pillars 230 and the semiconductor die 240 may be laterally encapsulated in the insulating encapsulation 250. In some embodiments, the redistribution circuit structure 260 is disposed on the conductive pillars 230, the semiconductor die 240 and the insulating encapsulation 250, and is electrically connected to the conductive pillars 230 and the semiconductor die 240. For example, at least some of the conductive pillars 230 are electrically coupled to the semiconductor die 240 through the redistribution circuit structure 260, and the redistribution circuit structure 220 is electrically coupled to the semiconductor die 240 through the redistribution circuit structure 260 and at least some of the conductive pillars 230. The UBM patterns 270 are physically connected and electrically connected to the redistribution circuit structure 260, for example. In the case, the conductive terminals 280 are physically connected and electrically connected to the UBM patterns 270, and are electrically coupled to the redistribution circuit structure 260 through the UBM patterns 270. For example, at least some of the conductive terminals 280 are electrically coupled to the semiconductor die 240 through the redistribution circuit structure 260 and respective ones of the UBM patterns 270. As shown in FIG. 22, at least some of the conductive terminals 280 are electrically coupled to the redistribution circuit structure 220 through respective ones of the UBM patterns 270, the redistribution circuit structure 260, and at least some of the conductive pillars 230. As shown in FIG. 22, the redistribution circuit structure 260 may be referred to as a front-side redistribution circuit structure or layer of the semiconductor die 240, while the redistribution circuit structure 220 may be referred to as a back-side redistribution circuit structure or layer of the semiconductor die 240.

The details, formations, and materials of the conductive pillars 230 (including a seed layer 132 and conductive vias 134), the semiconductor die 240 (including a semiconductor substrate 241 having an active surface 241*t* and a backside surface 241*b*, pads 242, a passivation layer 243, a post passivation layer 244, conductive vias 245, and a protection layer 246), the insulating encapsulation 250, the redistribution circuit structure 260 (including a building layer SL9 (having a dielectric layer 262*a*, a seed layer 264*a*, and a metallization layer 266*a* (e.g. conductive vias 266*a*)), a building layer SL10 (having a dielectric layer 262*b*, a seed layer 264*b*, and a metallization layer 266*b* (e.g. a conductive layer 266*b-l* and conductive vias 266*b*-2)), a building layer SL11 (having a dielectric layer 262*c*, a seed layer 264*c*, and a metallization layer 266*c* (e.g. a conductive layer 266*c*-1 and conductive vias 266*c*-2)), and a building layer SL12 (having a dielectric layer 262*d*, a seed layer 264*d*, and a metallization layer 266*d* (e.g. a conductive layer 266*d*))), the UBM patterns 270 and the conductive pillars 280 are similar to or substantially identical to the details, formations, and materials of the conductive pillars 130, the semiconductor die 140, the insulating encapsulation 150, the redistribution circuit structure 160, the UBM patterns 170 and the conductive pillars 180 as described in FIG. 5 through FIG. 11, respectively; thus, are not repeated herein for brevity. However, the disclosure is not limited thereto. In some alternative embodiments, the UBM patterns 270 may be omitted. In such alternative embodiments, the conductive terminals 280 may be directly connected to (e.g., in physical contact with) the redistribution circuit structure 260 (e.g. the portions of the conductive layer 266*d* exposed by openings OP4 formed in the dielectric layer 262*d*). The conductive terminals 280 may be referred to as conductors or conductive connectors, in the disclosure.

In some embodiments, the material of the insulating encapsulation 250 is different from the material of the dielectric layer 228. For one non-limiting example, if considering one of the insulating encapsulation 250 and the dielectric layer 228 includes no filler and other one of the insulating encapsulation 250 and the dielectric layer 228 includes filler, the material of the insulating encapsulation 250 and the material of the dielectric layer 228 are the same. For one non-limiting example, if considering one of the insulating encapsulation 250 and the dielectric layer 228 includes no filler and other one of the insulating encapsulation 250 and the dielectric layer 228 includes filler, the material of the insulating encapsulation 250 and the material of the dielectric layer 228 may be different. For another non-limiting example, if considering the insulating encapsulation 250 and the dielectric layer 228 both includes no filler, the material of the insulating encapsulation 250 and the material of the dielectric layer 228 are different. For another non-limiting example, if considering the insulating encapsulation 250 and the dielectric layer 228 both includes fillers, the material of the insulating encapsulation 250 and the material of the dielectric layer 228 are different, and the filler in the insulating encapsulation 250 and the filler in the dielectric layer 228 are the same. For another non-limiting example, if considering the insulating encapsulation 250 and the dielectric layer 228 both includes fillers, the material of the insulating encapsulation 250 and the material of the dielectric layer 228 are the same, and the filler in the insulating encapsulation 250 and the filler in the dielectric layer 228 are different. In the case of the insulating encapsulation 250 and the dielectric layer 228 both includes fillers, an amount of filler (by weight percentage) presented in the insulating encapsulation 250 is greater than an amount of filler (by weight percentage) presented in the dielectric layer 228.

Figure 23:
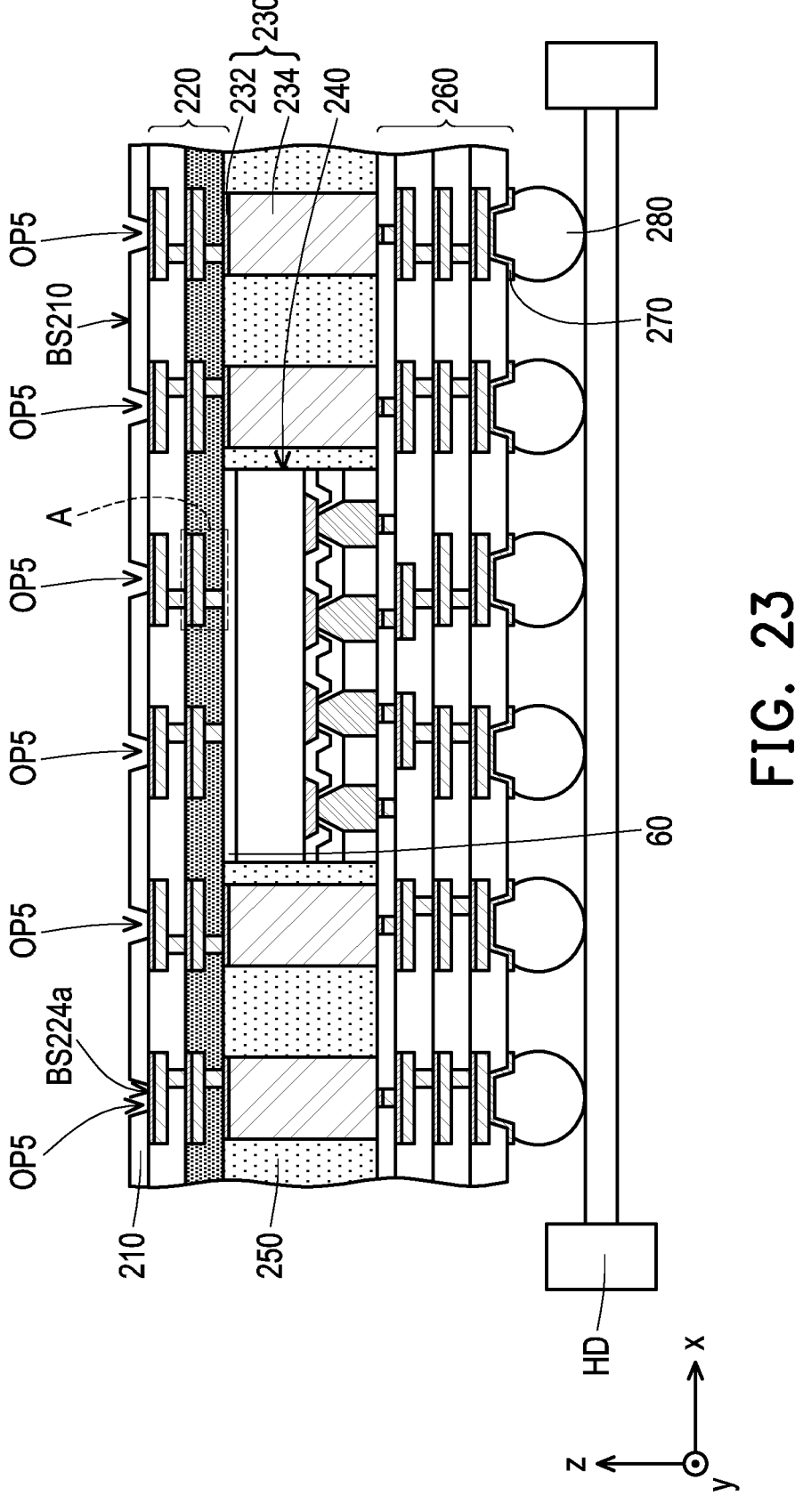

Referring to FIG. 23, in some embodiments, the whole structure depicted in FIG. 22 along with the carrier substrate 202 is flipped (turned upside down), where the conductive terminals 280 are placed to a holding device HD, and the carrier substrate 202 is then debonded from the enhancing layer 210 by removing the release layer 204. The details of the holding device HD and the debonding process have been previously described in FIG. 12, and thus are not repeated herein for brevity. Thereafter, in some embodiments, the enhancing layer 210 is patterned to formed a plurality of openings OP5 penetrating therethrough and exposing a surface BS224*a* of the seed layer 224*a*. The patterning may include a laser drilling process, a mechanical drilling process, or other suitable processes. In alternative embodiments, the patterning includes an etching process such as a dry etching, a wet etching, or a combination thereof. The disclosure is not limited thereto.

Figure 24:
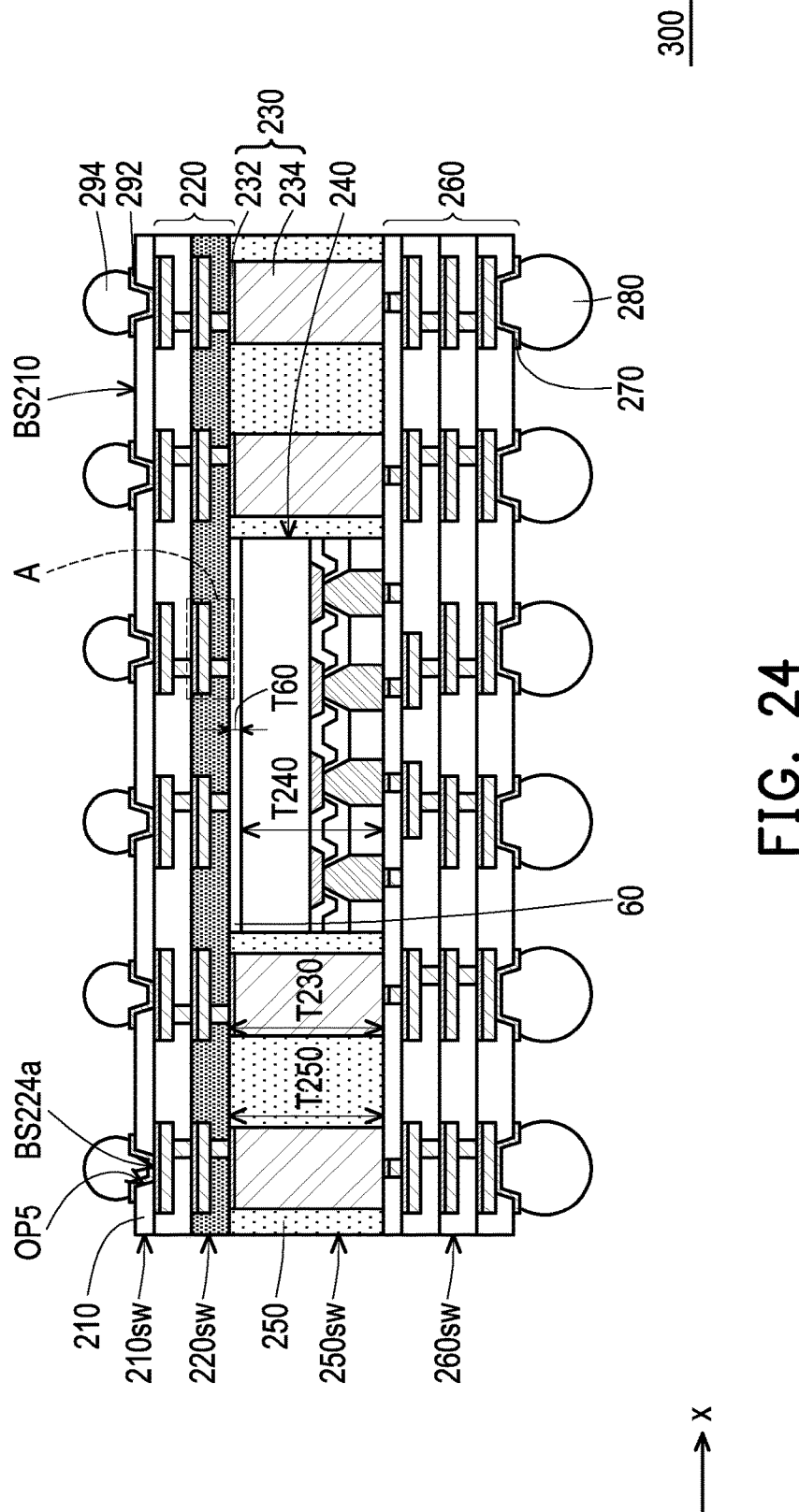

Referring to FIG. 24, in some embodiments, a plurality of UBM patterns 292 and a plurality of conductive terminals 294 are sequentially formed on the enhancing layer 210. In some embodiments, the UBM patterns 292 each are located between a respective one of the conductive terminals 194 and the enhancing layer 210. Due to the UBM patterns 292, the adhesion strength between the conductive terminals 294 and the enhancing layer 210 is enhanced. The formations and materials of the UBM patterns 292 and the conductive terminals 294 are similar to or substantially identical to the formations and materials of the UBM patterns 170 and the conductive terminals 180 as described in FIG. 11, respectively; thus, are not repeated herein for brevity. As shown in FIG. 24, the UBM patterns 292 are physically connected to and electrically connected to the redistribution circuit structure 220, and the conductive terminals 294 are physically connected to and electrically connected to the UBM patterns 292, for example. The conductive terminals 294 are and electrically coupled to the redistribution circuit structure 220 through the UBM patterns 292. In some embodiments, at least some of the conductive terminals 294 are electrically coupled to the semiconductor die 240. In some embodiments, at least some of the conductive terminals 294 are electrically coupled to some of the conductive terminals 280.

In some alternative embodiments, the UBM patterns 292 may be omitted. In such alternative embodiments, the conductive terminals 294 may be directly connected to (e.g., in physical contact with) the redistribution circuit structure 220 (e.g. the portions of the seed layer 224a exposed by the openings OP5). The conductive terminals 294 may be referred to as conductors or conductive connectors, in the disclosure.

Thereafter, in some embodiments, the conductive terminals 280 are released from the holding device HD to form a package structure 300. In some embodiments, prior to releasing the conductive terminals 280 from the holding device HD, a dicing (singulation) process is performed along dicing lines CL to cut a plurality of the package structure 300 interconnected therebetween into individual and separated package structures 300. In one embodiment, the dicing (singulation) process is a wafer dicing process including mechanical blade sawing, or laser cutting. The disclosure is not limited thereto. Up to here, the manufacture of the package structure 300 is completed. The package structure 300 is referred to as an InFO package, which has dual-side terminals.

In some embodiments, after dicing, a sidewall 210SW of the enhancing layer 210, a sidewall 220SW of the redistribution circuit structure 220, a sidewall 250SW of the insulating encapsulation 250, and a sidewall 260SW of the redistribution circuit structure 260 are substantially aligned to each other, in the package structure 300 depicted in FIG. 24. That is, the sidewall 210SW of the enhancing layer 210, the sidewall 220SW of the redistribution circuit structure 220, the sidewall 250SW of the insulating encapsulation 250, and the sidewall 260SW of the redistribution circuit structure 260 together constitute a sidewall 300SW of the package structure 300. In FIG. 24, for example, a thickness T250 of the insulating encapsulation 250 is substantially equal to a thickness T230 of the conductive pillars 230, and the thickness T250 of the insulating encapsulation 250 and the thickness T230 of the conductive pillars 230 independently are substantially equal to a sum of the thickness T60 of the connecting film 60 and a thickness T240 of the semiconductor die 240.

In addition, one or more than one package (such as a memory package or the like) may be mounted to the package structure 300 having a structure of InFO package to form a semiconductor package having a PoP structure. As shown in FIG. 25, a package 800 is bonded to the package structure

300 to form the package structure 3000, for example. The details of the package 800 and its bonding method have been previously described in FIG. 16, and thus are not repeated herein for brevity. The package structure 3000 may be referred to as an InFO-POP package. As shown in FIG. 25, the sidewall 800SW of the package 800, the sidewall 900SW of the insulating material 900, and the sidewall 300SW of the package structure 300 together may constitute a sidewall 3000SW of the package structure 3000. In other words, in the package structure 3000 of FIG. 25, a lateral size W800 of the package 800 is substantially equal to a lateral size W300 of the package structure 300. In the case, the sidewall 800SW of the package 800, the sidewall 900SW of the insulating material 900, and the sidewall 300SW of the package structure 300 are substantially aligned with each other.

However, the disclosure is not limited thereto. Alternatively, the lateral size of the package 800 may be less than or greater than the lateral size of the package structure 300, where the sidewall of the package 800 is not aligned with the sidewall of the insulating material 900 and the sidewall of the package structure 300. The sidewall of the package 800 may be free of the insulating material 900. The sidewall of the package 800 may be at least partially covered by the insulating material 900.

Figure 27:
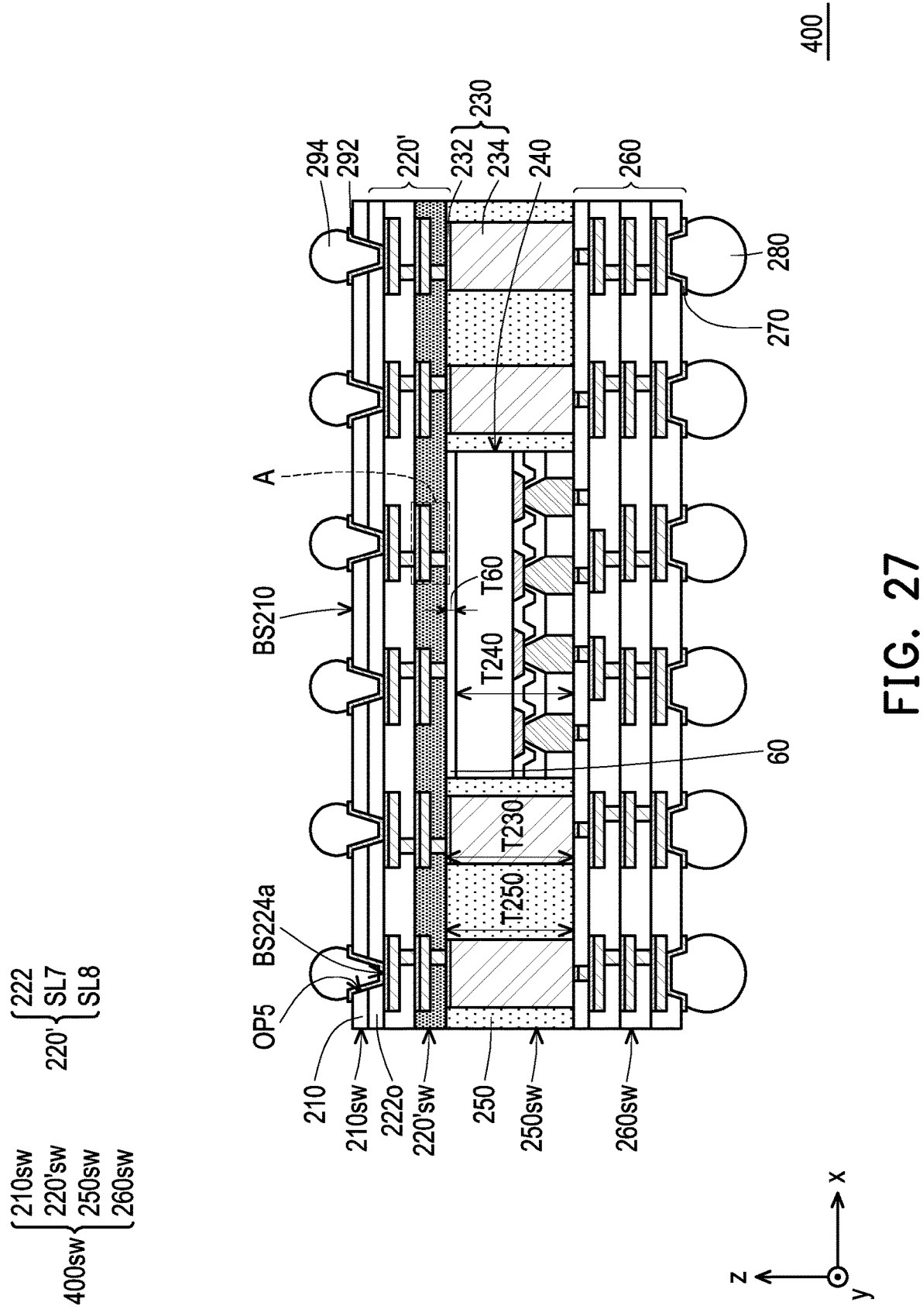
FIG. 27 is a schematic cross-sectional view of a package structure in accordance with some alternative embodiments of the disclosure.
Figure 28:
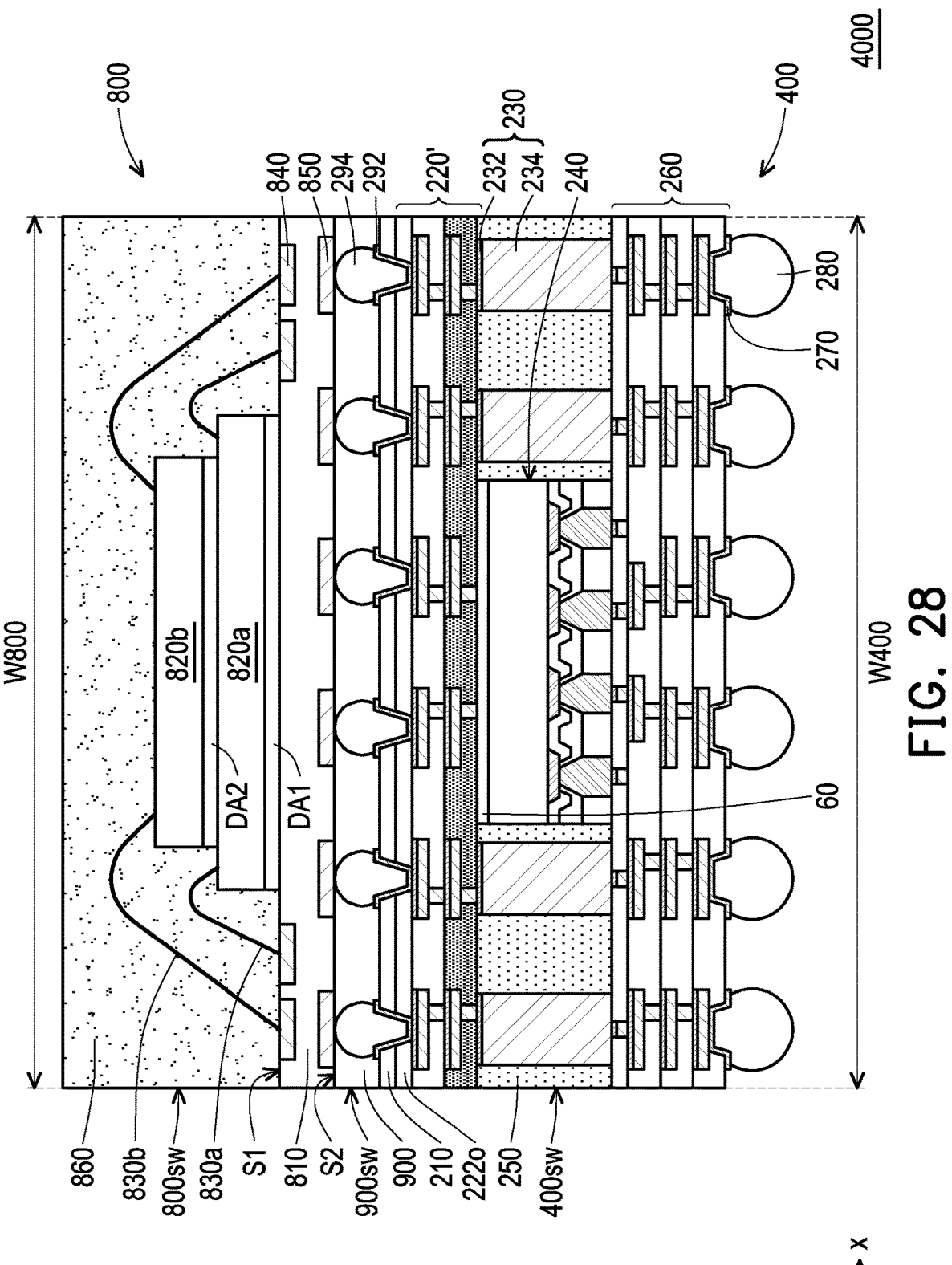
FIG. 28 is a schematic cross-sectional view of a package structure in accordance with some embodiments of the disclosure.

FIG. 27 is a schematic cross-sectional view of a package structure 400 in accordance with some alternative embodiments of the disclosure. FIG. 28 is a schematic cross-sectional view of a package structure 4000 in accordance with some embodiments of the disclosure. Like elements are designated with the same reference numbers for ease of understanding and the details thereof are not repeated herein. The package structure 400 depicted in FIG. 27 is similar to the package structure 300 depicted in FIG. 24, the difference is that, the package structure 400 includes a redistribution circuit structure 220', instead of the redistribution circuit structure 220. For example, as shown in FIG. 27, the redistribution circuit structure 220' includes an additional element, such as a dielectric layer 2220.

In some embodiments, the dielectric layer 2220 is disposed between the seed layer 224a and the enhancing layer 210, and the dielectric layer 222a is disposed between the dielectric layer 2220 and the dielectric layer 228. For example, the dielectric layer 2220 is formed on the enhancing layer 210 before the formation of the build-up layer SL7. The formation and material of the dielectric layer 2220 may be similar to or substantially identical to the formation and material of the dielectric layer 222a as described in FIG. 19, and thus are not repeated herein for brevity. As shown in FIG. 27, the openings OP5 further penetrate the dielectric layer 2220 to expose the portions of the seed layer 224a for electrically connecting the conductive terminals 294 and the redistribution circuit structure 220' (e.g., the seed layer 224a).

In some embodiments, a sidewall 210SW of the enhancing layer 210, a sidewall 220'SW of the redistribution circuit structure 220', a sidewall 250SW of the insulating encapsulation 250, and a sidewall 260SW of the redistribution circuit structure 260 are substantially aligned to each other, in the package structure 400 depicted in FIG. 27. That is, the sidewall 210SW of the enhancing layer 210, the sidewall 220'SW of the redistribution circuit structure 220', the sidewall 250SW of the insulating encapsulation 250, and the sidewall 260SW of the redistribution circuit structure 260 together constitute a sidewall 400SW of the package structure 400. In FIG. 27, for example, a thickness T250 of the insulating encapsulation 250 is substantially equal to a thickness T230 of the conductive pillars 230, and the thickness T250 of the insulating encapsulation 250 and a thickness T230 of the conductive pillars 230 independently are substantially equal to a sum of the thickness T60 of the connecting film 60 and a thickness T240 of the semiconductor die 240.

In addition, one or more than one package (such as a memory package or the like) may be mounted to the package structure 400 having a structure of InFO package to form a semiconductor package having a PoP structure. As shown in FIG. 28, a package 800 is bonded to the package structure 400 to form the package structure 4000, for example. The details of the package 800 and its bonding method have been previously described in FIG. 16, and thus are not repeated herein for brevity. The package structure 4000 may be referred to as an InFO-POP package. As shown in FIG. 28, the sidewall 800SW of the package 800, the sidewall 900SW of the insulating material 900, and the sidewall 400SW of the package structure 400 together may constitute a sidewall 4000SW of the package structure 4000. In other words, in the package structure 4000 of FIG. 28, a lateral size W800 of the package 800 is substantially equal to a lateral size W400 of the package structure 400. In the case, the sidewall 800SW of the package 800, the sidewall 900SW of the insulating material 900, and the sidewall 400SW of the package structure 400 are substantially aligned with each other.

However, the disclosure is not limited thereto. Alternatively, the lateral size of the package 800 may be less than or greater than the lateral size of the package structure 400, where the sidewall of the package 800 is not aligned with the sidewall of the insulating material 900 and the sidewall of the package structure 400. The sidewall of the package 800 may be free of the insulating material 900. The sidewall of the package 800 may be at least partially covered by the insulating material 900.

Figure 29:
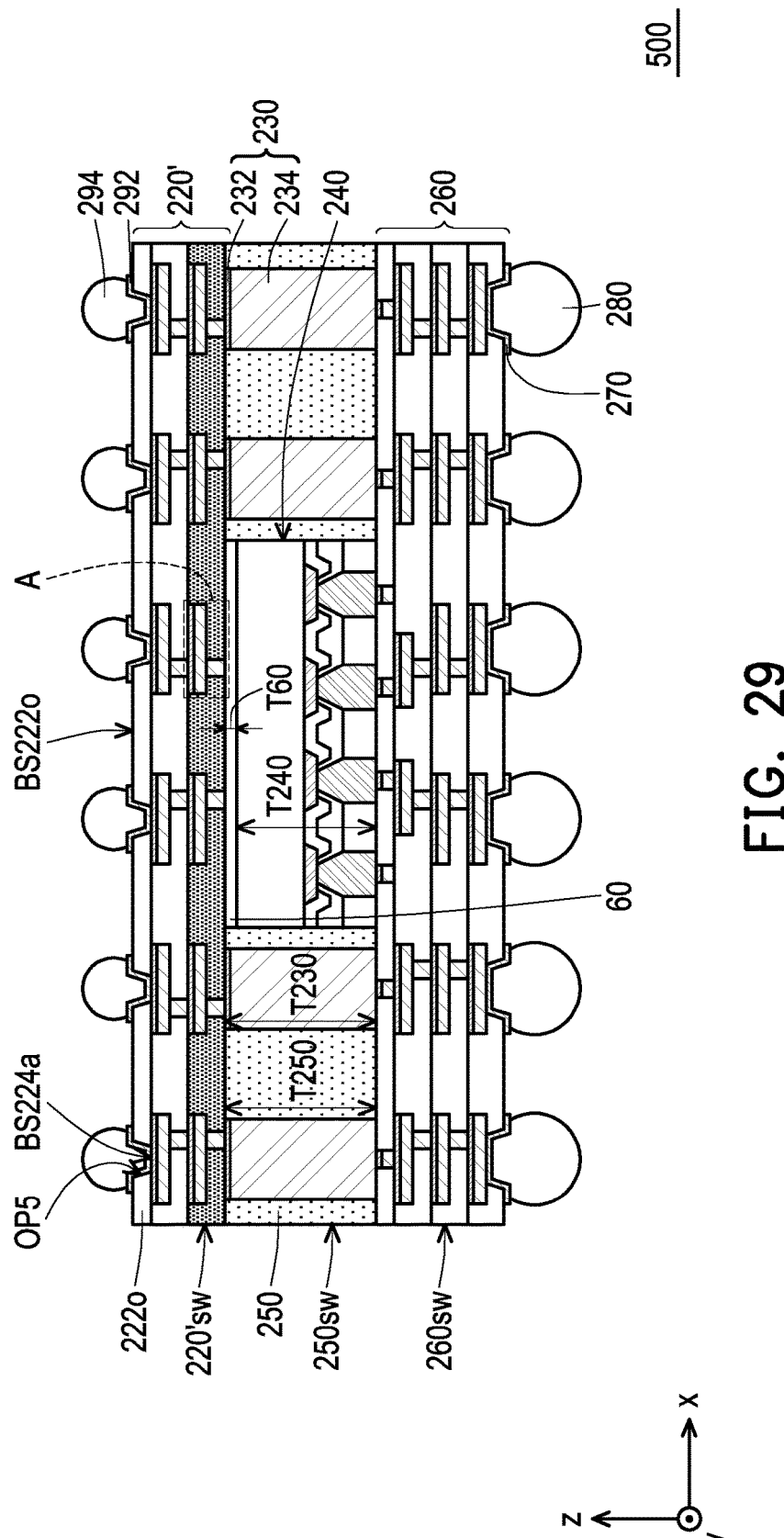
FIG. 29 is a schematic cross-sectional view of a package structure in accordance with some embodiments of the disclosure.
Figure 30:
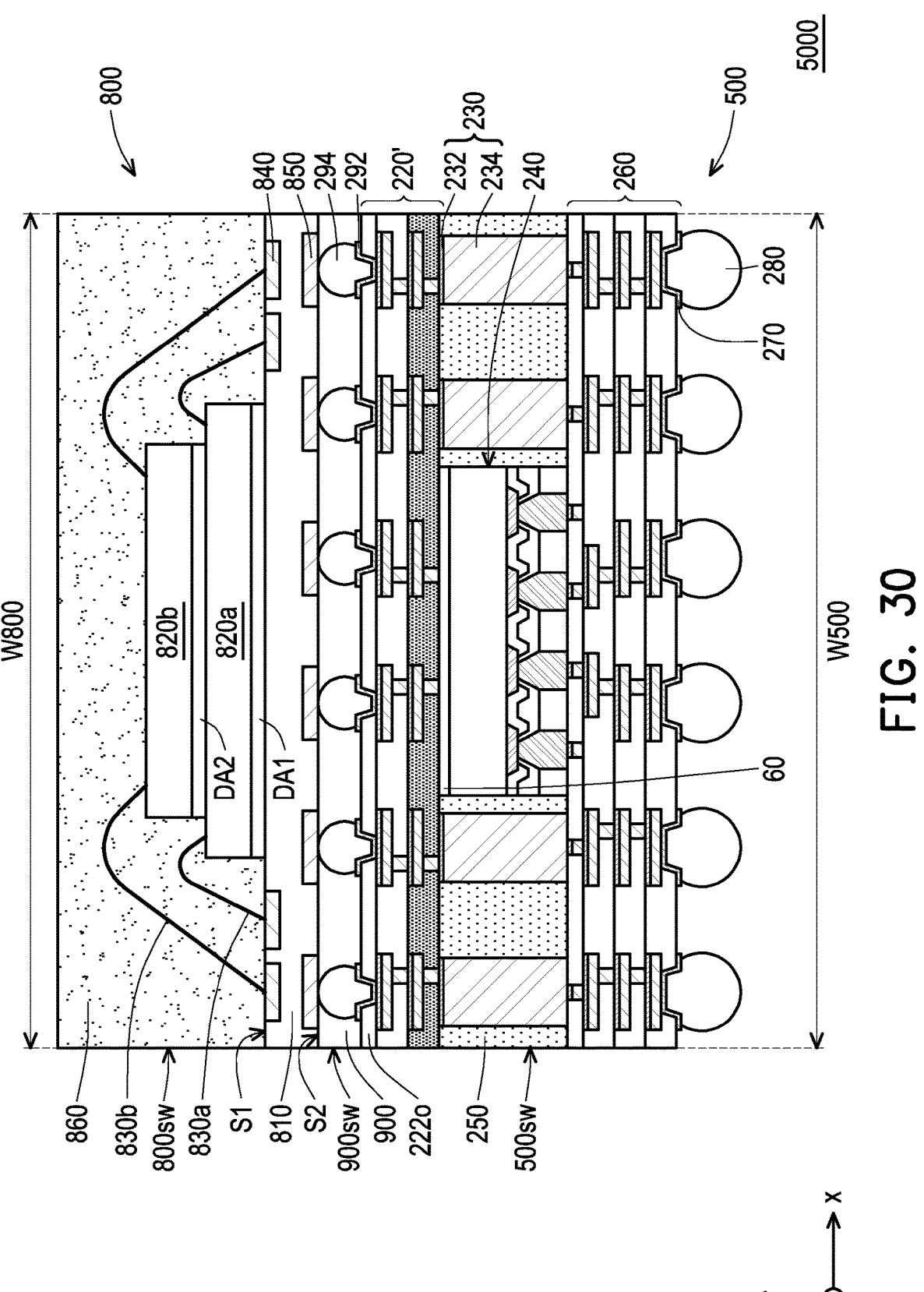
FIG. 30 is a schematic cross-sectional view of a package structure in accordance with some embodiments of the disclosure.

FIG. 29 is a schematic cross-sectional view of a package structure 500 in accordance with some embodiments of the disclosure. FIG. 30 is a schematic cross-sectional view of a package structure 5000 in accordance with some embodiments of the disclosure. Like elements are designated with the same reference numbers for ease of understanding and the details thereof are not repeated herein. The package structure 500 depicted in FIG. 29 is similar to the package structure 400 depicted in FIG. 27, the difference is that, the package structure 500 excludes an element, such as an enhancing layer 210. For example, as shown in FIG. 29, the UBM patterns 292 and the conductive terminals 294 are sequentially formed on a surface BS2200 of the dielectric layer 2200, where the openings OP5 penetrates through the dielectric layer 2220 to expose the portions of the seed layer 224a for electrically connecting the conductive terminals 294 and the redistribution circuit structure 220' (e.g., the seed layer 224a).

In some embodiments, a sidewall 220'SW of the redistribution circuit structure 220', a sidewall 250SW of the insulating encapsulation 250, and a sidewall 260SW of the redistribution circuit structure 260 are substantially aligned to each other, in the package structure 500 depicted in FIG. 29. That is, the sidewall 220'SW of the redistribution circuit structure 220', the sidewall 250SW of the insulating encapsulation 250, and the sidewall 260SW of the redistribution circuit structure 260 together constitute a sidewall 500SW of the package structure 500. In FIG. 29, for example, a thickness T250 of the insulating encapsulation 250 is substantially equal to a thickness T230 of the conductive pillars 230, and the thickness T250 of the insulating encapsulation 250 and a thickness T230 of the conductive pillars 230 independently are substantially equal to a sum of the thickness T60 of the connecting film 60 and a thickness T240 of the semiconductor die 240.

In addition, one or more than one package (such as a memory package or the like) may be mounted to the package structure 500 having a structure of InFO package to form a semiconductor package having a PoP structure. As shown in FIG. 30, a package 800 is bonded to the package structure 500 to form the package structure 5000, for example. The details of the package 800 and its bonding method have been previously described in FIG. 16, and thus are not repeated herein for brevity. The package structure 5000 may be referred to as an InFO-POP package. As shown in FIG. 30, the sidewall 800SW of the package 800, the sidewall 900SW of the insulating material 900, and the sidewall 500SW of the package structure 500 together may constitute a sidewall 5000SW of the package structure 5000. In other words, in the package structure 5000 of FIG. 30, a lateral size W800 of the package 800 is substantially equal to a lateral size W500 of the package structure 500. In the case, the sidewall 800SW of the package 800, the sidewall 900SW of the insulating material 900, and the sidewall 500SW of the package structure 500 are substantially aligned with each other.

However, the disclosure is not limited thereto. Alternatively, the lateral size of the package 800 may be less than or greater than the lateral size of the package structure 500, where the sidewall of the package 800 is not aligned with the sidewall of the insulating material 900 and the sidewall of the package structure 500. The sidewall of the package 800 may be free of the insulating material 900. The sidewall of the package 800 may be at least partially covered by the insulating material 900.

Figure 31:
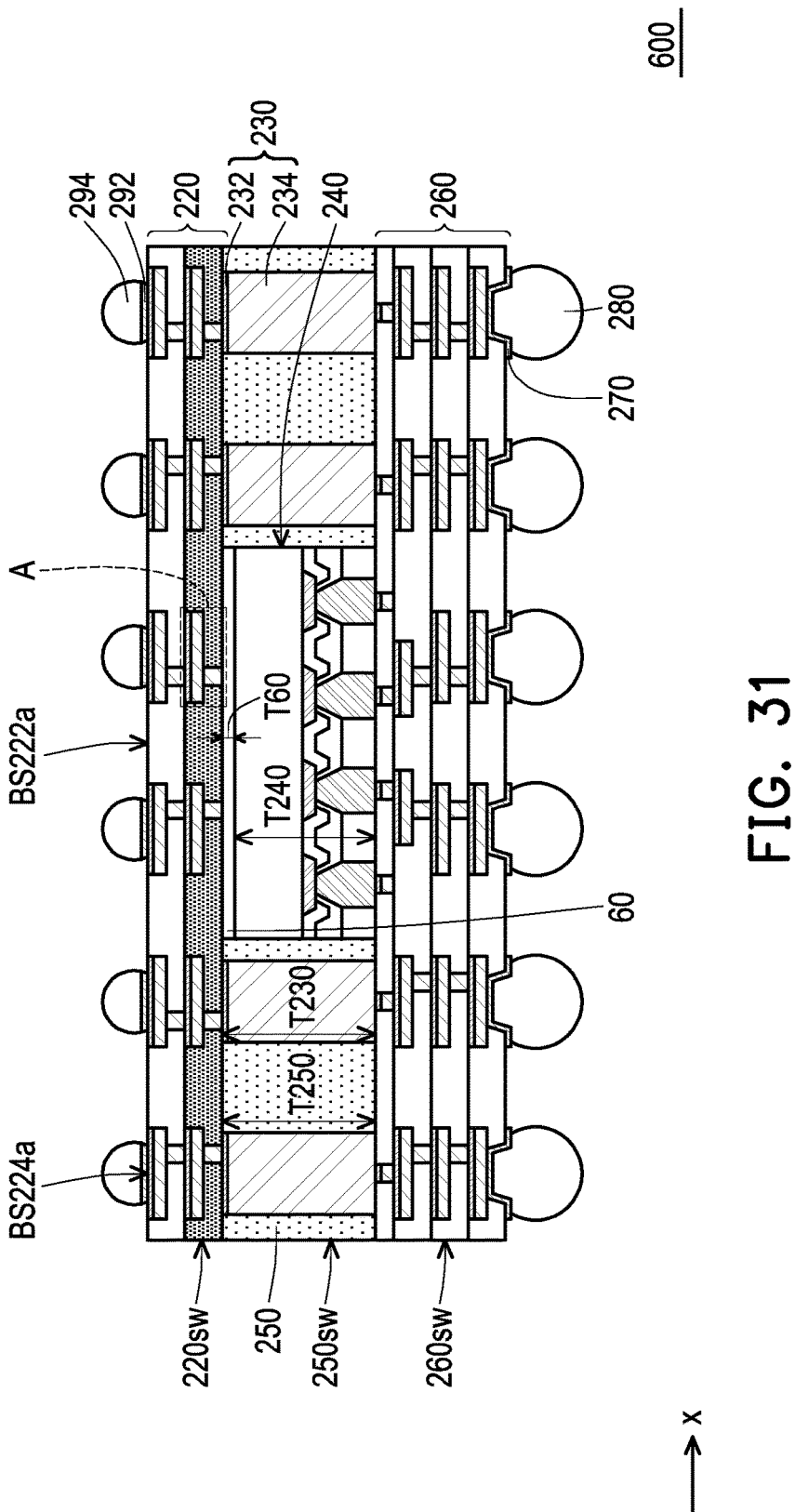
FIG. 31 is a schematic cross-sectional view of a package structure in accordance with some embodiments of the disclosure.
Figure 32:
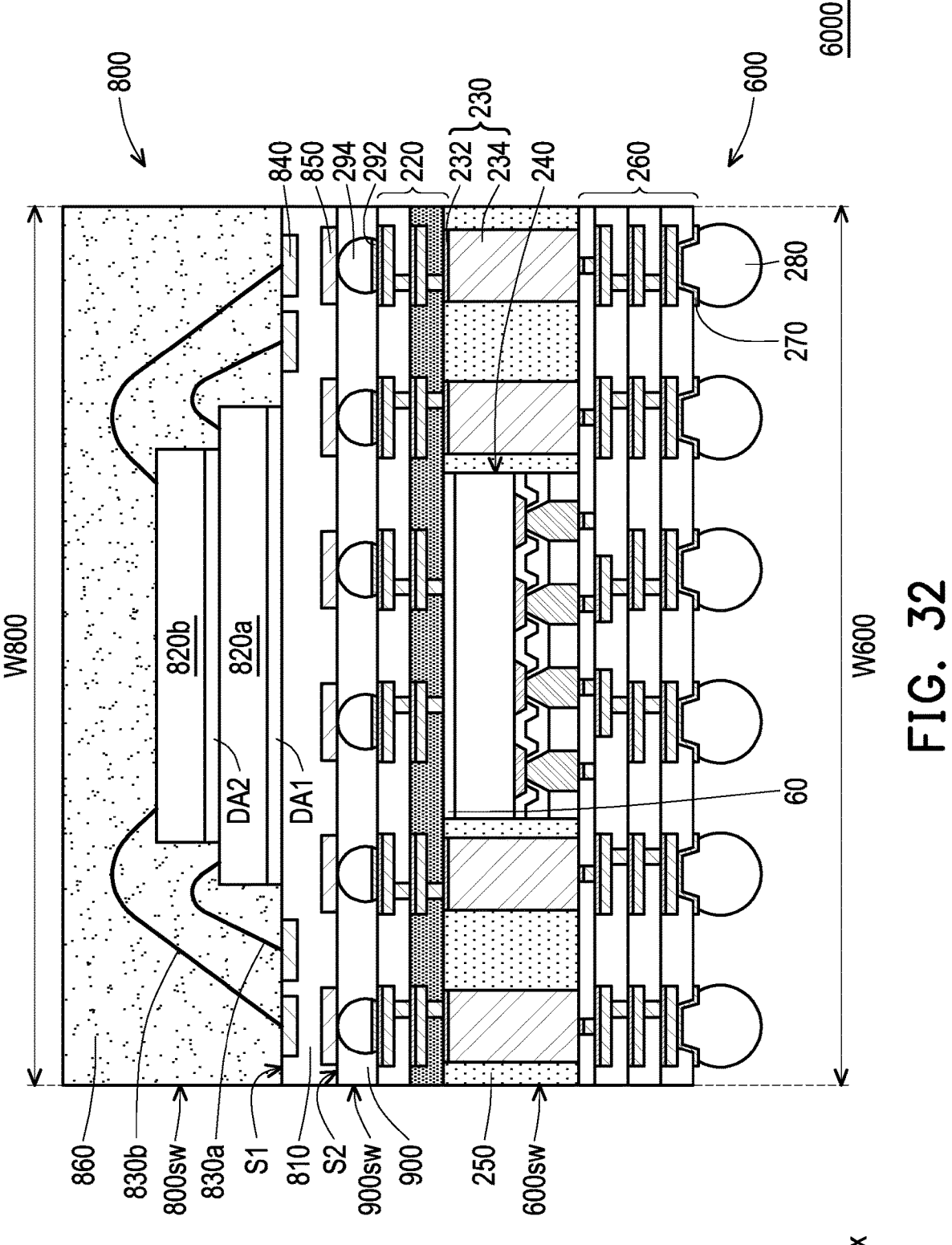
FIG. 32 is a schematic cross-sectional view of a package structure in accordance with some embodiments of the disclosure.

FIG. 31 is a schematic cross-sectional view of a package structure 600 in accordance with some embodiments of the disclosure. FIG. 32 is a schematic cross-sectional view of a package structure 6000 in accordance with some embodiments of the disclosure. Like elements are designated with the same reference numbers for ease of understanding and the details thereof are not repeated herein. The package structure 600 depicted in FIG. 31 is similar to the package structure 300 depicted in FIG. 24, the difference is that, the package structure 300 excludes an element, such as an enhancing layer 210. For example, as shown in FIG. 31, the UBM patterns 292 and the conductive terminals 294 are sequentially formed on a surface BS222a of the dielectric layer 222a, where the UBM patterns 292 are disposed on the portions of the seed layer 224a exposed by the surface TS222a of the dielectric layer 222a for electrically connecting the conductive terminals 294 and the redistribution circuit structure 220 (e.g., the seed layer 224a).

In some embodiments, a sidewall 220SW of the redistribution circuit structure 220, a sidewall 250SW of the insulating encapsulation 250, and a sidewall 260SW of the redistribution circuit structure 260 are substantially aligned to each other, in the package structure 600 depicted in FIG. 31. That is, the sidewall 220SW of the redistribution circuit structure 220, the sidewall 250SW of the insulating encapsulation 250, and the sidewall 260SW of the redistribution circuit structure 260 together constitute a sidewall 600SW of the package structure 600. In FIG. 31, for example, a thickness T250 of the insulating encapsulation 250 is substantially equal to a thickness T230 of the conductive pillars 230, and the thickness T250 of the insulating encapsulation 250 and a thickness T230 of the conductive pillars 230 independently are substantially equal to a sum of the thickness T60 of the connecting film 60 and a thickness T240 of the semiconductor die 240.

In addition, one or more than one package (such as a memory package or the like) may be mounted to the package structure 600 having a structure of InFO package to form a semiconductor package having a PoP structure. As shown in FIG. 32, a package 800 is bonded to the package structure 600 to form the package structure 6000, for example. The details of the package 800 and its bonding method have been previously described in FIG. 16, and thus are not repeated herein for brevity. The package structure 6000 may be referred to as an InFO-POP package. As shown in FIG. 32, the sidewall 800SW of the package 800, the sidewall 900SW of the insulating material 900, and the sidewall 600SW of the package structure 600 together may constitute a sidewall 6000SW of the package structure 6000. In other words, in the package structure 6000 of FIG. 32, a lateral size W800 of the package 800 is substantially equal to a lateral size W600 of the package structure 600. In the case, the sidewall 800SW of the package 800, the sidewall 900SW of the insulating material 900, and the sidewall 600SW of the package structure 600 are substantially aligned with each other.

However, the disclosure is not limited thereto. Alternatively, the lateral size of the package 800 may be less than or greater than the lateral size of the package structure 600, where the sidewall of the package 800 is not aligned with the sidewall of the insulating material 900 and the sidewall of the package structure 500. The sidewall of the package 800 may be free of the insulating material 900. The sidewall of the package 800 may be at least partially covered by the insulating material 900.

In some embodiments, the package structures 100, 200, 300, 400, 500, 600, 1000, 2000, 3000, 4000, 5000, and/or 6000 may be mounted to an additional semiconductor component to form an assembly by a wafer level packaging (WLP), a chip-on-wafer-on-substrate (CoWoS) process, a chip-on-chip-on-substrate (CoCoS) process, etc. The additional semiconductor component may include an interposer, a package substrate, a printed circuit board (PCB), a printed wiring board, and/or other carrier that is capable of carrying integrated circuits. The disclosure is not limited thereto. The assembly may be a part of an electronic system for such as computers (e.g., high-performance computer), computational devices used in conjunction with an artificial intelligence system, wireless communication devices, computer-related peripherals, entertainment devices, etc. The assembly including the semiconductor structure(s) discussed herein may provide high bandwidth data communication. It should be noted that other electronic applications are also possible. Alternatively, additional terminals may be physical and electrical contact with the additional semiconductor component opposite to the package structures 100, 200, 300, 400, 500, 600, 1000, 2000, 3000, 4000, 5000, and/or 6000 for electrical connection to any other external component(s).

In alternative embodiments, the UBM patterns 192 and the conductive terminals 194 of the package structures 100, 200, 300, 400, 500, and/or 600 are substituted by solder regions (not shown). In the case, the solder regions are respectively formed in the opening openings OP3 formed in the enhancing layer 110 (of the package structures 100, 200), in the openings OP5 formed in the enhancing layer 210 (of the package structure 300), in the openings OP5 formed in the enhancing layer 210 and the dielectric layer 2220 (of the package structure 400), in the openings OP5 formed in the dielectric layer 2220 (of the package structure 500), or on the seed layer 224a exposed by the dielectric layer 222a (of the package structure 600), so to electrically couple to the redistribution circuit structure 120, 120', 220, or 220' by directly contacting the seed layer 224a. In one embodiment, sidewalls of the openings O3 and/or O5 are at least partially covered by the solder regions. The solder regions may be pre-solder pastes, which may be formed by printing or the like. Alternatively, the solder regions may be pre-solder blocks. In some embodiments, the material of the solder regions may include a lead-free solder material (such as Sn—Ag base or Sn—Ag—Cu base materials) with or without additional impurity (such as Ni, Bi, Sb, Au, or the like). The solder regions may be referred to as per-solders. The solder regions may be referred to as conductive connectors of the package structures for connecting to another package or element (e.g. an additional semiconductor package/device, a circuit substrate, etc.), such as the package 800.

In the alternative embodiments of which the package structures 100, 200, 300, 400, 500, and/or 600 employ solder regions, the package 800 may further include a plurality of conductive terminals (not shown) disposed on the surface S2 to electrically couple to the conductive pads 850. In the case, the conductive terminals of the package 800 are BGA balls, solder bumps, or solder blocks. In some embodiments, the material of the conductive terminals of the package 800 may include a lead-free solder material (such as Sn—Ag base or Sn—Ag—Cu base materials) with or without additional impurity (such as Ni, Bi, Sb, Au, or the like.). In one embodiment, the materials of the conductive terminals of the package 800 and the solder regions of the package structures 100, 200, 300, 400, 500, and/or 600 are the same. Alternatively, the material of the conductive terminals of the package 800 may be different from the material of the solder regions of the package structures 100, 200, 300, 400, 500, and/or 600. The conductive terminals may be referred to as joining solder balls. Due to the conductive terminals of the package 800 and the solder regions of the package structures 100, 200, 300, 400, 500, and/or 600, the package 800 is mounted to and electrically coupled to the package structures 100, 200, 300, 400, 500, and/or 600 to form a package structure, which is similar to the package structures 1000, 2000, 3000, 4000, 5000, 6000.

In accordance with some embodiments, a package structure includes a semiconductor die, a first redistribution circuit structure, a first redistribution circuit structure, a second redistribution circuit structure, an enhancement layer, a plurality of first conductive terminals, and a plurality of second conductive terminals. The semiconductor die has an active side and a rear side opposing to the active side. The first redistribution circuit structure is disposed on the rear side and electrically coupled to the semiconductor die. The second redistribution circuit structure is disposed on the active side and electrically coupled to the semiconductor die. The enhancement layer is disposed on the first redistribution circuit structure, and the first redistribution circuit structure is disposed between the enhancement layer and the semiconductor die. The plurality of first conductive terminals are connected to the first redistribution circuit structure, and the first redistribution circuit structure is between the plurality of first conductive terminals and the semiconductor die. The plurality of second conductive terminals are connected to the second redistribution circuit structure, and the enhancement layer is between the plurality of second conductive terminals and the second redistribution circuit structure.

In accordance with some embodiments, a package structure includes a semiconductor die, a first redistribution circuit structure, a second redistribution circuit structure, a thermal structure, a plurality of first conductive terminals, and a plurality of second conductive terminals. The semiconductor die has an active side and a rear side opposing to the active side. The first redistribution circuit structure is disposed on the rear side and electrically coupled to the semiconductor die. The second redistribution circuit structure is disposed on the active side and electrically coupled to the semiconductor die. The thermal structure is disposed in the first redistribution circuit structure and thermally coupled to the semiconductor die, where the thermal structure is overlapped with the semiconductor die. The plurality of first conductive terminals is connected to the first redistribution circuit structure, and the first redistribution circuit structure is between the plurality of first conductive terminals and the semiconductor die. The plurality of second conductive terminals is connected to the second redistribution circuit structure, and the second redistribution circuit structure is between the plurality of second conductive terminals and the semiconductor die.

In accordance with some embodiments, a method of manufacturing a package structure includes the following steps: forming a first redistribution circuit structure; forming a thermal structure inside the first redistribution circuit structure; disposing a semiconductor die on the first redistribution circuit structure, the semiconductor die being overlapped with and thermally coupled to the thermal structure, where the first redistribution circuit structure is disposed on a rear side of the semiconductor die and electrically connected to the semiconductor die; forming a second redistribution circuit structure on an active side of the semiconductor die, the second redistribution circuit structure electrically connecting the semiconductor die; disposing a plurality of first conductive terminals on the first redistribution circuit structure, the first redistribution circuit structure connecting to the first redistribution circuit structure and being between the plurality of first conductive terminals and the semiconductor die; and disposing a plurality of second conductive terminals on the second redistribution circuit structure, the second redistribution circuit structure connecting to the second redistribution circuit structure and being between the plurality of second conductive terminals and the semiconductor die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a semiconductor die having an active side and a rear side opposing to the active side;
   a first redistribution circuit structure, disposed on the rear side and electrically coupled to the semiconductor die;
   a second redistribution circuit structure, disposed on the active side and electrically coupled to the semiconductor die;
   an enhancement layer, disposed on the first redistribution circuit structure, the first redistribution circuit structure being disposed between the enhancement layer and the semiconductor die, wherein the enhancement layer further continuously extends over an entirety of the semiconductor die;
   a plurality of first conductive terminals, connected to the first redistribution circuit structure, the first redistribution circuit structure being between the plurality of first conductive terminals and the semiconductor die, wherein the enhancement layer is disposed between the plurality of first conductive terminals and the first redistribution circuit structure; and
   a plurality of second conductive terminals, connected to the second redistribution circuit structure, the second redistribution circuit structure being between the plurality of second conductive terminals and the enhancement layer.

2. The package structure of claim 1, wherein the first redistribution circuit structure comprises:
   a first dielectric layer, disposed on the enhancement layer;
   a first redistribution layer, laterally covering by the first dielectric layer; and
   a second redistribution layer, disposed on and electrically coupled to the first redistribution layer, wherein the second redistribution layer is closer to the semiconductor die than the first redistribution layer is,
   wherein a material of the enhancement layer is different from a material of the first dielectric layer.

3. The package structure of claim 2, wherein the first redistribution circuit structure further comprises:
   a second dielectric layer, disposed on the first dielectric layer and at least laterally covering the second redistribution layer, wherein the first dielectric layer is between the enhancement layer and the second dielectric layer,
   wherein the material of the enhancement layer is different from a material of the second dielectric layer.

4. The package structure of claim 3, further comprising:
   a thermal structure, disposed on the first dielectric layer and in the second dielectric layer, wherein the thermal structure comprises a line portion and a via portion connecting to the line portion, a surface of the via portion is substantially coplanar to a first surface of the second dielectric layer, and a surface of the line portion is substantially coplanar to a second surface of the second dielectric layer, wherein the first surface is opposite to the second surface,
   wherein the second dielectric layer comprises a filler, and the material of the second dielectric layer is different from the material of the first dielectric layer.

5. The package structure of claim 1, further comprising:
   a plurality of conductive pillars, disposed between and electrically coupled to the first redistribution circuit structure and the second redistribution circuit structure and next to the semiconductor die; and
   an insulating encapsulation, encapsulating the plurality of conductive pillars and the semiconductor die,
   wherein the plurality of conductive pillars are electrically coupled to the semiconductor die through the second redistribution circuit structure.

6. The package structure of claim 5, wherein the plurality of conductive pillars penetrate through the insulating encapsulation.

7. The package structure of claim 5, wherein a thickness of the plurality of conductive pillars is less than a thickness of the insulating encapsulation.

8. A package structure, comprising:
   a semiconductor die having an active side and a rear side opposing to the active side;

a first redistribution circuit structure, disposed on the rear side and electrically coupled to the semiconductor die, wherein the first redistribution circuit structure further continuously extends over an entirety of the semiconductor die;

a second redistribution circuit structure, disposed on the active side and electrically coupled to the semiconductor die;

a thermal structure, disposed in the first redistribution circuit structure and thermally coupled to the semiconductor die, wherein the thermal structure is overlapped with the semiconductor die, wherein the thermal structure is laterally covered by a first dielectric layer of the first redistribution circuit structure, and a material of the first dielectric layer is different from a material of a second dielectric layer of the first redistribution circuit structure, wherein a sidewall of the first dielectric layer is substantially aligned with a sidewall of the second dielectric layer;

a plurality of first conductive terminals, connected to the first redistribution circuit structure, the first redistribution circuit structure being between the plurality of first conductive terminals and the semiconductor die; and a plurality of second conductive terminals, connected to the second redistribution circuit structure, the second redistribution circuit structure being between the plurality of second conductive terminals and the semiconductor die.

9. The package structure of claim 8, wherein the thermal structure comprises:

a line portion; and a via portion, connecting to the line portion, wherein a ratio of a thickness of the line portion to a thickness of the via portion is about 0.5 to about 2.

10. The package structure of claim 8, wherein the first redistribution circuit structure comprises:

a first build-up layer, comprising the first dielectric layer and a first redistribution layer laterally covered by the first dielectric layer; and a second build-up layer, disposed on and electrically connected to the first build-up layer and comprising the second dielectric layer and a second redistribution layer laterally covered by the second dielectric layer, wherein the thermal structure is disposed in the first build-up layer.

11. The package structure of claim 10, further comprising:

an insulating encapsulation, encapsulating the semiconductor die; and a plurality of conductive pillars, next to the semiconductor die and penetrating through the insulating encapsulation, wherein the plurality of conductive pillars are disposed between and electrically coupled to the first redistribution circuit structure and the second redistribution circuit structure, wherein the plurality of conductive pillars are electrically coupled to the semiconductor die through the second redistribution circuit structure, and the material of the first dielectric layer is different from a material of the insulating encapsulation.

12. The package structure of claim 11, further comprising one of:

an enhancement layer, disposed between the first redistribution circuit structure and the plurality of the first conductive terminals, wherein a material of the enhancement layer is different from the material of the second dielectric layer;

an additional dielectric layer, disposed between the second build-up layer and the plurality of the first conductive terminals, wherein a material of the additional dielectric layer is different from the material of the first dielectric layer; or an enhancement layer and an additional dielectric layer, disposed between the second build-up layer and the plurality of the first conductive terminals, wherein the enhancement layer is between the plurality of the first conductive terminals and the additional dielectric layer, the additional dielectric layer is between the enhancement layer and the second build-up layer, wherein a material of the additional dielectric layer is different from the material of the first dielectric layer, and a material of the enhancement layer is different from the material of the insulating encapsulation.

13. The package structure of claim 8, further comprising:

a connecting film, disposed between the semiconductor die and the first redistribution circuit structure and between the semiconductor die and the thermal structure, wherein a surface of the thermal structure being exposed by and substantially coplanar to a surface of the first redistribution circuit structure is covered by the connecting film.

14. The package structure of claim 13, wherein a material of the connecting film comprises a thermally conductive dielectric material.

15. A method of manufacturing a package structure, comprising:

forming a first redistribution circuit structure;

forming a thermal structure inside the first redistribution circuit structure, wherein the thermal structure is laterally covered by a first dielectric layer of the first redistribution circuit structure, and a material of the first dielectric layer is different from a material of a second dielectric layer of the first redistribution circuit structure;

after forming the thermal structure inside the first redistribution circuit structure, disposing a semiconductor die on the first redistribution circuit structure, the semiconductor die being overlapped with and thermally coupled to the thermal structure, wherein the first redistribution circuit structure is disposed on a rear side of the semiconductor die and electrically connected to the semiconductor die;

forming a second redistribution circuit structure on an active side of the semiconductor die, the second redistribution circuit structure electrically connecting the semiconductor die;

disposing a plurality of first conductive terminals on the first redistribution circuit structure, the first redistribution circuit structure connecting to the plurality of first conductive terminals and being between the plurality of first conductive terminals and the semiconductor die; and disposing a plurality of second conductive terminals on the second redistribution circuit structure, the second redistribution circuit structure connecting to the plurality of second conductive terminals and being between the plurality of second conductive terminals and the semiconductor die.

16. The method of claim 15, wherein forming the thermal structure comprises:

forming a line portion and a via portion connecting to the line portion, wherein a ratio of a thickness of the line portion to a thickness of the via portion is about 0.5 to about 2, and a surface of the via portion is accessibly revealed and substantially coplanar with a surface of the first redistribution circuit structure.

17. The method of claim 15, further comprising:

forming a plurality of conductive pillars on the first redistribution circuit structure and next to the semiconductor die; and encapsulating the semiconductor die and the plurality of conductive pillar in an insulating encapsulation, wherein forming the first redistribution circuit structure comprises:

forming a second build-up layer comprising the second dielectric layer and a second redistribution layer laterally covered by the second dielectric layer;

forming, on the second build-up layer, a first build-up layer comprising the first dielectric layer and a first redistribution layer laterally covered by the first dielectric layer, wherein the first build-up layer is between the second build-up layer and the semiconductor die, wherein the thermal structure is formed in the first build-up layer, and the material of the first dielectric layer is different from a material of the insulating encapsulation.

18. The method of claim 17, further comprising one of:

forming an enhancement layer prior to forming the first redistribution circuit structure, the enhancement layer being disposed between the first redistribution circuit structure and the plurality of first conductive terminals, wherein a material of the enhancement layer is different from the material of the second dielectric layer; or forming an additional dielectric layer prior to forming the second build-up layer, the additional dielectric layer being disposed between the second build-up layer and the plurality of first conductive terminals, wherein a material of the additional dielectric layer is different from the material of the first dielectric layer.

19. The method of claim 17, further comprising:

forming an enhancement layer prior to forming the first redistribution circuit structure, the enhancement layer being disposed between the second build-up layer and the plurality of first conductive terminals, wherein a material of the enhancement layer is different from the material of the second dielectric layer; and forming an additional dielectric layer on the enhancement layer, the additional dielectric layer being disposed between the second build-up layer and the enhancement layer, wherein a material of the additional dielectric layer is different from the material of the first dielectric layer.

20. The method of claim 15, wherein disposing the semiconductor die on the first redistribution circuit structure comprises:

adhering the rear side of the semiconductor die onto the first redistribution circuit structure via a connecting film, the connecting film being disposed between the semiconductor die and the first redistribution circuit structure and between the semiconductor die and the thermal structure, wherein a surface of the thermal structure being exposed by and substantially coplanar to a surface of the first redistribution circuit structure is covered by the connecting film, wherein a material of the connecting film comprises a thermally conductive dielectric material.

* * * * *